(12) United States Patent
Lu et al.

(10) Patent No.: US 10,566,279 B2
(45) Date of Patent: Feb. 18, 2020

(54) PACKAGE DEVICE, SEMICONDUCTOR DEVICE, AND METHOD FOR MANUFACTURING THE PACKAGE DEVICE

(71) Applicant: Advanced Semiconductor Engineering, Inc., Kaohsiung (TW)

(72) Inventors: Wen-Long Lu, Kaohsiung (TW); Jen-Kuang Fang, Kaohsiung (TW); Min Lung Huang, Kaohsiung (TW); Chan Wen Liu, Kaohsiung (TW); Ching Kuo Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/880,377

(22) Filed: Jan. 25, 2018

(65) Prior Publication Data

US 2019/0229054 A1    Jul. 25, 2019

(51) Int. Cl.
| | | |
|---|---|---|
| *H01L 23/31* | (2006.01) | |
| *H01L 23/522* | (2006.01) | |
| *H01L 23/498* | (2006.01) | |
| *H01L 21/56* | (2006.01) | |
| *H01L 21/48* | (2006.01) | |

(52) U.S. Cl.
CPC ........ *H01L 23/5226* (2013.01); *H01L 21/486* (2013.01); *H01L 21/56* (2013.01); *H01L 23/3121* (2013.01); *H01L 23/49822* (2013.01)

(58) Field of Classification Search
CPC ... H01L 23/5226; H01L 21/486; H01L 21/56; H01L 23/3121; H01L 23/49822
USPC .......................................................... 257/784
See application file for complete search history.

(56) References Cited

U.S. PATENT DOCUMENTS

| | | | |
|---|---|---|---|
| 8,372,741 B1 | 2/2013 | Co et al. | |
| 8,866,236 B2 | 10/2014 | Chiu et al. | |
| 2006/0216868 A1 | 9/2006 | Yang et al. | |
| 2013/0320463 A1* | 12/2013 | Chang | B81B 7/007 257/415 |
| 2017/0287874 A1* | 10/2017 | Fang | H01L 25/0657 |

* cited by examiner

*Primary Examiner* — Elias Ullah

(74) *Attorney, Agent, or Firm* — Foley & Lardner LLP; Cliff Z. Liu

(57) ABSTRACT

A package device includes a circuit layer, at least one conductive segment, an encapsulant and a redistribution layer. The conductive segment is disposed on the circuit layer and has a first surface and a second surface. The encapsulant encapsulates at least a portion of the conductive segment and has a first upper surface. A first portion of the first surface and at least a portion of the second surface of the conductive segment are disposed above the first upper surface of the encapsulant. The redistribution layer is disposed on the encapsulant, the first portion of the first surface of the conductive segment, and the second surface of the conductive segment.

20 Claims, 40 Drawing Sheets

US 10,566,279 B2

PACKAGE DEVICE, SEMICONDUCTOR DEVICE, AND METHOD FOR MANUFACTURING THE PACKAGE DEVICE

BACKGROUND

1. Field of the Disclosure

The present disclosure relates to a package device and a manufacturing method, and to a package device including a redistribution layer (RDL) disposed on a portion of a conductive segment, and a method for manufacturing the package device.

2. Description of the Related Art

In some semiconductor packages, an interconnection component (e.g., a pillar or a wire) may be encapsulated (e.g. completely encapsulated) by a molding compound during a manufacturing process thereof. Hence, a grinding process may be used for exposing such an interconnection component from the encapsulant. A portion of the molding compound and a portion of the interconnection component may be removed during the grinding process, such that an upper surface of the interconnection component is exposed. Then, an RDL can be connected to the upper surface of the interconnection component. However, such grinding may be expensive or time consuming.

SUMMARY

In some embodiments, a package device includes a circuit layer, at least one conductive segment, an encapsulant and a redistribution layer. The conductive segment is disposed on the circuit layer and has a first surface and a second surface. The encapsulant encapsulates at least a portion of the conductive segment and has a first upper surface. A first portion of the first surface and at least a portion of the second surface of the conductive segment are disposed above the first upper surface of the encapsulant. The redistribution layer is disposed on the encapsulant, the first portion of the first surface of the conductive segment, and the second surface of the conductive segment.

In some embodiments, a semiconductor device includes a circuit layer, a logic component, an encapsulant, a redistribution layer, a first conductive segment and a second conductive segment. The logic component is disposed on the circuit layer. The encapsulant encapsulates the logic component. The redistribution layer is disposed on the encapsulant. The first conductive segment connects the circuit layer and the redistribution layer. The second conductive segment connects the logic component and the redistribution layer. The first conductive segment and the second conductive segment are formed from a single bonding wire.

In some embodiments, a method for manufacturing a package device includes (a) forming a bonding wire having two first surfaces and including a connecting segment between the two first surfaces; (b) providing an encapsulant to encapsulate the bonding wire and expose a portion of the connecting segment of the bonding wire; (c) removing the connecting segment of the bonding wire to separate the bonding wire into two segments and to form a second surface of each of the segments; and (d) removing a portion of the encapsulant to expose a first portion of the first surface of each of the segments.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
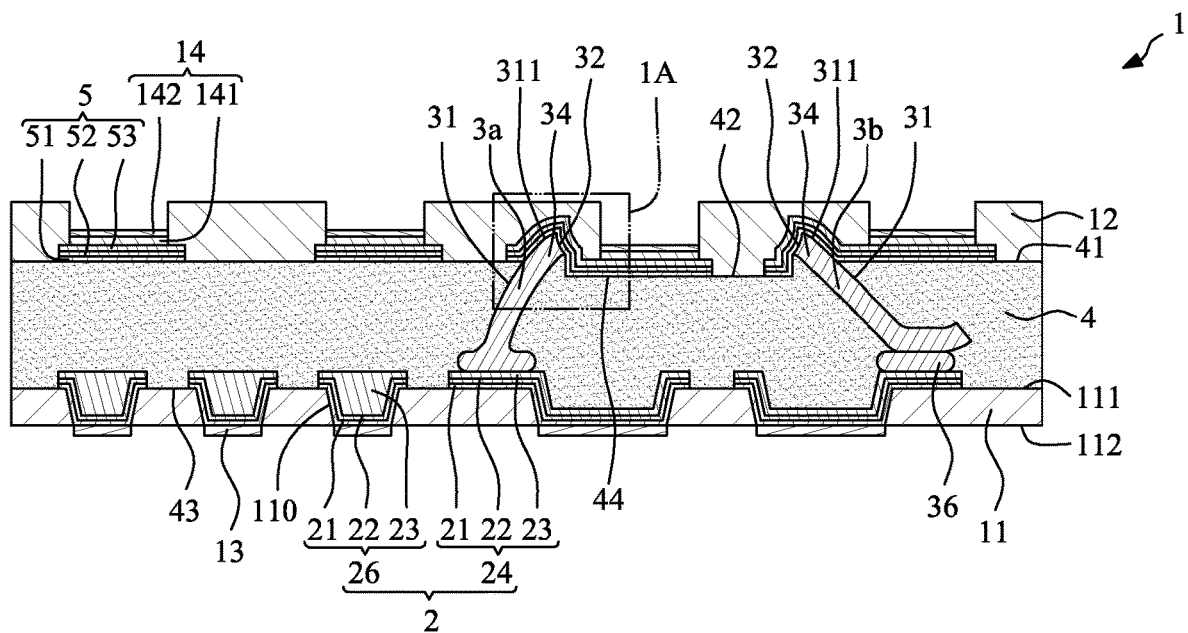
FIG. 1 illustrates a cross-sectional view of an example of a package device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a manufacturing process of a comparative package device, a grinding process may be used for exposing an interconnection component (e.g., a pillar or a wire) encapsulated by a molding compound. A portion of the molding compound and a portion of the interconnection component are removed, such that an upper surface of the interconnection component is exposed from the molding compound for connection with an RDL. However, the removed portion of the molding compound may form powder adhered on the upper surface of the interconnection component. Besides, if the RDL connects to a single surface of the interconnection component, delamination may readily occur between the RDL and the interconnection component.

The present disclosure provides for a package device which may be manufactured without a grinding process of an interconnection component and a molding compound encapsulating such an interconnection component. In some embodiments, the package device includes at least one conductive segment disposed on a circuit layer and having a first surface and a second surface; an encapsulant encapsulating at least a portion of the conductive segment and having a first upper surface, with a first portion of the first surface and at least a portion of the second surface of the conductive segment disposed above the first upper surface of the encapsulant; and a redistribution layer disposed on the encapsulant, the first portion of the first surface of the conductive segment, and the second surface of the conductive segment. At least some embodiments of the present disclosure provide for techniques for manufacturing the package device.

Figure 2:
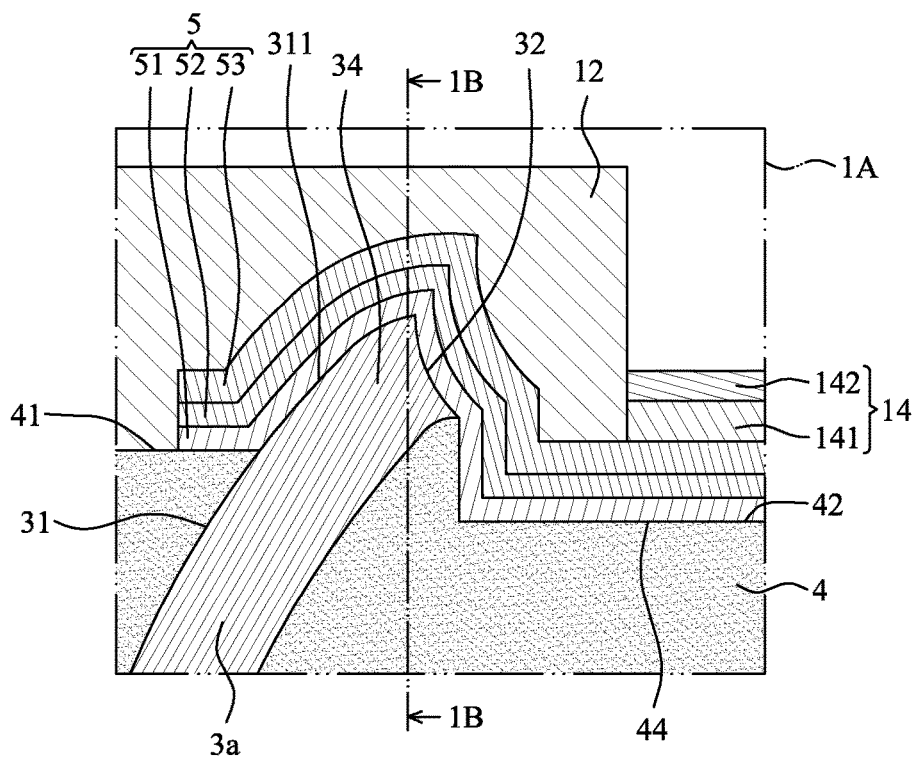
FIG. 2 illustrates an enlarged view of an area 1A shown in FIG. 1.
Figure 3:
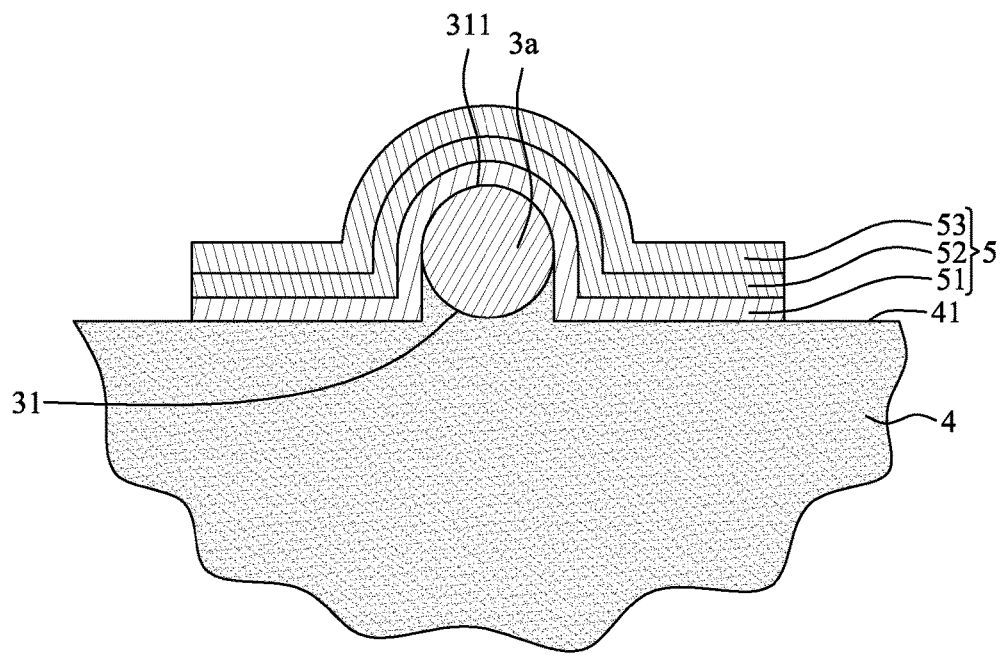
FIG. 3 illustrates a cross-sectional view taken along line 1B-1B shown in FIG. 2.

FIG. 1 illustrates a cross-sectional view of a package device 1 according to some embodiments of the present disclosure. FIG. 2 illustrates an enlarged view of an area 1A shown in FIG. 1. FIG. 3 illustrates a cross-sectional view taken along line 1B-1B shown in FIG. 2. The package device 1 includes a dielectric layer 11, a circuit layer 2, an encapsulant 4, at least one conductive segment (e.g., a first conductive segment 3*a* and a second conductive segment 3*b*), an RDL 5, a passivation layer 12, at least one first under bump metallization (UBM) 13 and at least one second UBM 14. For illustration purpose, the passivation layer 12 is omitted in FIG. 3.

The dielectric layer 11 has an upper surface 111 and a lower surface 112 opposite to the upper surface 111, and defines at least one through hole 110 extending through the dielectric layer 11 and between the upper surface 111 and the lower surface 112. The dielectric layer 11 may include organic dielectric materials, such as, for example, benzocyclobutene (BCB), bismaleimide triazine (BT), Ajinomoto build-up film (ABF), an epoxy, a polyimide (PI); or inorganic dielectric materials, such as, for example, $SiO_x$, $SiN_x$, $TaO_x$, a glass, silicon or a ceramic. In some embodiments, the dielectric layer 11 may include cured photoimageable dielectric (PID) materials.

The circuit layer 2 is disposed on the upper surface 111 of the dielectric layer 11 and in the through hole 110 of the dielectric layer 11. For example, the circuit layer 2 may include at least one bump pad 24 disposed on the upper surface 111 of the dielectric layer 11, and at least one conductive via 26 disposed in the through hole 110 of the dielectric layer 11. In some embodiments, as shown in FIGS. 1 to 3, the circuit layer 2 may include a first metal layer 21, a second metal layer 22 and a third metal layer 23. The first metal layer 21 and the second metal layer 22 may be seed layers and include titanium, copper, nickel, tungsten, and/or platinum, or an alloy thereof, and may be formed by sputtering. The third metal layer 23 may include copper, tin, gold, silver, nickel, and/or palladium, or an alloy thereof, and may be formed by electroplating, electroless plating or printing. The first UBM 13 may be disposed on a side of the conductive via 26 adjacent to the lower surface 112 of the dielectric layer 11. The first UBM 13 may include palladium and/or gold.

The encapsulant 4, such as a molding compound, is disposed on the upper surface 111 of the dielectric layer 11 and covers the circuit layer 2. The encapsulant 4 has a first upper surface 41 and a second upper surface 42, and a lower surface 43 opposite to the first upper surface 41 and the second upper surface 42. The first upper surface 41 and the second upper surface 42 are not coplanar. For example, the first upper surface 41 is disposed above the second upper surface 42 (e.g. the first upper surface 41 is further away from the lower surface 43 than is the upper surface 42). In some embodiments, the first upper surface 41 is substantially flat, and the second upper surface 42 is substantially in an annular or semi-cylinder shape. The second upper surface 42 intersects with the first upper surface 41 at two sides, and is recessed from the first surface 41 to define a cavity 44. The lower surface 43 of the encapsulant 4 is disposed on the upper surface 111 of the dielectric layer 11. In some embodiments, a material of the encapsulant 4 may be the same as or similar to that of the dielectric layer 11.

In some embodiments, as shown in FIG. 1, the at least one conductive segment includes the first conductive segment 3a and the second conductive segment 3b separated from the first conductive segment 3a. The first conductive segment 3a and the second conductive segment 3b may be formed from a single bonding wire. For example, the first conductive segment 3a may include a first bond portion (e.g., a ball bond) of the bonding wire, and the second conductive segment 3b may include a second bond portion (e.g., a wedge bond or a tail bond) of the bonding wire. In some embodiments, the second conductive segment 3b may further include a stud portion 36 disposed on the circuit layer 2 for enhanced engagement with the circuit layer 2. However, in other embodiments, the stud portion 36 may be omitted. The first conductive segment 3a and the second conductive segment 3b may be disposed on the circuit layer 2 (e.g., each disposed on a respective bump pad 24) and extend through the encapsulant 4. The encapsulant 4 encapsulates at least a portion of the first conductive segment 3a. In some embodiments, the encapsulant 4 also encapsulates at least a portion of the second conductive segment 3b, and the cavity 44 of the encapsulant 4 is located between the first conductive segment 3a and the second conductive segment 3b.

The first conductive segment 3a has a first surface 31 and a second surface 32. The first surface 31 and the second surface 32 intersect with each other. For example, the second surface 32 is a concave surface. The first surface 31 is substantially an annular surface (as can be seen in FIG. 3), and extends from a periphery of the second surface 32. A first portion 311 of the first surface 31 is exposed from the encapsulant 4 and is disposed above the first upper surface 41 of the encapsulant 4. The second surface 32 is exposed from the encapsulant 4, and at least a portion of the second surface 32 is disposed above the first upper surface 41 of the encapsulant 4. In some embodiments, as shown in FIGS. 1 and 2, the second surface 32 (e.g. the entire second surface 32) of the first conductive segment 3a is disposed above the first upper surface 41 of the encapsulant 4. The second upper surface 42 of the encapsulant 4 is disposed below the second surface 32 of the first conductive segment 3a. An average roughness of the first surface 31 of the first conductive segment 3a is different from an average roughness of the second surface 32 of the first conductive segment 3a. In some embodiments, the average roughness of the first surface 31 of the first conductive segment 3a is less than the average roughness of the second surface 32 of the first conductive segment 3a. For example, the average roughness of the second surface 32 may be at least about 1.5 times, about 2 times, at least about 3 times, or at least about 5 times the average roughness of the first surface 31. For example, the average roughness of the first surface 31 may be smaller than about 20 nm, and the average roughness of the second surface 32 may be greater than about 40 nm. As shown in FIGS. 1 and 2, a portion 34 of the first conductive segment 3a is exposed from the encapsulant 4. The first portion 311 of the first surface 31 and the second surface 32 are surfaces of the exposed portion 34 of the first conductive segment 3a. The second conductive segment 3b also has a first surface 31, and a second surface 32, and includes an exposed portion 34. The first surface 31, the second surface 32 and the exposed portion 34 of the second conductive segment 3b are similar to those of the first conductive segment 3a, and thus are not described redundantly. The first conductive segment 3a and the second conductive segment 3b may include conductive metals, such as tin, aluminum, gold, silver or copper, or an alloy thereof. In some embodiments, a height of the first conductive segment 3a may be about 150 micrometers (µm) to about 500 µm. A maximum diameter of the first conductive segment 3a, such as a diameter of a portion of the first conductive segment 3a attached to the circuit layer 2, may be about 10 µm to about 50 µm. An aspect ratio (A/R) of the first conductive segment 3a may be greater than about 10:1 (e.g. may be about 11:1 or greater, about 12:1 or greater, or about 13:1 or greater).

The RDL 5 is disposed on the encapsulant 4, the first portion 311 of the first surface 31 of the first conductive segment 3a disposed above the first upper surface 41 of the encapsulant 4, and the second surface 32 of the first conductive segment 3a. Similarly, the RDL 5 is also disposed on the first portion 311 of the first surface 31 of the second conductive segment 3b disposed above the first upper surface 41 of the encapsulant 4, and the second surface 32 of the second conductive segment 3b. As shown in FIGS. 1 and 2, the RDL 5 is disposed on both the first upper surface 41 and the second upper surface 42 of the encapsulant 4. The RDL 5 covers the exposed portion 34 of the first conductive segment 3a and the exposed portion 34 of the second conductive segment 3b. The RDL 5 is disposed on and conformal to the first portion 311 of the first surface 31 of the first conductive segment 3a, and the second surface 32 of the first conductive segment 3a. Similarly, the RDL 5 may also be disposed on and conformal to the first portion 311 of the first surface 31 of the second conductive segment 3b, and the second surface 32 of the second conductive segment 3b. In some embodiments, both the first conductive segment 3a and the second conductive segment 3b connect the circuit layer 2 and the RDL 5. Similar to the circuit layer 2, the RDL 5 may also include metal layers including a fourth metal layer 51, a fifth metal layer 52 and a sixth metal layer 53. The fourth metal layer 51 and the fifth metal layer 52 may be seed layers and include titanium, copper, nickel, tungsten, and/or platinum, or an alloy thereof, and may be formed by sputtering. The sixth metal layer 53 may include copper, tin, gold, silver, nickel, and/or palladium, or an alloy thereof, and may be formed by electroplating, electroless plating or printing.

The passivation layer 12 is disposed on the first upper surface 41 of the encapsulant 4, the RDL 5 and the second upper surface 42 of the encapsulant 4. The passivation layer 12 extends into the cavity 44 of the encapsulant 4. At least a portion of the RDL 5 is exposed from the passivation layer 12 for external connection. A material of the passivation layer 12 may be the same as that of the dielectric layer 11. The second UBM 14 may be disposed on the exposed portion of the RDL 5. In some embodiments, the second UBM 14 includes a first layer 141 and a second layer 142. The first layer 141 includes nickel, and the second layer 142 includes palladium and/or gold.

In the package device 1, since the first portion 311 of the first surface 31 and at least a portion of the second surface 32 of the conductive segment (e.g., the first conductive segment 3a) are disposed above the first upper surface 41 of the encapsulant 4, and since the RDL 5 is disposed on the first portion 311 of the first surface 31 and the second surface 32 of the first conductive segment 3a, a contacting area between the RDL 5 and the first conductive segment 3a is large. Hence, circuit resistance can be reduced, and the possibility of delamination of the RDL 5 can be reduced. The level differences between the first upper surface 41 and the second upper surface 42 may further reduce the possibility of delamination of the RDL 5, and also the possibility of delamination of the passivation layer 12. In addition, since the average roughness of the second surface 32 of the first conductive segment 3a is greater than the first surface 31 of the first conductive segment 3a, adhesion of the RDL 5 to the first conductive segment 3a can be readily achieved.

Figure 4:
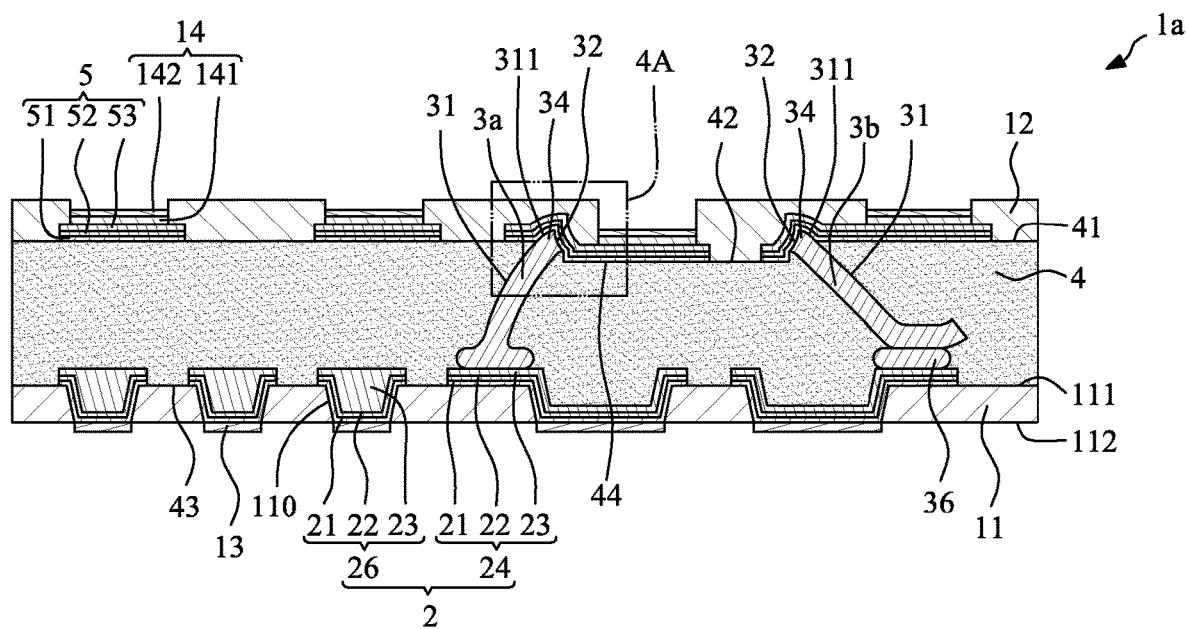
FIG. 4 illustrates a cross-sectional view of an example of a package device according to some embodiments of the present disclosure.
Figure 5:
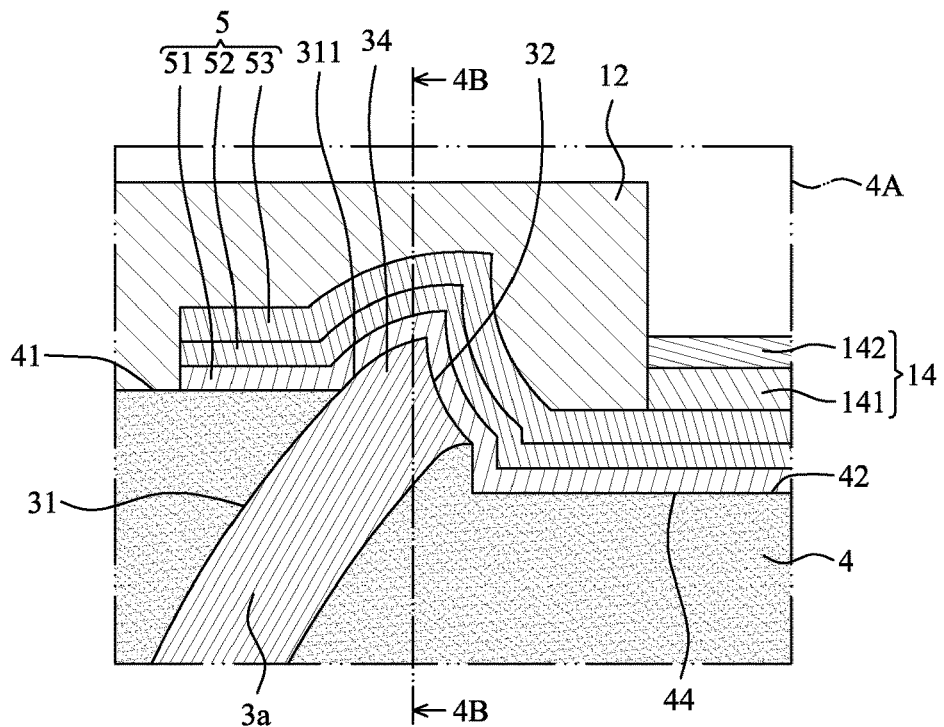
FIG. 5 illustrates an enlarged view of an area 4A shown in FIG. 4.
Figure 6:
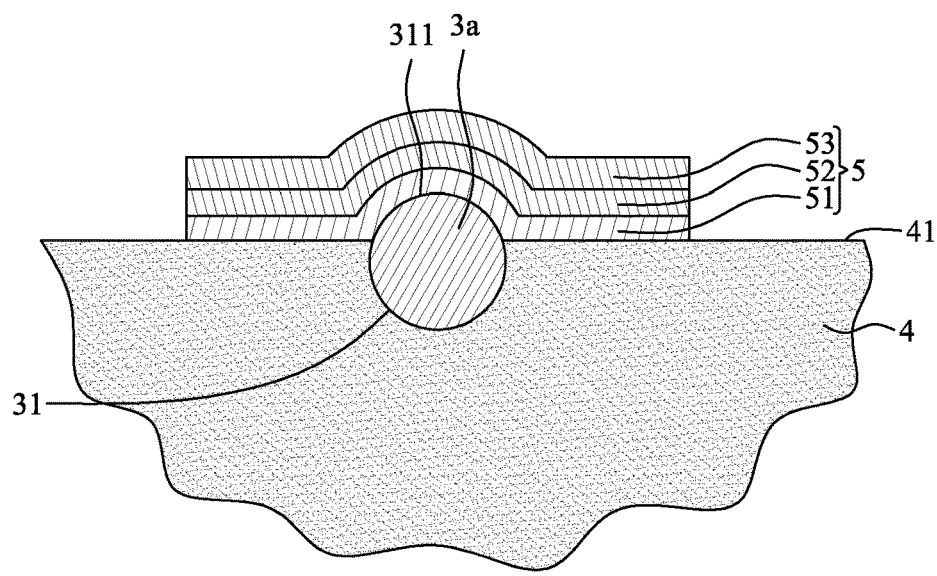
FIG. 6 illustrates a cross-sectional view taken along line 4B-4B shown in FIG. 5.

FIG. 4 illustrates a cross-sectional view of a package device 1a according to some embodiments of the present disclosure. FIG. 5 illustrates an enlarged view of an area 4A shown in FIG. 4. FIG. 6 illustrates a cross-sectional view taken along line 4B-4B shown in FIG. 5. For illustration purpose, the passivation layer 12 is omitted in FIG. 6.

The package device 1a is similar to the package device 1 shown in FIGS. 1 to 3, except that a portion of the second surface 32 of the first conductive segment 3a is disposed above the first upper surface 41 of the encapsulant 4. Another portion of the second surface 32 of the first conductive segment 3a is disposed below the first upper surface 41 of the encapsulant 4. Similarly, a portion of the second surface 32 of the second conductive segment 3b is disposed above the first upper surface 41 of the encapsulant 4, and another portion of the second surface 32 of the second conductive segment 3b is disposed below the first upper surface 41 of the encapsulant 4.

Figure 7:
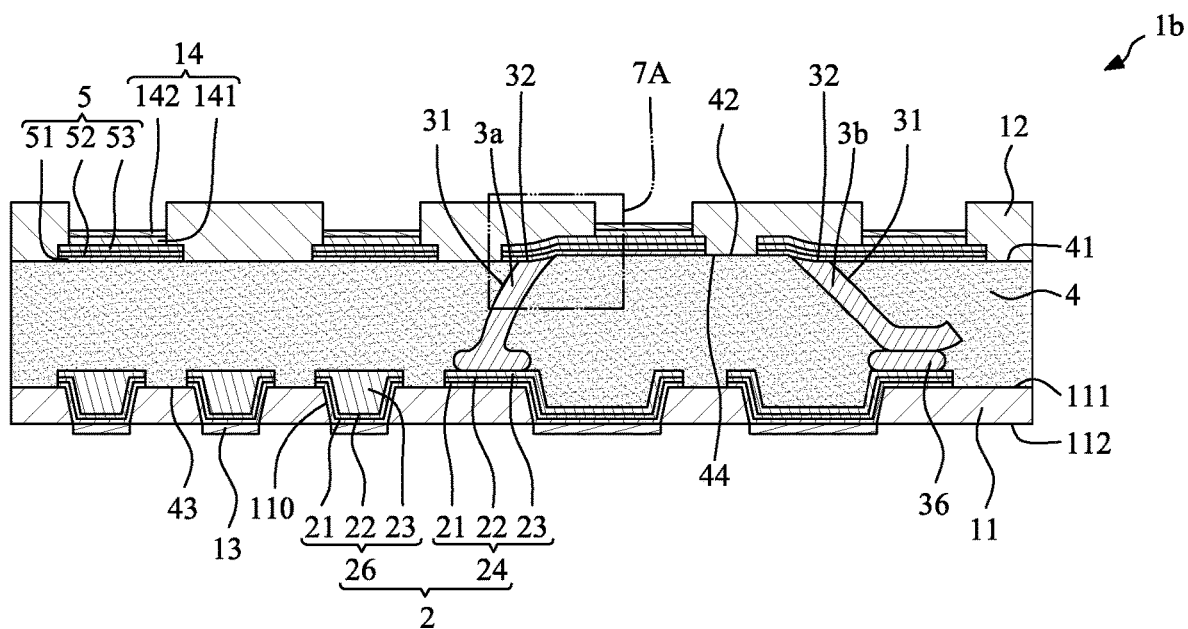
FIG. 7 illustrates a cross-sectional view of an example of a package device according to some embodiments of the present disclosure.
Figure 8:
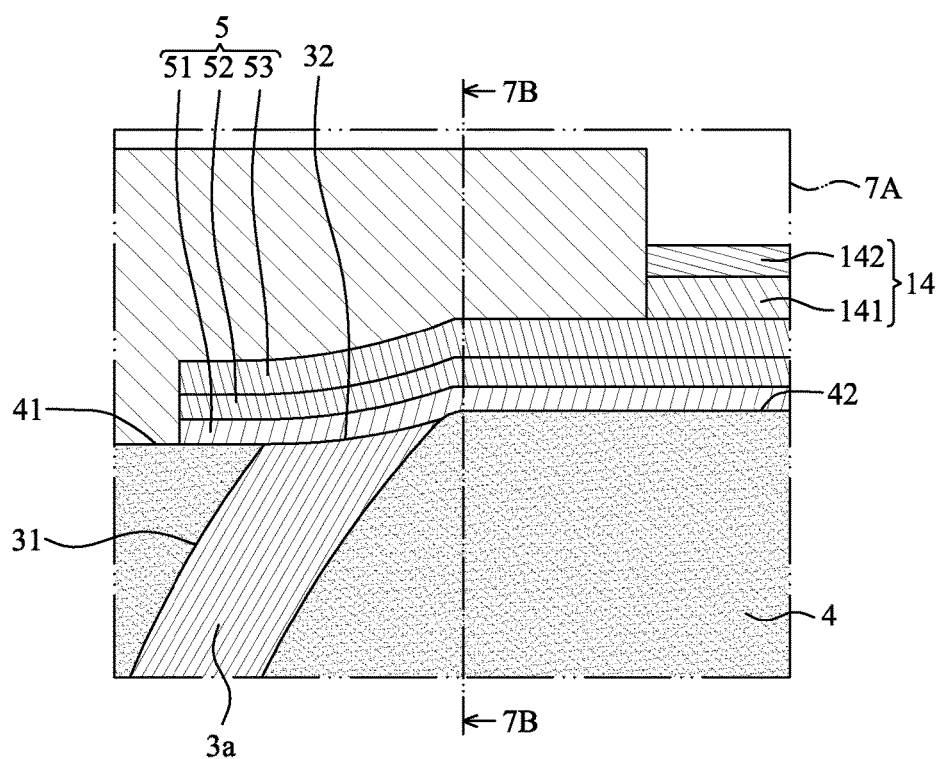
FIG. 8 illustrates an enlarged view of an area 7A shown in FIG. 7.
Figure 9:
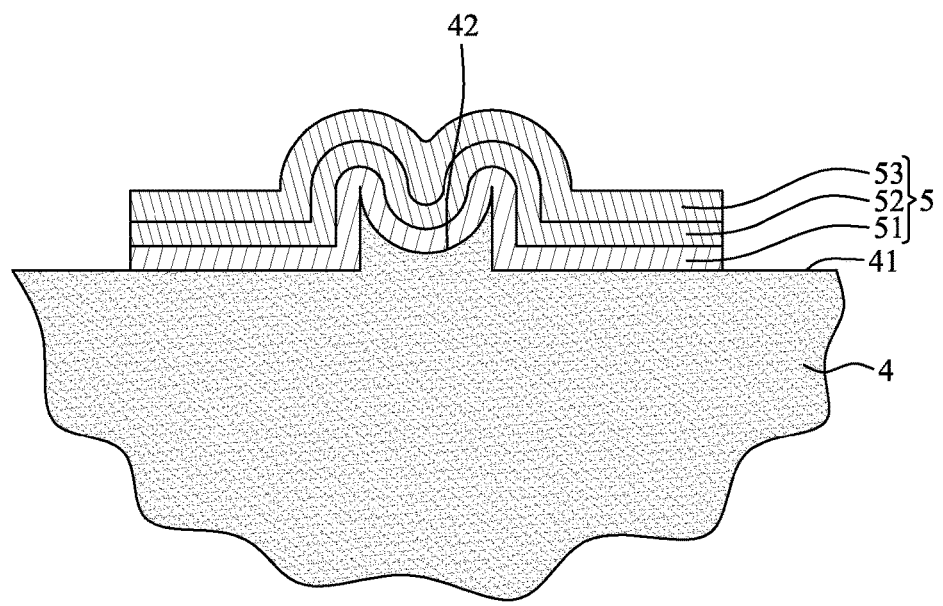
FIG. 9 illustrates a cross-sectional view taken along line 7B-7B shown in FIG. 8.

FIG. 7 illustrates a cross-sectional view of a package device 1b according to some embodiments of the present disclosure. FIG. 8 illustrates an enlarged view of an area 7A shown in FIG. 7. FIG. 9 illustrates a cross-sectional view taken along line 7B-7B shown in FIG. 8. For illustration purpose, the passivation layer 12 is omitted in FIG. 9.

The package device 1b is similar to the package device 1 shown in FIGS. 1 to 3, but differs as follows. As shown in FIGS. 7 to 9, the second upper surface 42 of the encapsulant 4 is disposed above the first upper surface 41 of the encapsulant 4. Besides, the first surface 31 (e.g. the entire first surface 31) of the first conductive segment 3a may be covered by the encapsulant 4. The second surface 32 of the first conductive segment 3a is exposed from the encapsulant 4, and connects the first upper surface 41 and the second upper surface 42 of the encapsulant 4. For example, the first conductive segment 3a has the second surface 32 exposed from the encapsulant 4, while the exposed portion 34 shown in FIGS. 1 and 2 is omitted in the package device 1b shown in FIGS. 7 to 9. The RDL 5 may be disposed on the second surface 32 of the first conductive segment 3a, the first upper surface 41 and the second upper surface 42 of the encapsulant 4, without being disposed on the first surface 31 of the conductive segment 3a.

Figure 10:
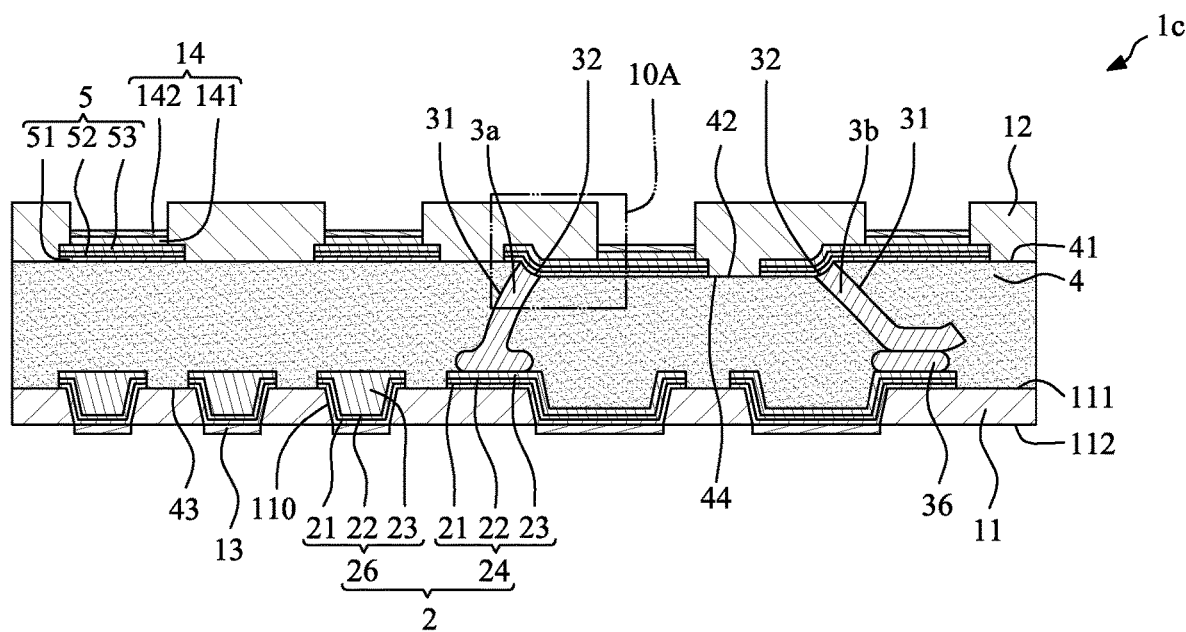
FIG. 10 illustrates a cross-sectional view of an example of a package device according to some embodiments of the present disclosure.
Figure 11:
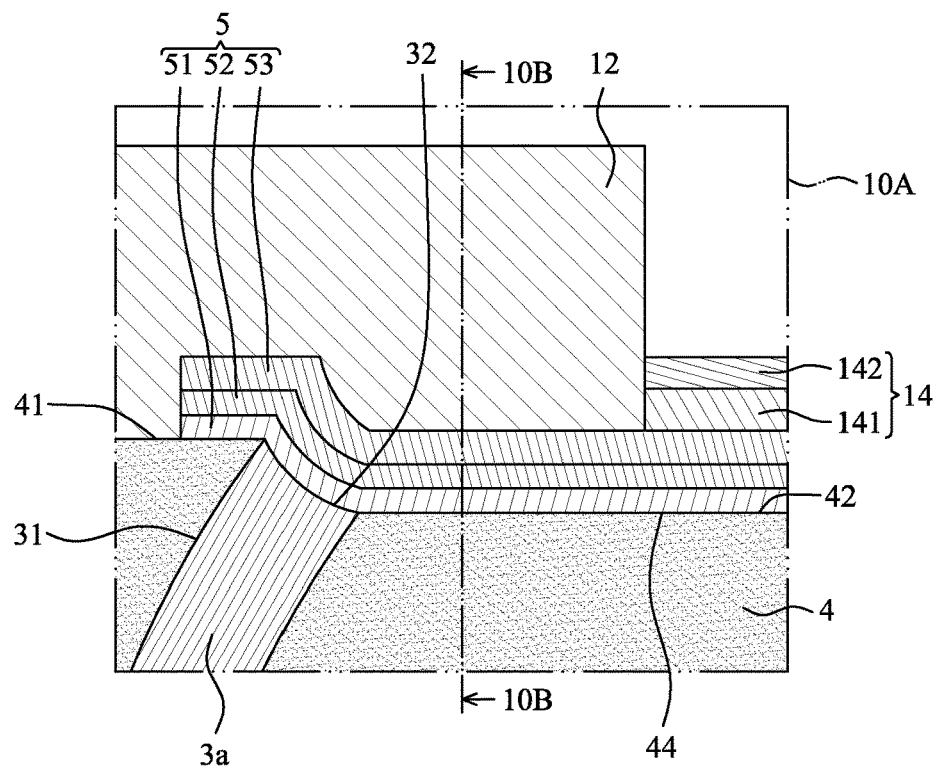
FIG. 11 illustrates an enlarged view of an area 10A shown in FIG. 10.
Figure 12:
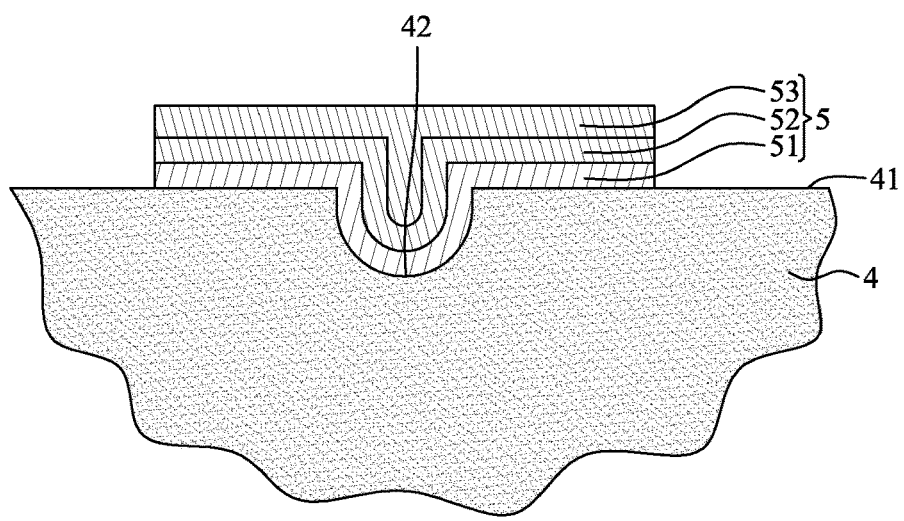
FIG. 12 illustrates a cross-sectional view taken along line 10B-10B shown in FIG. 11.

FIG. 10 illustrates a cross-sectional view of a package device 1c according to some embodiments of the present disclosure. FIG. 11 illustrates an enlarged view of an area 10A shown in FIG. 10. FIG. 12 illustrates a cross-sectional view taken along line 10B-10B shown in FIG. 11. For illustration purpose, the passivation layer 12 is omitted in FIG. 12.

The package device 1c is similar to the package device 1 shown in FIGS. 1 to 3, but differs as follows. As shown in FIGS. 10 to 12, the first surface 31 (e.g. the entire first surface 31) of the first conductive segment 3a may be covered by the encapsulant 4. The second surface 32 of the first conductive segment 3a is exposed from the encapsulant 4, and connects the first upper surface 41 and the second upper surface 42 of the encapsulant 4. For example, the first conductive segment 3a has the second surface 32 exposed from the encapsulant 4, while the exposed portion 34 shown in FIGS. 1 and 2 is omitted in the package device 1b shown in FIGS. 10 to 12. The RDL 5 may be disposed on the second surface 32 of the first conductive segment 3a, the first upper surface 41 and the second upper surface 42 of the encapsulant 4, without being disposed on the first surface 31 of the conductive segment 3a.

Figure 13:
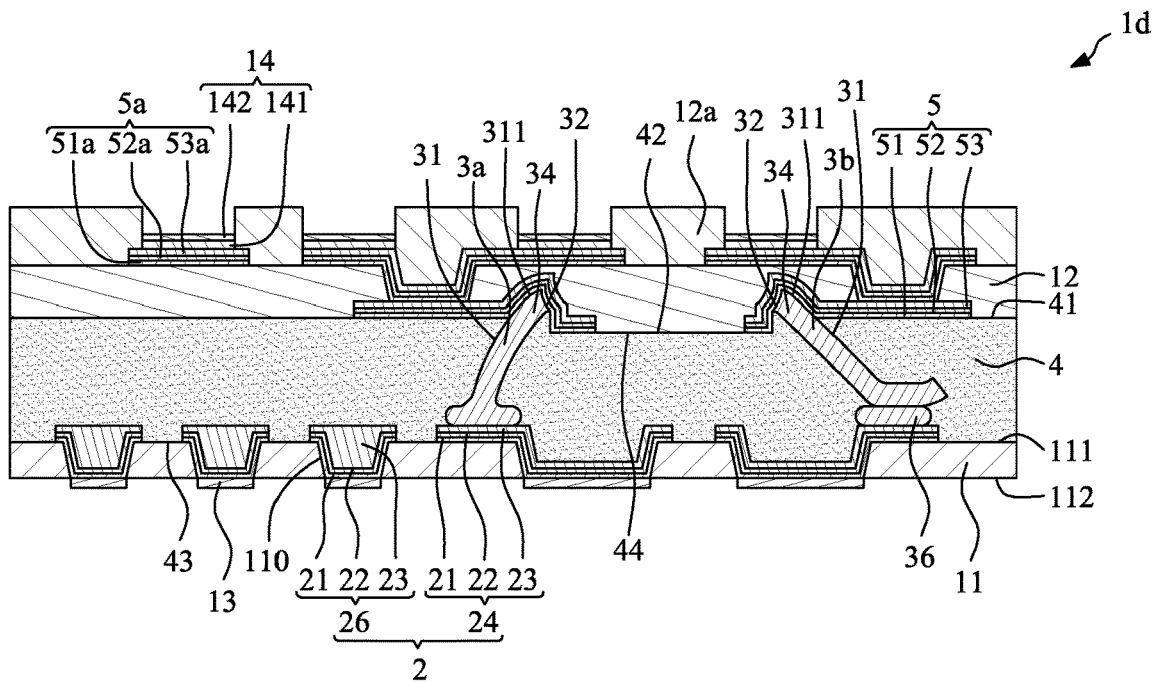
FIG. 13 illustrates a cross-sectional view of an example of a package device according to some embodiments of the present disclosure.

FIG. 13 illustrates a cross-sectional view of a package device 1d according to some embodiments of the present disclosure. The package device 1d is similar to the package device 1 shown in FIGS. 1 to 3, except that the package device 1d in FIG. 13 further includes an additional RDL 5a and an additional passivation layer 12a. The additional RDL 5a is disposed on the passivation layer 12 and electrically connected to the RDL 5. Similar to the RDL 5, the RDL 5a may also include metal layers including a fourth metal layer 51a, a fifth metal layer 52a and a sixth metal layer 53a. The fourth metal layer 51a and the fifth metal layer 52a may be seed layers and include titanium, copper, nickel, tungsten, and/or platinum, or an alloy thereof, and may be formed by sputtering. The sixth metal layer 53a may include copper, tin, gold, silver, nickel, and/or palladium, or an alloy thereof and may be formed by electroplating, electroless plating or printing. The additional passivation layer 12a is disposed on the additional RDL 5a and the passivation layer 12, and at least a portion of the additional RDL 5a is exposed from the additional passivation layer 12a. The second UBM 14 is disposed on the exposed portion of the additional RDL 5a.

Figure 14:
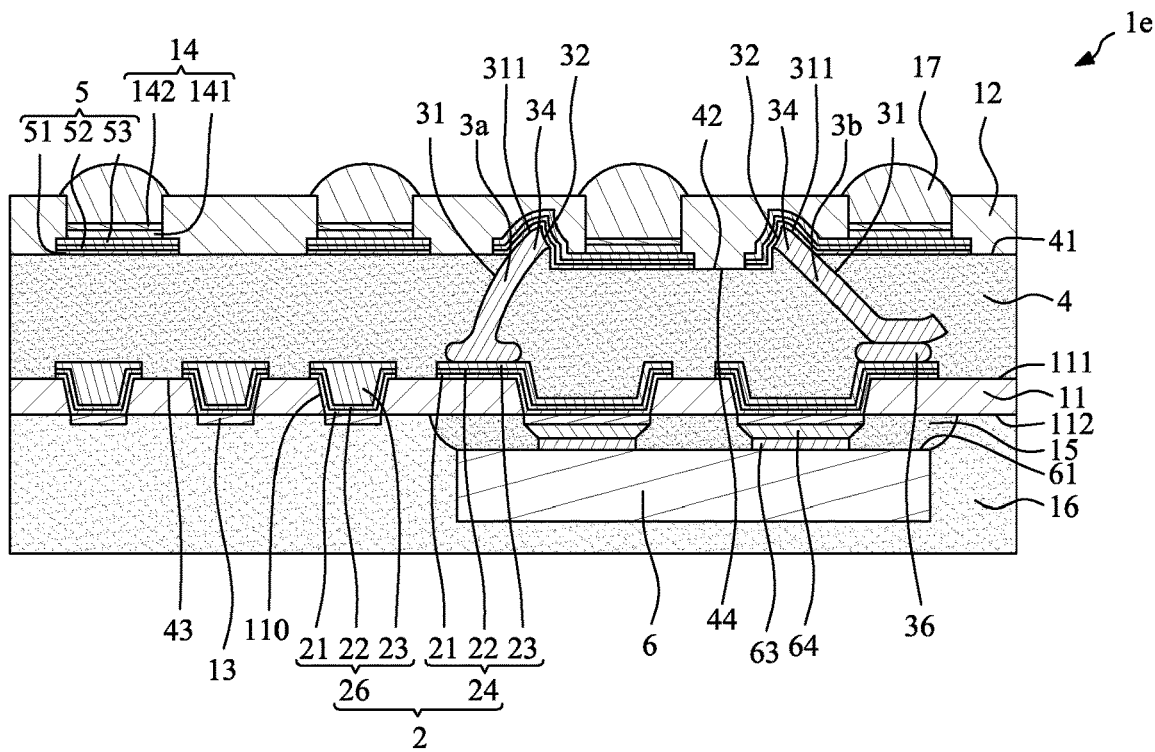
FIG. 14 illustrates a cross-sectional view of an example of a package device (semiconductor device) according to some embodiments of the present disclosure.

FIG. 14 illustrates a cross-sectional view of a package device 1e according to some embodiments of the present disclosure. The package device 1e is similar to the package device 1 shown in FIGS. 1 to 3, except that the package device 1e in FIG. 14 further includes an electronic component 6, an underfill 15, a molding compound 16, and at least one upper solder connector 17. Thus, the package device 1e of FIG. 14 can be also referred to as "a semiconductor device".

The electronic component 6 is disposed on the circuit layer 2. As shown in FIG. 14, the electronic component 6 is disposed on the lower surface 112 of the dielectric layer 11 and is electrically connected to the circuit layer 2. For example, the electronic component 6 may be a semiconductor die. The electronic component 6 includes, or is electrically connected to, at least one conductive pillar 63 and at least one solder bump 64 sequentially disposed on a first surface 61 of the electronic component 6. The solder bump 64 is electrically connected to the first UBM 13 disposed on the conductive via 26 of the circuit layer 2.

The underfill 15 is disposed between the electronic component 6 and the dielectric layer 11, and covers the first surface 61, the conductive pillar 63 and the solder bump 64 of the electronic component 6. The molding compound 16 is disposed on the lower surface 112 of the dielectric layer 11 and covers the electronic component 6, the underfill 15 and the lower surface 112 of the dielectric layer 11. The upper solder connector 17 is disposed on the second UBM 14 and protrudes from the passivation layer 12.

Figure 15:
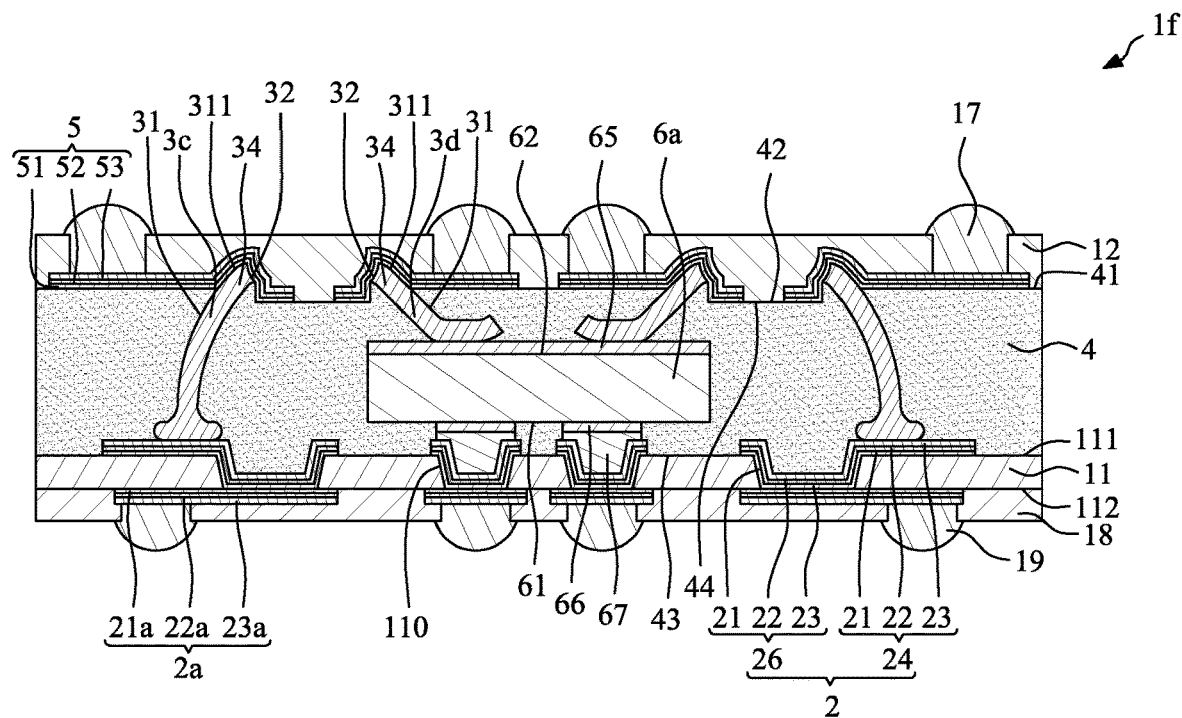
FIG. 15 illustrates a cross-sectional view of an example of a package device (semiconductor device) according to some embodiments of the present disclosure.

FIG. 15 illustrates a cross-sectional view of a package device (or a semiconductor device) 1f according to some embodiments of the present disclosure. Similar to the package device 1 shown in FIGS. 1 to 3, the package device 1f also includes a dielectric layer 11, a circuit layer 2, an encapsulant 4, at least one conductive segment (e.g., a first conductive segment (or a third conductive segment) 3c and a second conductive segment (or a fourth conductive segment) 3d), an RDL 5, and a passivation layer 12. However, the package device 1f includes the first conductive segment 3c and the second conductive segment 3d instead of the first conductive segment 3a and the second conductive segment 3b of the package device 1 shown in FIGS. 1 to 3, and the first UBM 13 and the second UBM 14 of the package device 1 shown in FIGS. 1 to 3 are omitted in the package device 1f. Besides, the package device 1f may further include an additional circuit layer 2a, an electronic component 6a, at least one upper solder connector 17, a protection layer 18 and at least one lower solder connector 19.

The dielectric layer 11 and the circuit layer 2 are the same as, or similar to, those of the package device 1 shown in FIGS. 1 to 3, and thus are not described redundantly. The additional circuit layer 2a is disposed on the lower surface 112 of the dielectric layer 11, and is electrically connected to the conductive via 26 of the circuit layer 2. The additional circuit layer 2a may also include a first metal layer 21a, a second metal layer 22a and a third metal layer 23a. The first metal layer 21a and the second metal layer 22a may be seed layers and include titanium, copper, nickel, tungsten, and/or platinum, or an alloy thereof, and may be formed by sputtering. The third metal layer 23a may include copper, tin, gold, silver, nickel, and/or palladium, or an alloy thereof, and may be formed by electroplating, electroless plating or printing.

The protection layer 18 is disposed on the lower surface 112 of the dielectric layer 11 and covers the additional circuit layer 2a. At least a portion of the additional circuit layer 2a is exposed from the protection layer 18. The lower solder connector 19 is disposed in the protective layer 18 and on the exposed portion of the additional circuit layer 2a.

The electronic component 6a is disposed on the circuit layer 2. For example, the electronic component 6a may be a logic component. However, in some other embodiments, the electronic component 6a may be other components. The electronic component 6a has a first surface 61 (e.g. an active surface) and a passive surface 62 opposite to the first surface 61. The electronic component 6a includes a conductive layer 65 disposed on the passive surface 62, and at least one bump pad 66 is disposed on the first surface 61. The electronic component 6a further includes at least one solder joint 67 disposed between the bump pad 66 and a respective conductive via 26. Hence, the electronic component 6a can be electrically connected to the circuit layer 2 through the bump pad 66 and the solder joint 67.

The encapsulant 4, such as a molding compound, is disposed on the upper surface 111 of the dielectric layer 11 and covers the circuit layer 2 and the electronic component 6a. The encapsulant 4 has a first upper surface 41 and a second upper surface 42, and a lower surface 43 opposite to the first upper surface 41 and the second upper surface 42. The first upper surface 41 and the second upper surface 42 are not coplanar. For example, the first upper surface 41 is disposed above the second upper surface 42. In some embodiments, the first upper surface 41 is substantially flat, and the second upper surface 42 is substantially in an annular or semi-cylinder shape. The second upper surface 42 intersects with the first upper surface 41 at two sides, and is recessed from the first upper surface 41 to define a cavity 44. The lower surface 43 of the encapsulant 4 is disposed on the upper surface 111 of the dielectric layer 11. In some embodiments, a material of the encapsulant 4 may be the same as or similar to that of the dielectric layer 11.

In some embodiments, as shown in FIG. 15, the at least one conductive segment includes the first conductive segment 3c and the second conductive segment 3d separated from the first conductive segment 3c. The first conductive segment 3c and the second conductive segment 3d may be formed from a single bonding wire. For example, the first conductive segment 3c may include a first bond portion (e.g., a ball bond) of the bonding wire, and the second conductive segment 3d may include a second bond portion (e.g., a wedge bond or a tail bond) of the bonding wire. In some embodiments, the second conductive segment 3d may further include a stud portion (such as the stud portion 36 shown in FIG. 1) disposed on the circuit layer 2 for enhanced engagement with the circuit layer 2. However, as shown in FIG. 15, the stud portion 36 shown in FIG. 1 is omitted in the package device 1f shown in FIG. 15. The first conductive segment 3c is disposed on the circuit layer 2 (e.g., each disposed on a respective bump pad 24) and extends through the encapsulant 4. The second conductive segment 3d is disposed on the conductive layer 65 of the electronic component 6a and also extends through the encapsulant 4. The encapsulant 4 encapsulates at least a portion of the first conductive segment 3c. In some embodiments, the encapsulant 4 also encapsulates at least a portion of the second conductive segment 3d, and the cavity 44 of the encapsulant 4 is located between the first conductive segment 3c and the second conductive segment 3d.

The first conductive segment 3c has a first surface 31 and a second surface 32. The first surface 31 and the second surface 32 intersect with each other. For example, the second surface 32 is a concave surface, and the first surface 31 is substantially an annular surface extending from a periphery of the second surface 32. A first portion 311 of the first surface 31 is disposed above the first upper surface 41 of the encapsulant 4 and is exposed from the encapsulant 4. The second surface 32 is exposed from the encapsulant 4, and at least a portion of the second surface 32 is disposed above the first upper surface 41 of the encapsulant 4. In some embodiments, as shown in FIG. 15, the second surface 32 (e.g. the entire second surface 32) is disposed above the first upper surface 41 of the encapsulant 4. The second upper surface 42 of the encapsulant 4 is disposed below the second surface 32 of the first conductive segment 3c. An average roughness of the first surface 31 of the first conductive segment 3c is different from an average roughness of the second surface 32 of the first conductive segment 3c. In some embodiments, the average roughness of the first surface 31 of the first conductive segment 3c is less than the average roughness of the second surface 32 of the first conductive segment 3c. For example, the average roughness of the second surface 32 may be at least about 1.5 times, about 2 times, at least about 3 times, or at least about 5 times the average roughness of the first surface 31. For example, the average roughness of the first surface 31 may be smaller than about 20 nm, and the average roughness of the second surface 32 may be greater than about 40 nm. As shown in FIG. 15, a portion 34 of the first conductive segment 3c and a portion 34 of the second conductive segment 3d are exposed from the encapsulant 4. The first portion 311 of the first surface 31 and the second surface 32 are surfaces of the exposed portion 34 of the first conductive segment 3c. The second conductive segment 3d also has a first surface 31 and a second surface 32. The first surface 31, the second surface 32 and the exposed portion 34 of the second conductive segment 3d are similar to those of the first conductive segment 3c, and thus are not described redundantly. The first conductive segment 3c and the second conductive segment 3d may include conductive metals, such as tin, aluminum, gold, silver or copper, or an alloy thereof.

The RDL 5 is disposed on the encapsulant 4, the first portion 311 of the first surface 31 of the first conductive segment 3c disposed above the first upper surface 41 of the encapsulant 4, and the second surface 32 of the first conductive segment 3c. Similarly, the RDL 5 is also disposed on the first portion 311 of the first surface 31 of the second conductive segment 3d disposed above the first upper surface 41 of the encapsulant 4, and the second surface 32 of the second conductive segment 3d. As shown in FIG. 15 the RDL 5 is disposed on both the first upper surface 41 and the second upper surface 42 of the encapsulant 4. The RDL 5 covers the exposed portion 34 of the first conductive segment 3c and the exposed portion 34 of the second conductive segment 3d. The RDL 5 is disposed on and conformal to the first portion 311 of the first surface 31 of the first conductive segment 3c, and the second surface 32 of the first conductive segment 3c. Similarly, the RDL 5 may also be disposed on and conformal to the first portion 311 of the first surface 31 of the second conductive segment 3d and the second surface 32 of the second conductive segment 3d. In some embodiments, the first conductive segment 3c connects the circuit layer 2 and the RDL 5, and the second conductive segment 3d connects the electronic component 6a and the RDL 5. For example, the second conductive segment 3d connects to the conductive layer 65 of the electronic component 6a. Similar to the circuit layer 2, the RDL 5 may also include metal layers including a fourth metal layer 51, a fifth metal layer 52 and a sixth metal layer 53. The fourth metal layer 51 and the fifth metal layer 52 may be seed layers and include titanium, copper, nickel, tungsten, and/or platinum, or an alloy thereof, and may be formed by sputtering. The sixth metal layer 53 may include copper, tin, gold, silver, nickel, and/or palladium, or an alloy thereof, and may be formed by electroplating, electroless plating or printing.

The passivation layer 12 is similar to that of the package device shown in FIGS. 1 to 3, and thus is not described redundantly. At least a portion of the RDL 5 is exposed from the passivation layer 12, and the upper solder connector 17 is disposed in the passivation layer 12 and on the exposed portion of the RDL 5.

In the package device (semiconductor device) 1f, since the second conductive segment 3d is connected to the passive surface 62 of the electronic component 6a, the second conductive segment 3d provides a dissipation function and an electrical grounding function. In the case of the electronic component 6a being a logic component, the solid structure of the logic component provides stronger reactionary force during formation of the bonding wire (e.g., the second conductive segment 3d), thus strengthening the engagement between the second conductive segment 3d and the electronic component 6a.

Figure 16:
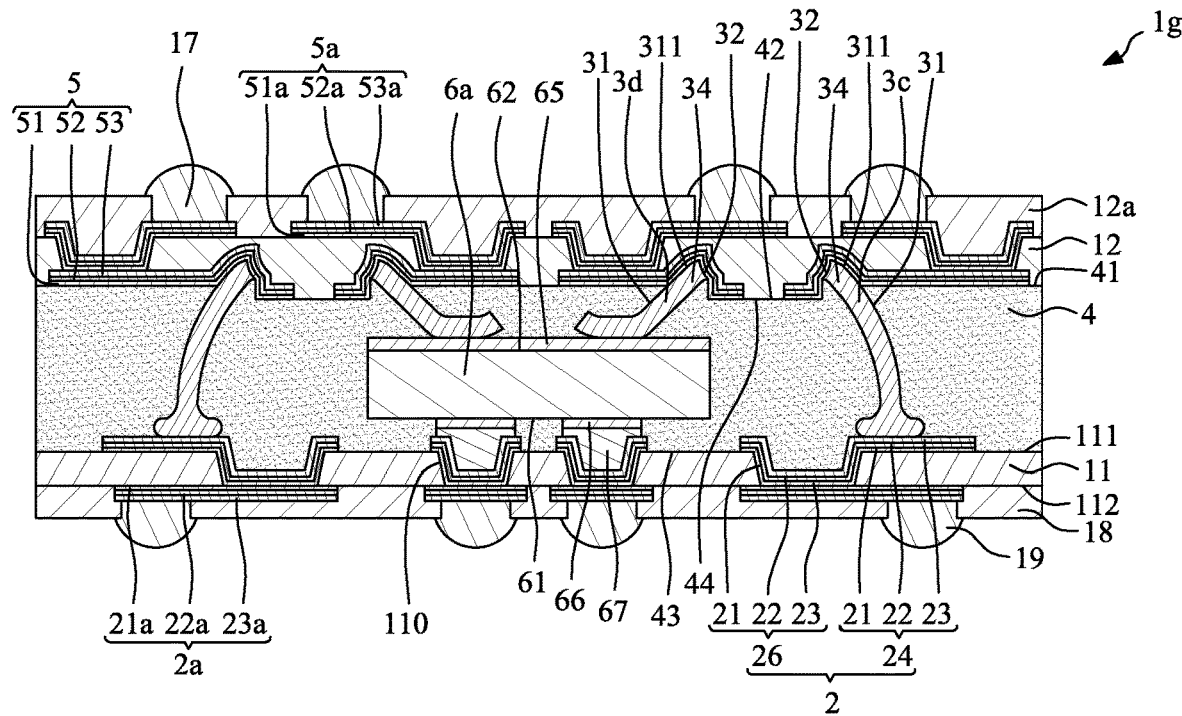
FIG. 16 illustrates a cross-sectional view of an example of a package device (semiconductor device) according to some embodiments of the present disclosure.

FIG. 16 illustrates a cross-sectional view of a package device (or a semiconductor device) 1g according to some embodiments of the present disclosure. The package device 1g is similar to the package device if shown in FIG. 15, except that the package device 1g shown in FIG. 16 further includes an additional RDL 5a and an additional passivation layer 12a. The additional RDL 5a is disposed on the passivation layer 12 and electrically connected to the RDL 5. The additional passivation layer 12a is disposed on the additional RDL 5a and the passivation layer 12, and at least a portion of the additional RDL 5a is exposed from the additional passivation layer 12a. The second UBM 14 is disposed on the exposed portion of the additional RDL 5a.

Figure 17:
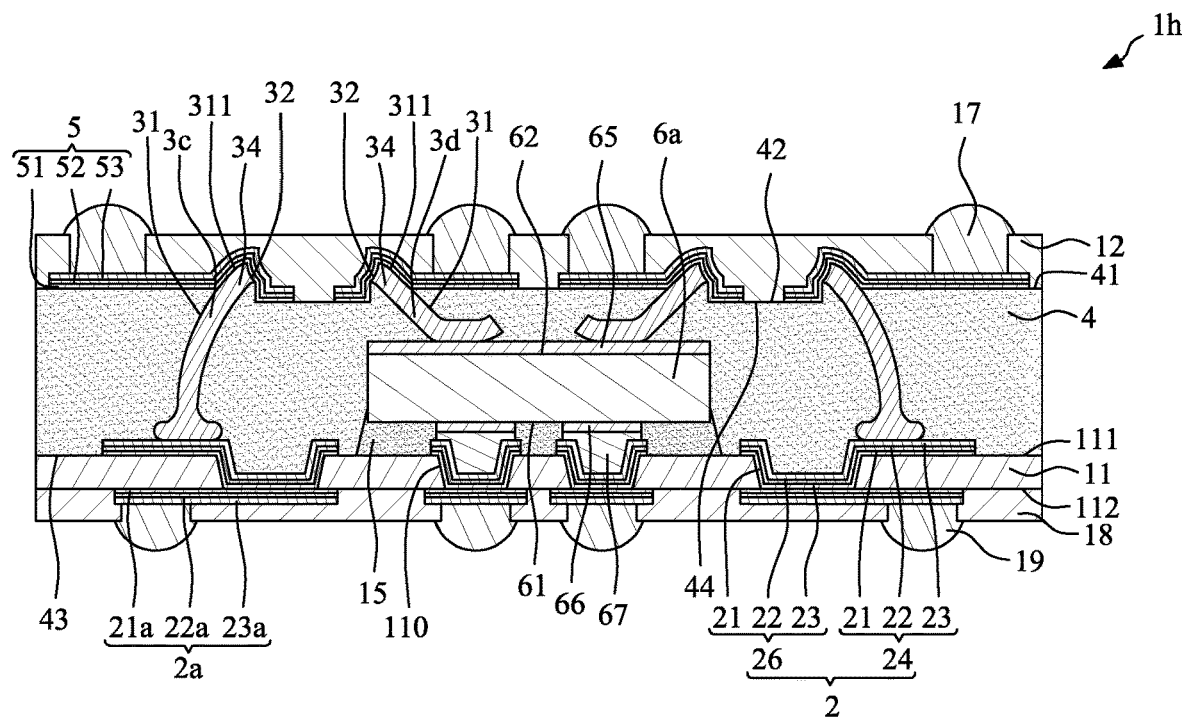
FIG. 17 illustrates a cross-sectional view of an example of a package device (semiconductor device) according to some embodiments of the present disclosure.

FIG. 17 illustrates a cross-sectional view of a package device (or a semiconductor device) 1h according to some embodiments of the present disclosure. The package device 1h is similar to the package device if shown in FIG. 15, except that the package device 1h shown in FIG. 17 further includes an underfill 15. The underfill 15 is disposed between the electronic component 6a and the circuit layer 2, and covers the first surface 61, the bump pad 66 and the solder joint 67 of the electronic component 6a. The underfill 15 is encapsulated in the encapsulant 4.

Figure 18:
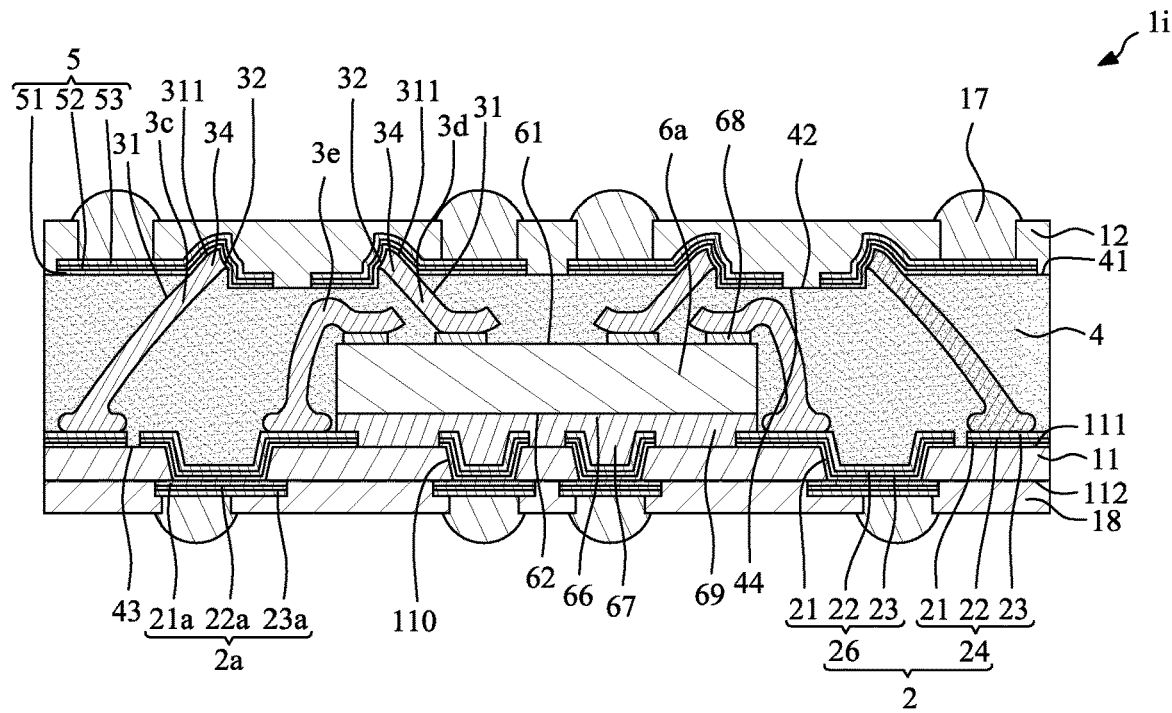
FIG. 18 illustrates a cross-sectional view of an example of a package device (semiconductor device) according to some embodiments of the present disclosure.

FIG. 18 illustrates a cross-sectional view of a package device (or a semiconductor device) 1i according to some embodiments of the present disclosure. The package device 1i is similar to the package device if shown in FIG. 15, except that the electronic component 6a of the package device 1i shown in FIG. 18 further includes at least one bonding pad 68 disposed on the first surface 61 thereof, and is adhered to the dielectric layer 11 through an adhesive 69. As shown in FIG. 18, the electronic component 6a includes a plurality of bonding pads 68. The adhesive 69 is disposed between the passive surface 62 of the electronic component 6a and the first surface 111 of the dielectric layer 11, and may cover a portion of the circuit layer 2. The second conductive segment 3d may be disposed on one of the bonding pads 68 of the electronic component 6a. Besides, the package device 1i may further include at least an additional bonding wire 3e connecting the circuit layer 2 and another one of the bonding pads 68 of the electronic component 6a.

Figure 19:
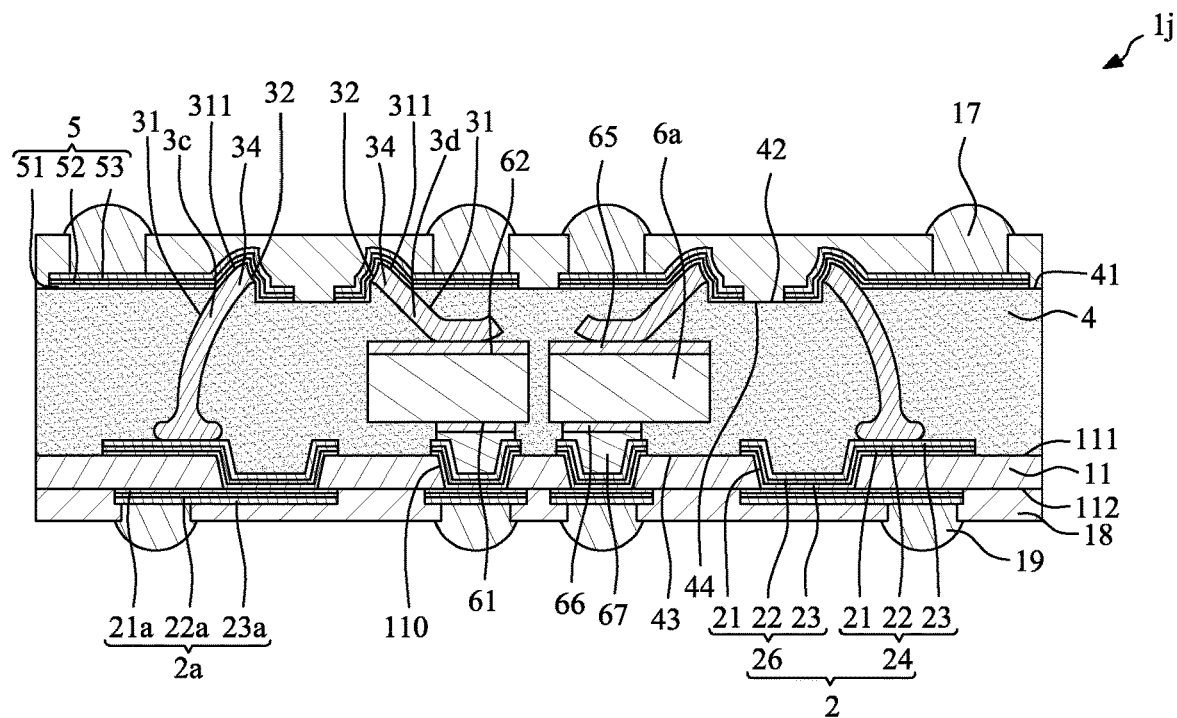
FIG. 19 illustrates a cross-sectional view of an example of a package device (semiconductor device) according to some embodiments of the present disclosure.

FIG. 19 illustrates a cross-sectional view of a package device (or a semiconductor device) 1j according to some embodiments of the present disclosure. The package device 1j is similar to the package device if shown in FIG. 15, except that the package device 1j shown in FIG. 19 includes two electronic components 6a separately disposed (e.g. spaced apart) on the dielectric layer 11 and electrically connected to the circuit layer 2. Besides, the package device 1j further includes two second conductive segments 3d respectively disposed on the two electronic components 6a. In some embodiments, the package device 1j may include more than two electronic components 6a and more than two second conductive segments 3d.

Figure 20:
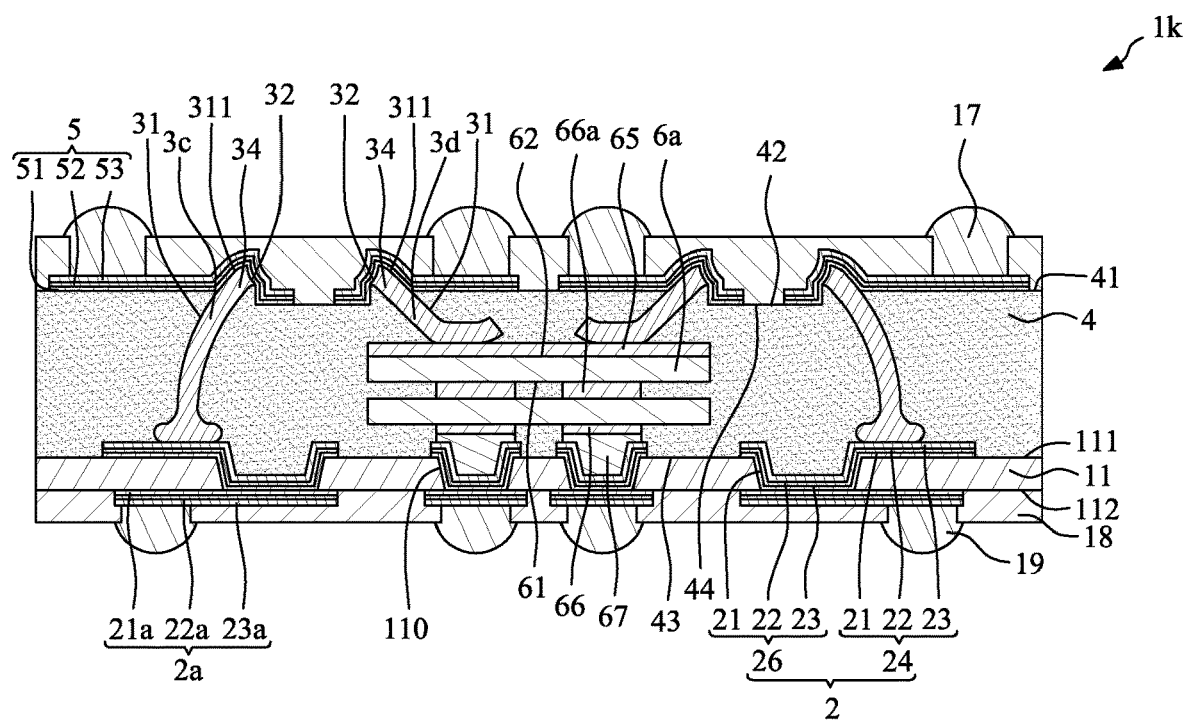
FIG. 20 illustrates a cross-sectional view of an example of a package device (semiconductor device) according to some embodiments of the present disclosure.

FIG. 20 illustrates a cross-sectional view of a package device (or a semiconductor device) 1k according to some embodiments of the present disclosure. The package device 1k is similar to the package device if shown in FIG. 15, except that the package device 1k shown in FIG. 20 includes two electronic components 6a sequentially disposed on the dielectric layer 11. The lower one of the two electronic components 6a is disposed on the dielectric layer 11 and electrically connected to the circuit layer 2 through the bump pad 66 and the solder joint 67. The upper one of the two electronic components 6a is disposed on and connected to the lower one of the two electronic components 6a through another bump pad 66a. The second conductive segment 3d is disposed on the upper one of the two electronic components 6a.

FIG. 21 through FIG. 47 illustrate a method for manufacturing a package device according to some embodiments of the present disclosure. In some embodiments, the method is for manufacturing a package device such as the package device 1 shown in FIGS. 1 to 3.

Figure 21:
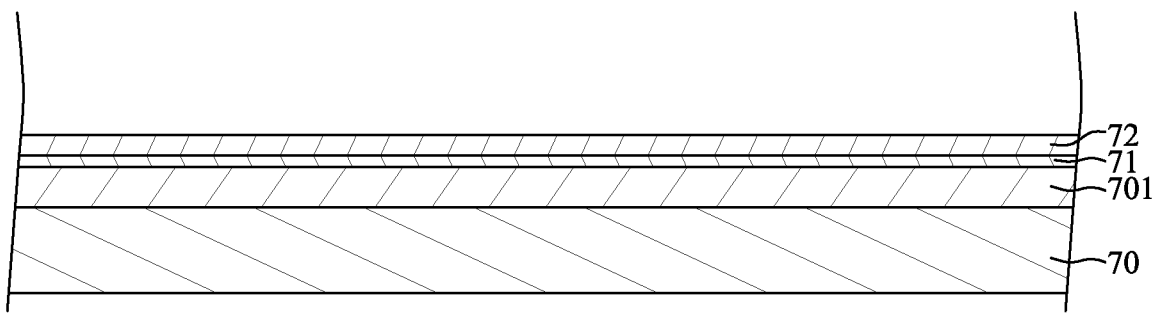
FIG. 21 illustrates one or more stages of an example of a method for manufacturing a package device according to some embodiments of the present disclosure.

Referring to FIG. 21, a carrier 70 is provided. The carrier 70 may include, for example, a metal or a glass material. The carrier 70 may optionally include a layer or film of material disposed thereon, such as a thermal release material 701. Then, a first seed layer 71 and a second seed layer 72 are sequentially disposed on the thermal release material 701 of the carrier 70. The first seed layer 71 may include titanium, and the second seed layer may include copper. The first seed layer 71 and the second seed layer 72 may be disposed by, for example, physical vapor deposition.

Figure 22:
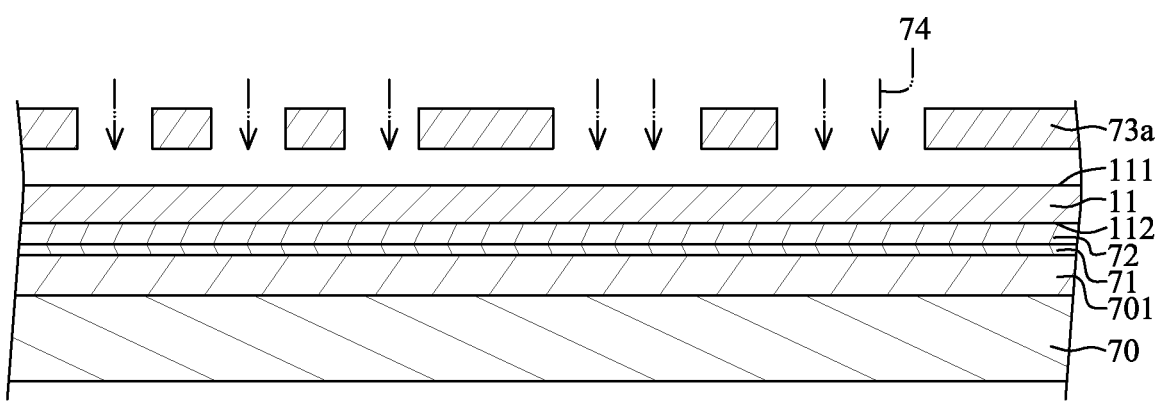
FIG. 22 illustrates one or more stages of an example of a method for manufacturing a package device according to some embodiments of the present disclosure.

Referring to FIG. 22, a dielectric layer 11 is provided on the second seed layer 72. The dielectric layer 11 has an upper surface 111 and a lower surface 112 opposite to the upper surface 111, and the lower surface 112 thereof is disposed on the second seed layer 72. The dielectric layer 11 may be a PID material, such as an epoxy or a PI including photoinitiators, or a solder resist layer. Then, the dielectric layer 11 is exposed to a pattern of intense light. For example, a first mask 73a is disposed adjacent to the upper surface 111 of the dielectric layer 11, so as to cover a portion of the dielectric layer 11. Then, the dielectric layer 11 is exposed to a radiation source 74.

Figure 23:
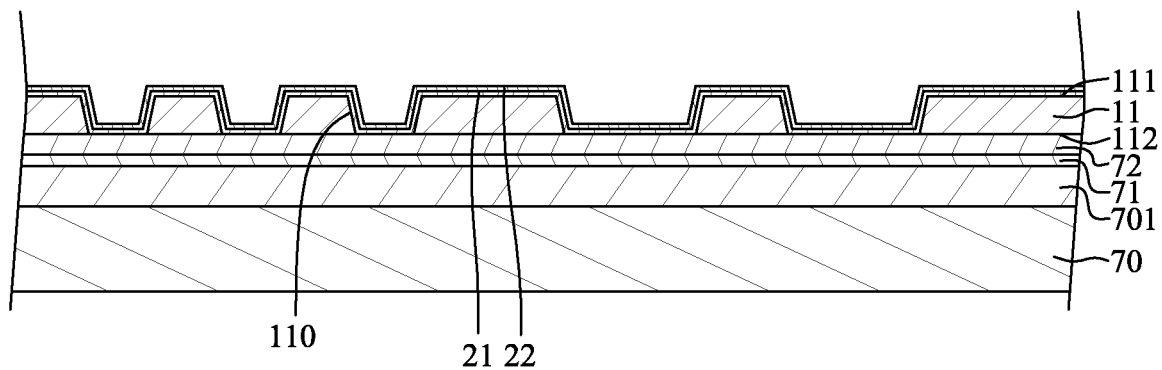
FIG. 23 illustrates one or more stages of an example of a method for manufacturing a package device according to some embodiments of the present disclosure.

Referring to FIG. 23, the dielectric layer 11 is then developed by a developer. The dielectric layer 11 is patterned to define at least one through hole 110 extending through the dielectric layer 11 and between the upper surface 111 and the lower surface 112. Then, a first metal layer 21 and a second metal layer 22 are sequentially disposed on the dielectric layer 11 and in the through hole 110. The first metal layer 21 and the second metal layer 22 may be seed layers and include titanium, copper, nickel, tungsten, and/or platinum, or an alloy thereof, and may be formed by sputtering.

Figure 24:
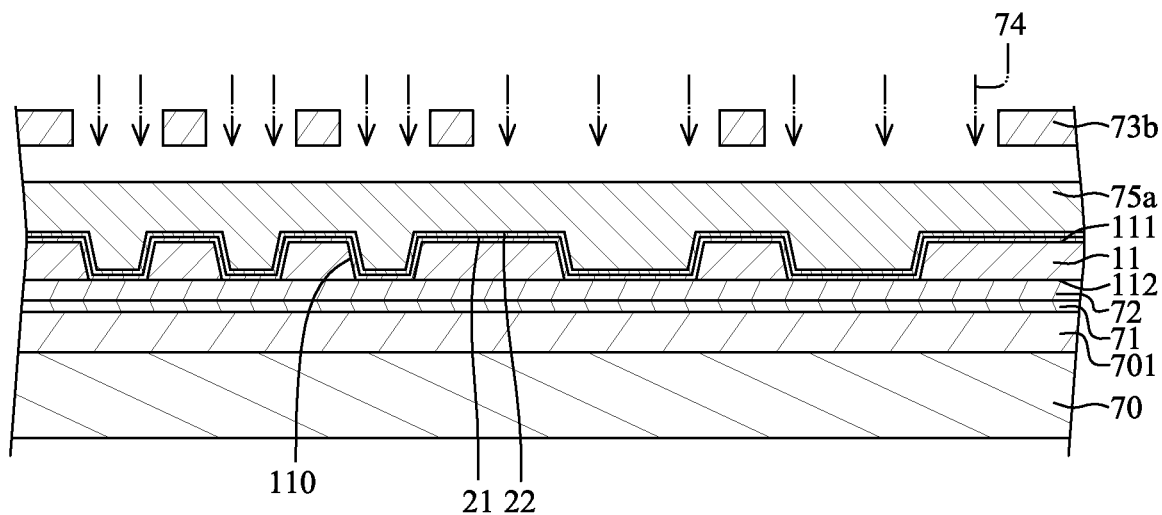
FIG. 24 illustrates one or more stages of an example of a method for manufacturing a package device according to some embodiments of the present disclosure.

Referring to FIG. 24, a first photoresist layer 75a is disposed on the second metal layer 22. Then, the first photoresist layer 75a is exposed to a pattern of intense light. For example, a second mask 73b is disposed adjacent to the first photoresist layer 75a, so as to cover a portion of the first photoresist layer 75a. Then, the first photoresist layer 75a is exposed to the radiation source 74 or a different radiation source.

Figure 25:
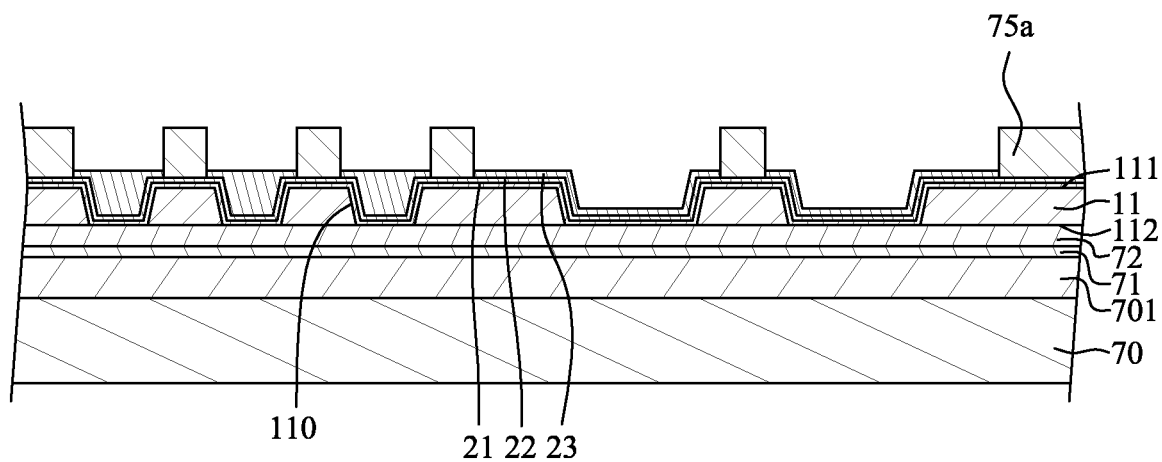
FIG. 25 illustrates one or more stages of an example of a method for manufacturing a package device according to some embodiments of the present disclosure.

Referring to FIG. 25, the first photoresist layer 75a is then developed by a developer. The first photoresist layer 75a is patterned to expose portions of the second metal layer 22. Then, a third metal layer 23 is formed in the first photoresist layer 75 and on the second metal layer 22. The third metal layer 23 may include copper, tin, gold, silver, nickel, and/or palladium, or an alloy thereof, and may be formed by electroplating, electroless plating or printing.

Figure 26:
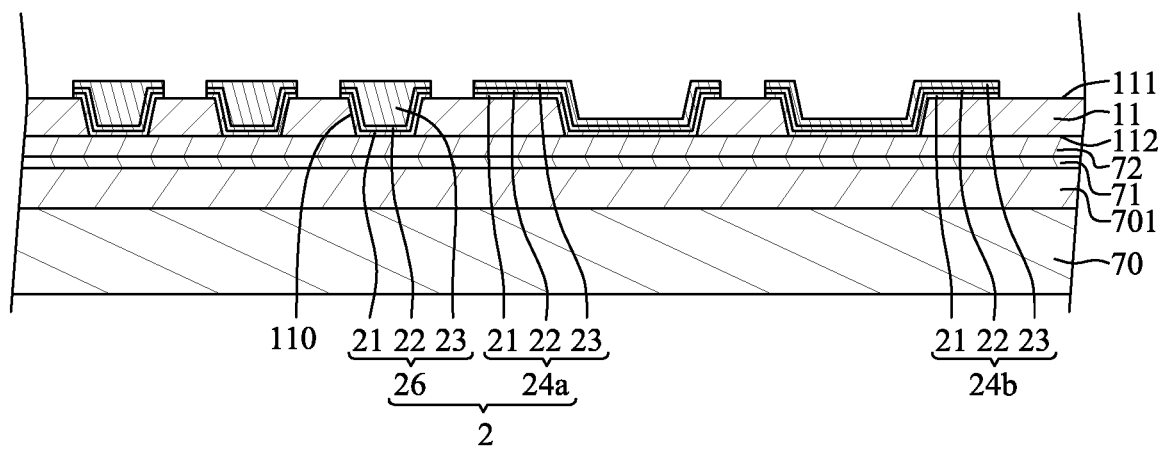
FIG. 26 illustrates one or more stages of an example of a method for manufacturing a package device according to some embodiments of the present disclosure.

Referring to FIG. 26, the first photoresist layer 75a is removed by, for example, stripping. Then, portions of the first metal layer 21 and the second metal layer 22 which are not covered by the third metal layer 23 are removed by, for example, etching. Hence, a circuit layer 2 is formed from and includes the first metal layer 21, the second metal layer 22 and the third metal layer 23. The circuit layer 2 may include at least one bump pad 24 disposed on the upper surface 111 of the dielectric layer 11, and at least one conductive via 26 disposed in the through hole 110 of the dielectric layer 11. In some embodiments, as shown in FIG. 26, the circuit layer 2 includes a first bump pad 24a and a second bump pad 24b.

Figure 27:
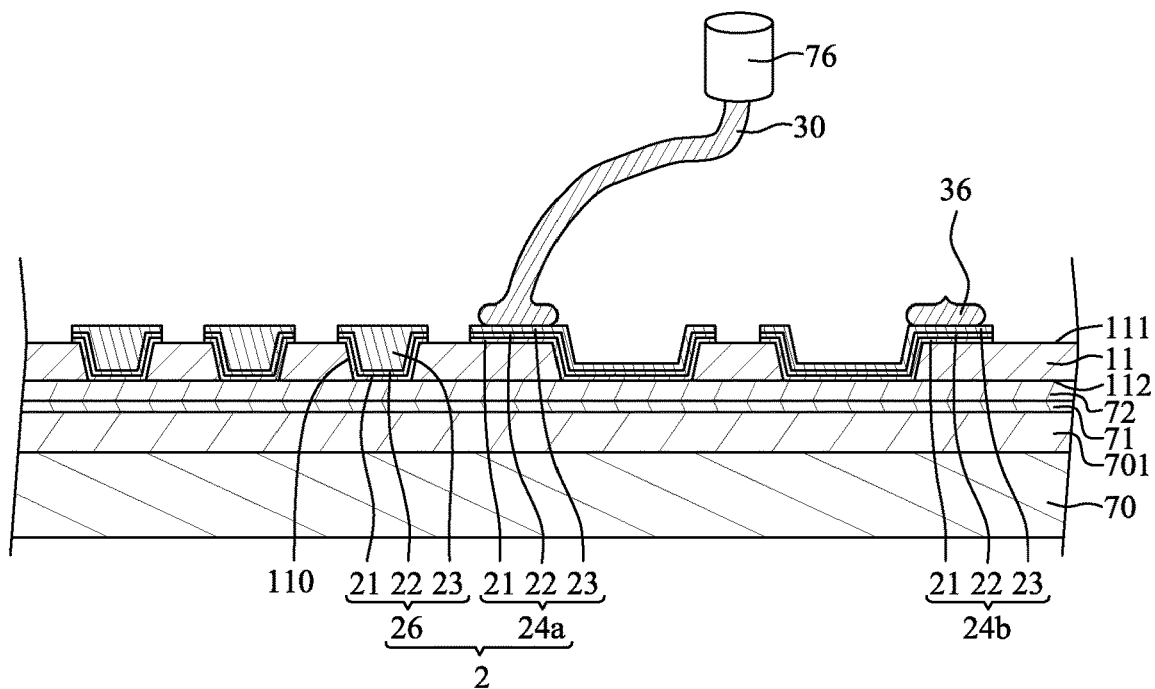
FIG. 27 illustrates one or more stages of an example of a method for manufacturing a package device according to some embodiments of the present disclosure.

Referring to FIG. 27, a stud portion 36 is disposed on and connected to the second bump pad 24b of the circuit layer 2. Then, a first bond portion (e.g., a ball bond) of a bonding wire 30 is formed on and connected to the first bump pad 24a of the circuit layer 2 by using a capillary 76.

Figure 28:
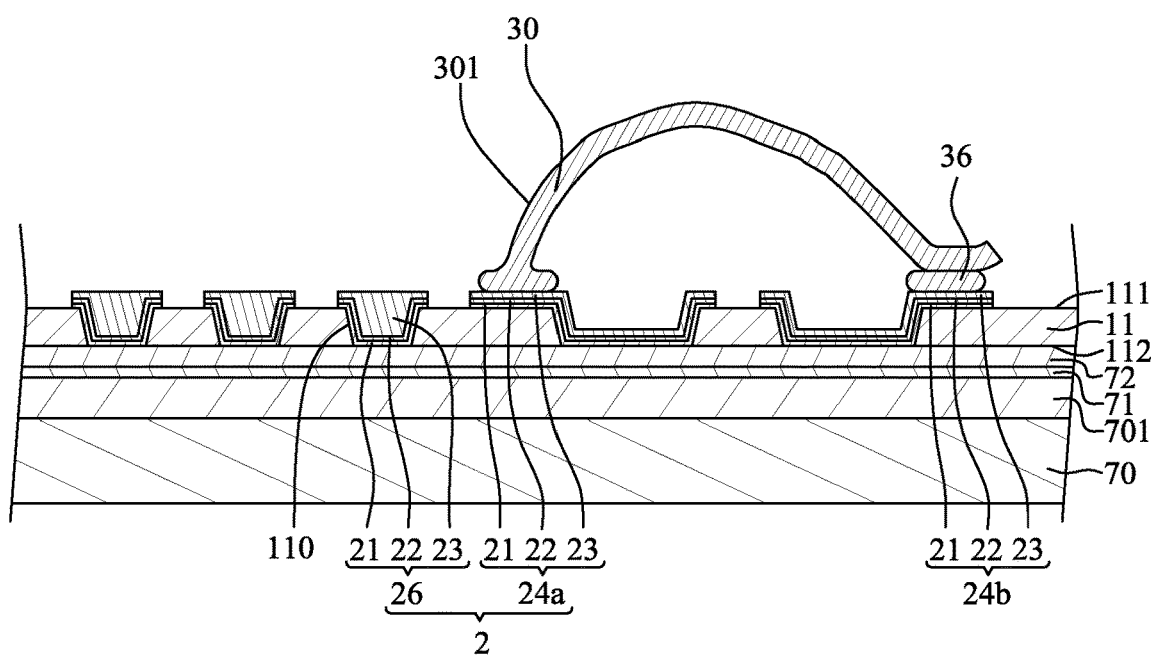
FIG. 28 illustrates one or more stages of an example of a method for manufacturing a package device according to some embodiments of the present disclosure.
Figure 32:
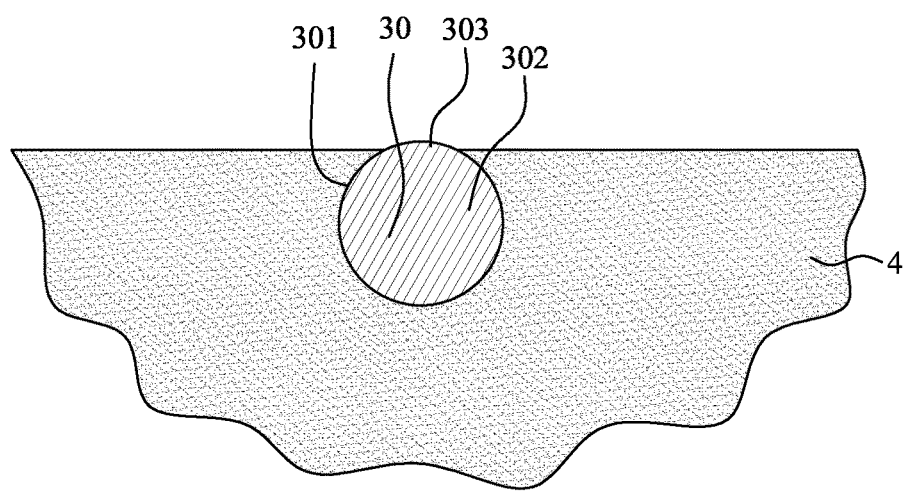
FIG. 32 illustrates a cross-sectional view taken along line 30B-30B shown in FIG. 31.

Referring to FIG. 28, the capillary 76 moves to the stud portion 36 on the second bump pad 24b, forming a second bond portion (e.g., a wedge portion or a tail portion) of the bonding wire 30. The bonding wire 30 connects the first bump pad 24a and the second bump pad 24b, and is substantially in a loop shape. The bonding wire 30 may include conductive metals, such as tin, aluminum, gold, silver or copper, or an alloy thereof, and the stud portion 36 may also include conductive metals, such as tin, aluminum, gold, silver or copper, or an alloy thereof. However, in other embodiments, the stud portion 36 may be omitted, and the bonding wire 30 may be directly connected to the second burn pad 24b. The bonding wire 30 has a first surface 301, which is substantially an annular surface (as can be seen in FIG. 32). Then, a plasma pretreatment is conducted for surface cleaning and activation of the dielectric layer 11.

Figure 29:
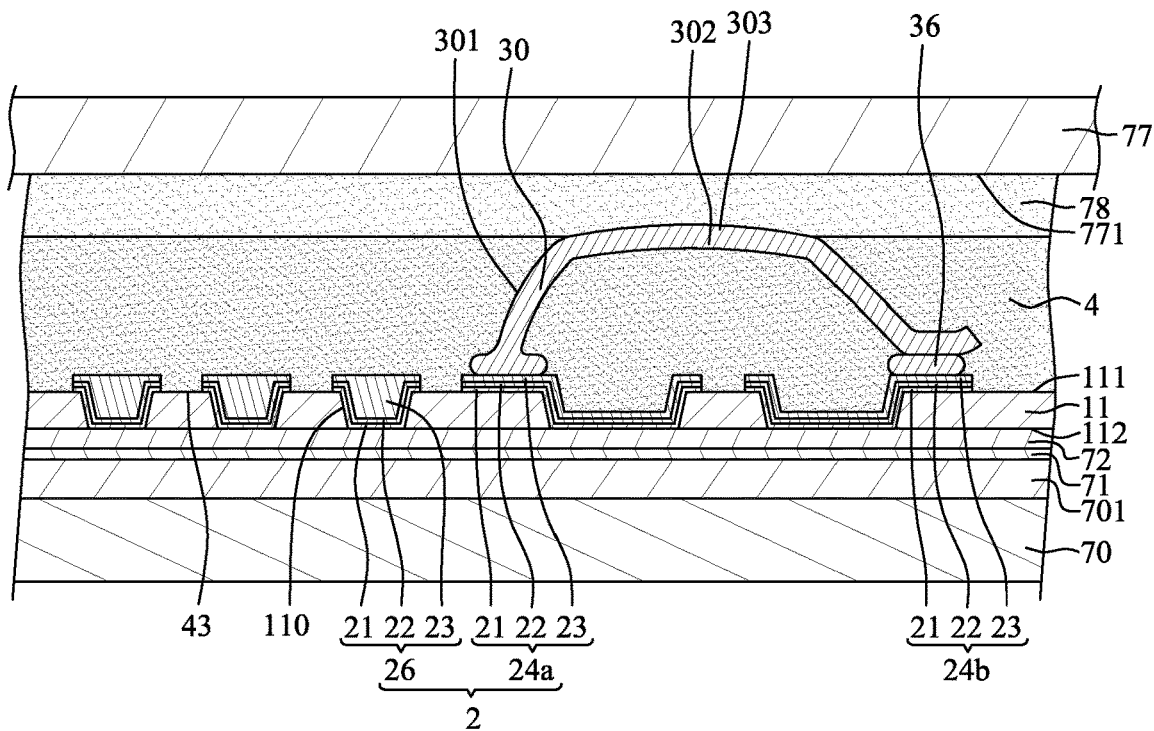
FIG. 29 illustrates one or more stages of an example of a method for manufacturing a package device according to some embodiments of the present disclosure.

Referring to FIG. 29, the carrier 70 and the elements disposed thereon are disposed in a cavity of a mold 77. The bonding wire 30 is pressed such that a connecting segment 302 of the bonding wire 30 may be substantially straight and substantially parallel to a surface 771 of the mold 77. For example, a film 78 is disposed on the surface 771 of the mold 77. The film 78 may include an elastic polymer. The bonding wire 30 is pressed by the film 78 on the surface 771 of the mold, such that a portion 303 of the connecting segment 302 protrudes into the film 78. However, in other embodiments, the film 78 may be omitted, and the bonding wire may be directly pressed by the mold 77. Then, an encapsulant material is provided in a cavity of the mold 77, and is then cured to form an encapsulant 4. The encapsulant 4 may be a molding compound, and is disposed on the upper surface 111 of the dielectric layer 11 and covers the circuit layer 2. In some embodiments, a material of the encapsulant 4 may be the same as or similar to that of the dielectric layer 11. The encapsulant 4 has a lower surface 43 disposed on the upper surface 111 of the dielectric layer 11. The encapsulant 4 encapsulates the bonding wire 30, and exposes the portion 303 of the connecting segment 302.

Figure 30:
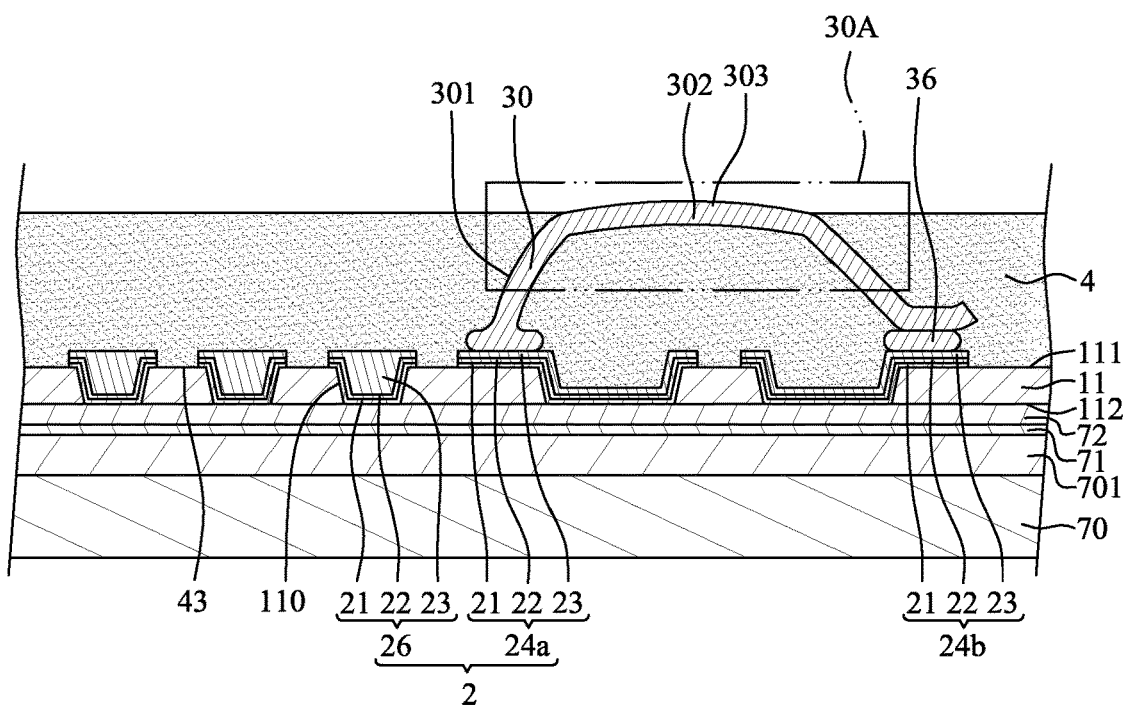
FIG. 30 illustrates one or more stages of an example of a method for manufacturing a package device according to some embodiments of the present disclosure.
Figure 31:
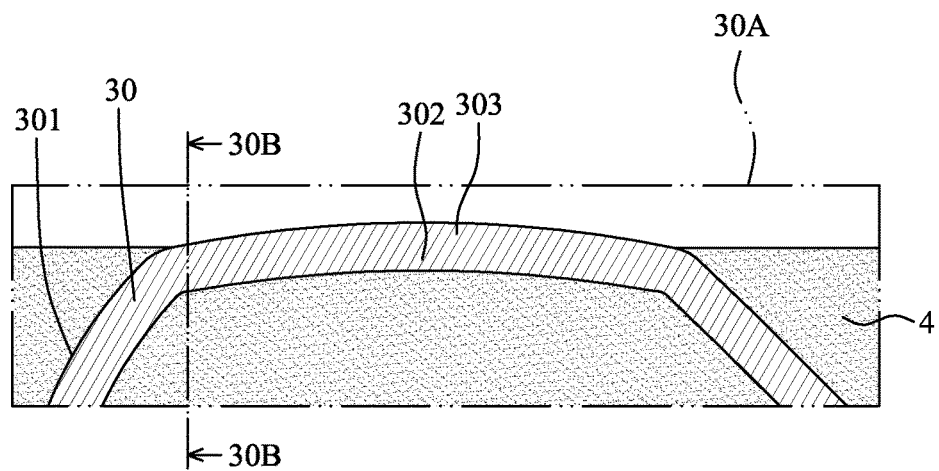
FIG. 31 illustrates an enlarged view of an area 30A shown in FIG. 30.

Referring to FIG. 30, the mold 77 and the film 78 are then removed. FIG. 31 illustrates an enlarged view of an area 30A shown in FIG. 30. FIG. 32 illustrates a cross-sectional view taken along line 30B-30B shown in FIG. 31. As can be seen in FIGS. 30 to 32, the portion 303 of the connecting segment 302 of the bonding wire 30 is exposed from the encapsulant 4.

Figure 33:
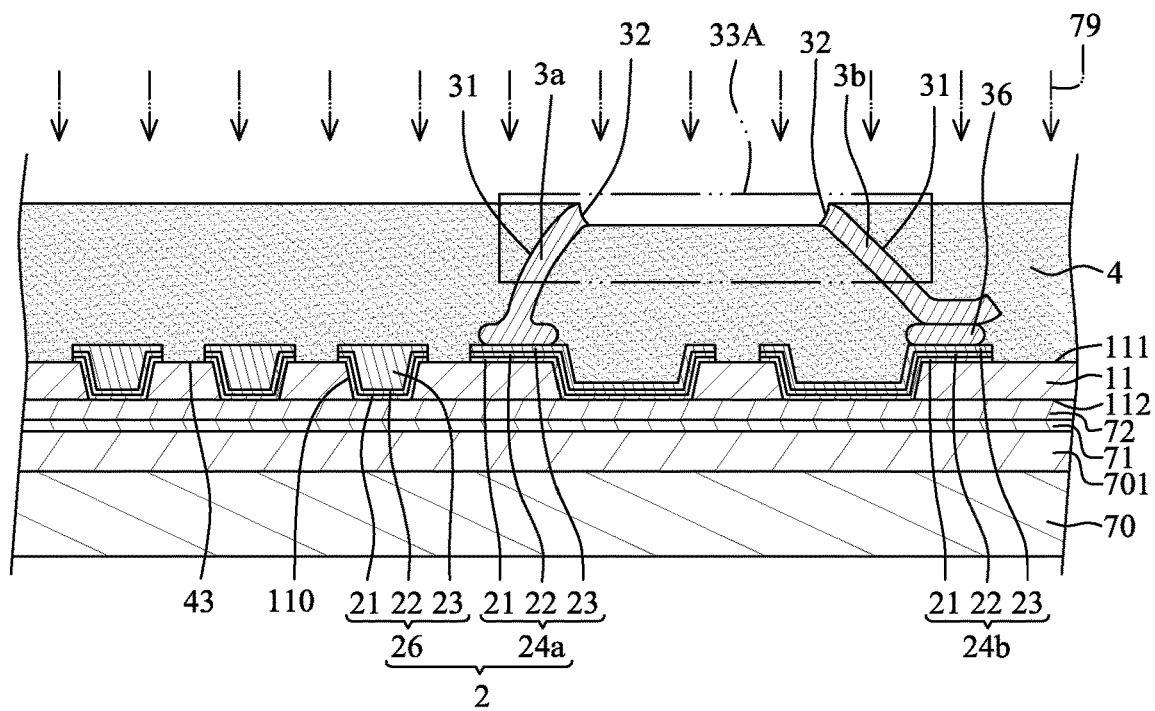
FIG. 33 illustrates one or more stages of an example of a method for manufacturing a package device according to some embodiments of the present disclosure.
Figure 34:
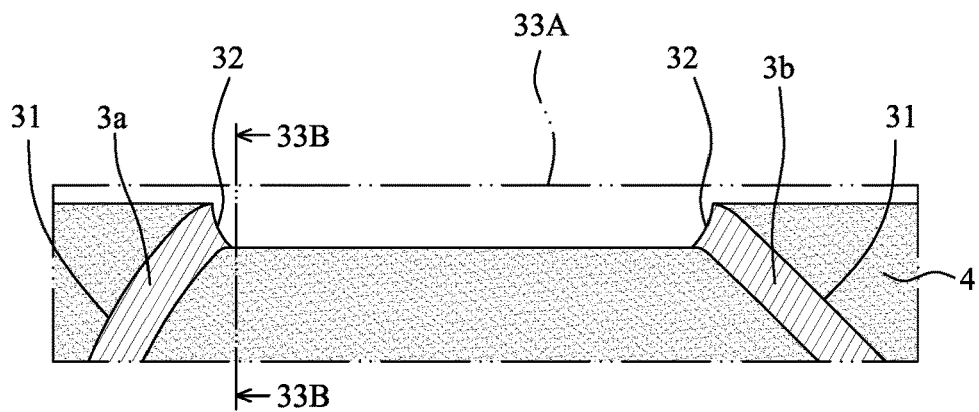
FIG. 34 illustrates an enlarged view of an area 33A shown in FIG. 33.
Figure 35:
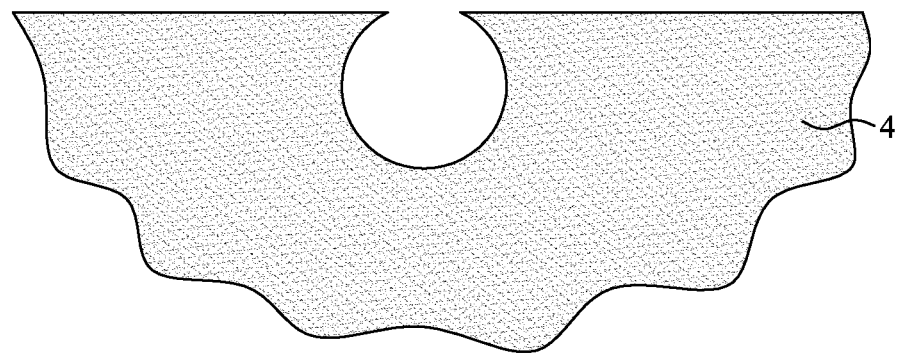
FIG. 35 illustrates a cross-sectional view taken along line 33B-33B shown in FIG. 34.

Referring to FIG. 33, the connecting segment 302 of the bonding wire 30 is removed by, for example, etching. The bonding wire 30 is thus separated into two conductive segments, e.g., a first conductive segment 3a on the first bump pad 24a and a second conductive segment 3b on the second bump pad 24b. Accordingly, a second surface 32 of the first conductive segment 3a and a second surface 32 of the second conductive segment 3b are formed. FIG. 34 illustrates an enlarged view of an area 33A shown in FIG. 33. FIG. 35 illustrates a cross-sectional view taken along line 33B-33B shown in FIG. 34. Referring to FIGS. 33 to 35, the first conductive segment 3a (and the second conductive segment 3b, similarly) has a first surface 31 and the second surface 32. For example, a portion of the first surface 301 of the bonding wire 30 forms the first surface 31 of the first conductive segment 3a, and another portion of the first surface 301 of the bonding wire 30 forms the first surface 31 of the second conductive segment 3b. The first surface 31 and the second surface 32 intersect with each other. For example, the second surface 32 is a concave surface and is exposed from the encapsulant 4. The first surface 31 is substantially an annular surface and extends from a periphery of the second surface 32. Since the first surface 31 of the first conductive segment 3a is formed by, for example, plating, and the second surface 32 of the first conductive segment 3b is formed by, for example, etching, an average roughness of the first surface 31 is different from an average roughness of the second surface 32. In some embodiments, the average roughness of the first surface 31 of the first conductive segment 3a is less than the average roughness of the second surface 32 of the first conductive segment 3a. For example, the average roughness of the second surface 32 may be at least about 1.5 times, about 2 times, at least about 3 times, or at least about 5 times the average roughness of the first surface 31. For example, the average roughness of the first surface 31 may be smaller than about 20 nm, and the average roughness of the second surface 32 may be greater than about 40 nm. Then, a portion of the encapsulant 4 is removed by, for example, a plasma treatment using a plasma source 79.

Figure 36:
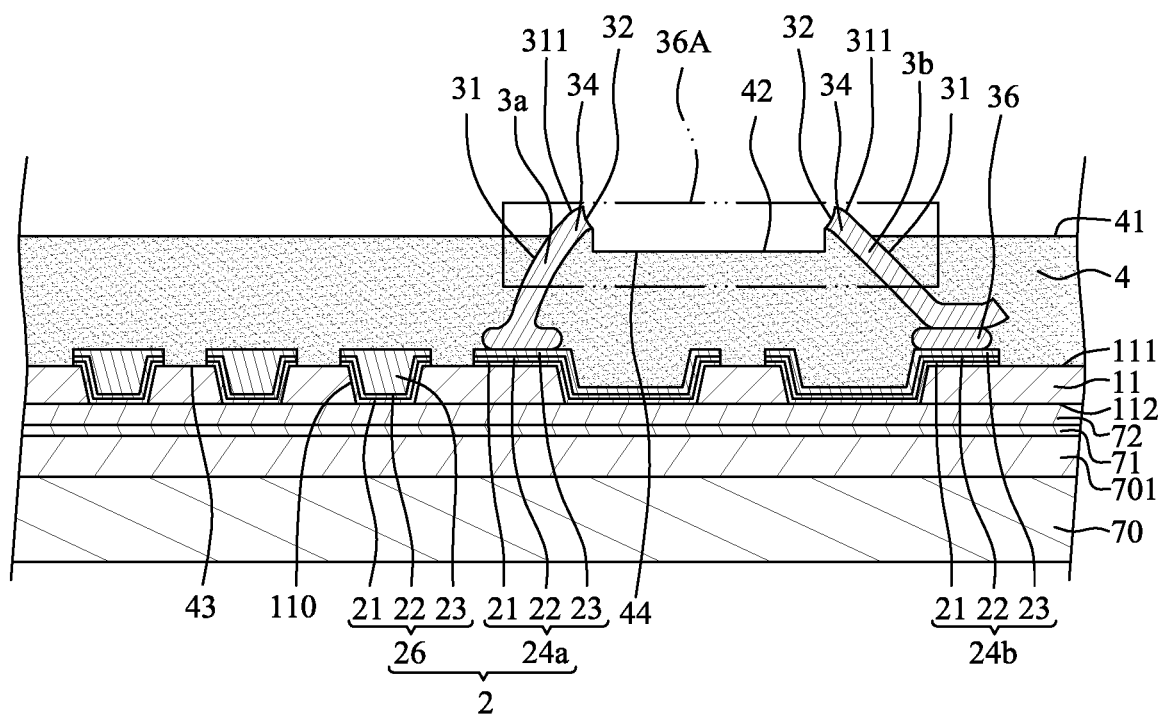
FIG. 36 illustrates one or more stages of an example of a method for manufacturing a package device according to some embodiments of the present disclosure.
Figure 37:
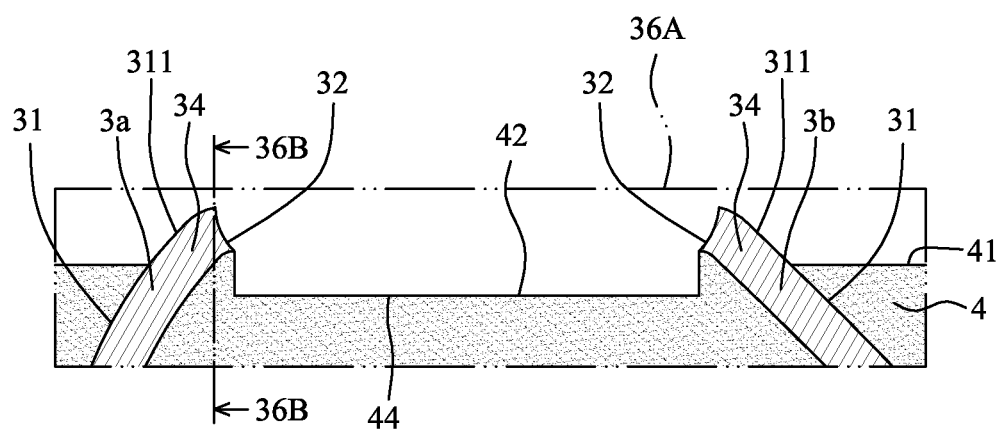
FIG. 37 illustrates an enlarged view of an area 36A shown in FIG. 36.
Figure 38:
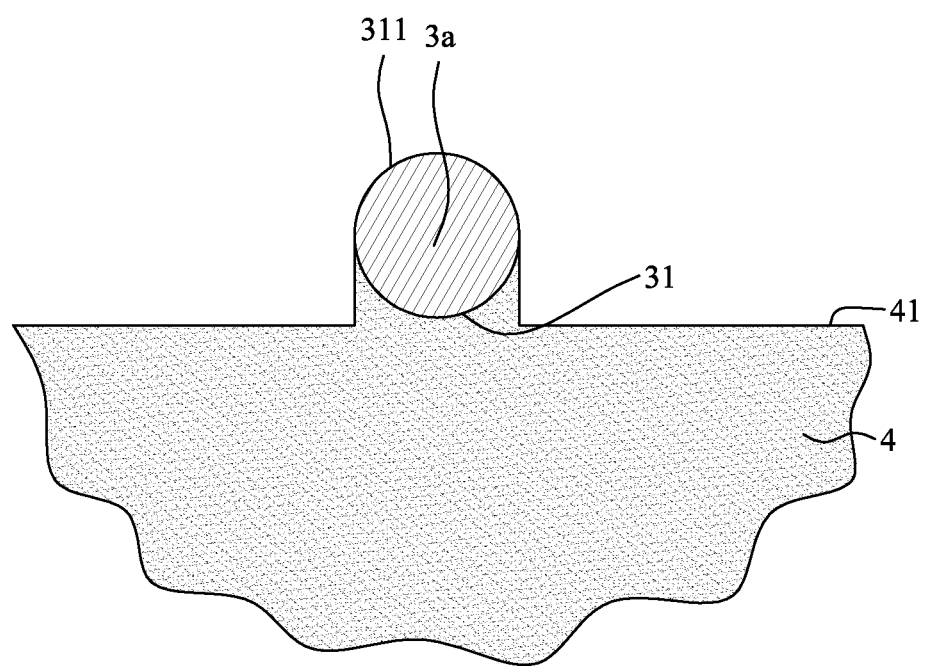
FIG. 38 illustrates a cross-sectional view taken along line 36B-36B shown in FIG. 37.

Referring to FIG. 36, after the plasma treatment, the portion of the encapsulant 4 is removed. A first upper surface 41 of the encapsulant 4 and a second upper surface 42 of the encapsulant 4 (e.g. corresponding to the removed portion of the encapsulant 4) are formed, and a first portion 311 of the first surface 31 of the first conductive segment 3a and a first portion 311 of the first surface 31 of the second conductive segment 3b are exposed from the encapsulant 4. The first upper surface 41 and the second upper surface 42 of the encapsulant 4 are not coplanar. For example, the first upper surface 41 is disposed above the second upper surface 42. In some embodiments, the first upper surface 41 is substantially flat, and the second upper surface 42 is substantially in an annular or disk shape. The second upper surface 42 intersects with the first upper surface 41 at two sides, and is recessed from the first upper surface 41 to define a cavity 44. The cavity 44 is located between the first conductive segment 3a and the second conductive segment 3b. FIG. 37 illustrates an enlarged view of an area 36A shown in FIG. 36. FIG. 38 illustrates a cross-sectional view taken along line 36B-36B shown in FIG. 37. Referring to FIGS. 36 to 38, the first portion 311 of the first surface 31 is exposed from the encapsulant 4 and is disposed above the first surface 41 of the encapsulant 4. The second surface 32 is exposed from the encapsulant 4, and at least a portion of the second surface 32 is disposed above the first upper surface 41 of the encapsulant 4. In some embodiments, as shown in FIGS. 36 and 37, the second surface 32 (e.g. the entire second surface 32) is disposed above the first upper surface 41 of the encapsulant 4. The second upper surface 42 of the encapsulant 4 is disposed below the second surface 32 of the first conductive segment 3a. As shown in FIGS. 36 and 37, a portion 34 of the first conductive segment 3a is exposed from the encapsulant 4. The first portion 311 of the first surface 31 and the second surface 32 are surfaces of the exposed portion 34 of the first conductive segment 3a. The second conductive segment 3b also has a first surface 31, and a second surface 32, and includes an exposed portion 34. The first surface 31, the second surface 32 and the exposed portion 34 of the second conductive segment 3b are similar to those of the first conductive segment 3a, and thus are not described redundantly.

Figure 39:
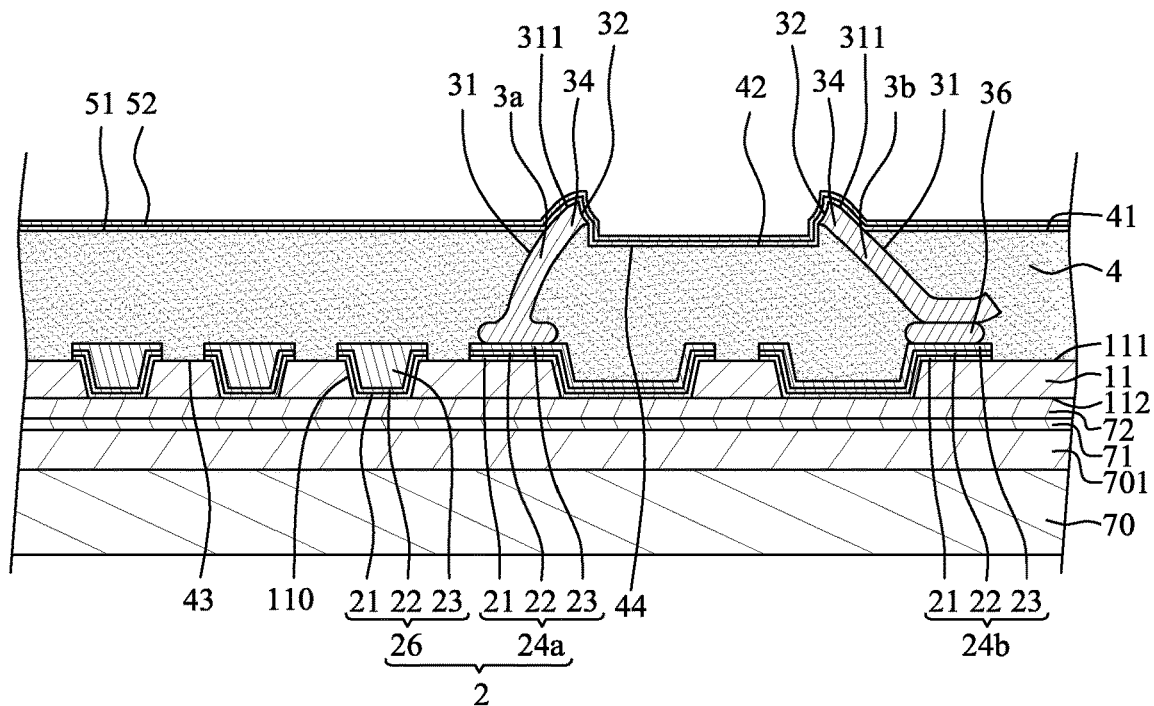
FIG. 39 illustrates one or more stages of an example of a method for manufacturing a package device according to some embodiments of the present disclosure.

Referring to FIG. 39, a fourth metal layer 51 and a fifth metal layer 52 are disposed on the encapsulant 4 and on the exposed portion 34 of each of the first conductive segment 3a and the second conductive segment 3b. The fourth metal layer 51 and the fifth metal layer 52 may be seed layers and include titanium, copper, nickel, tungsten, and/or platinum, or an alloy thereof, and may be formed by sputtering.

Figure 40:
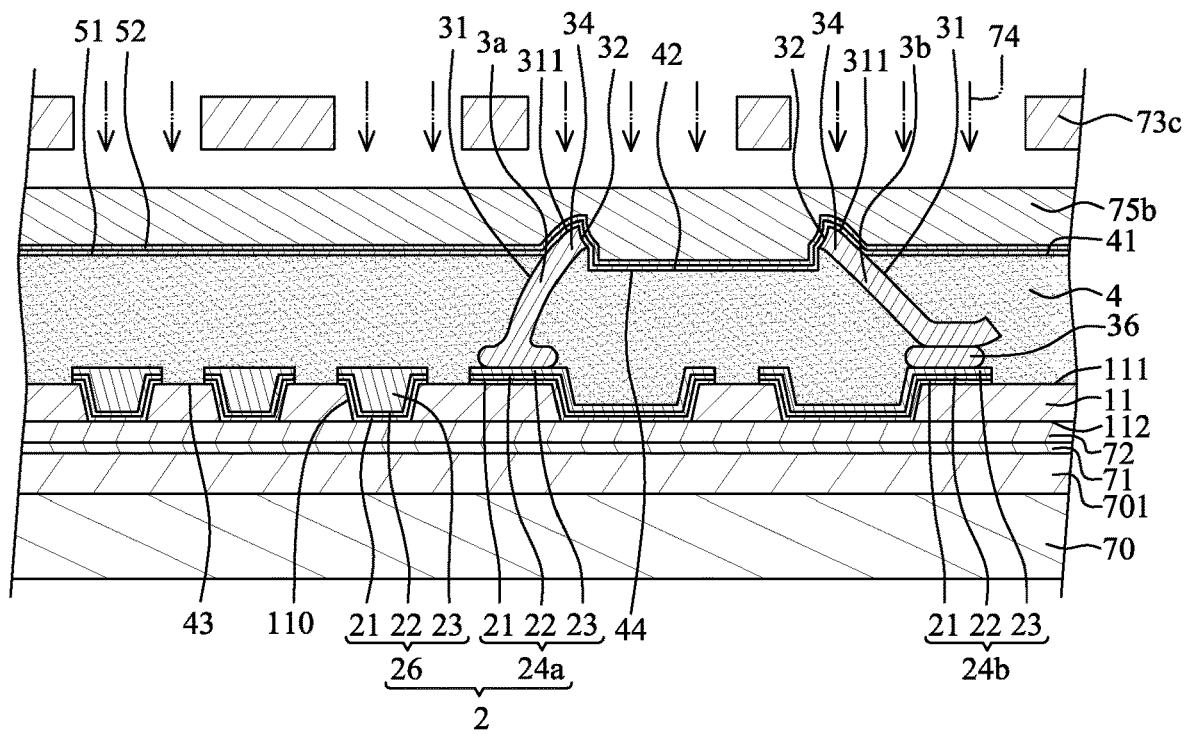
FIG. 40 illustrates one or more stages of an example of a method for manufacturing a package device according to some embodiments of the present disclosure.

Referring to FIG. 40, a second photoresist layer 75b is disposed on the fifth metal layer 52. Then, the second photoresist layer 75b is exposed to a pattern of intense light. For example, a first mask 73c is disposed adjacent to the second photoresist layer 75b, so as to cover a portion of the second photoresist layer 75b. Then, the second photoresist layer 75b is exposed to the radiation source 74 or another radiation source.

Figure 41:
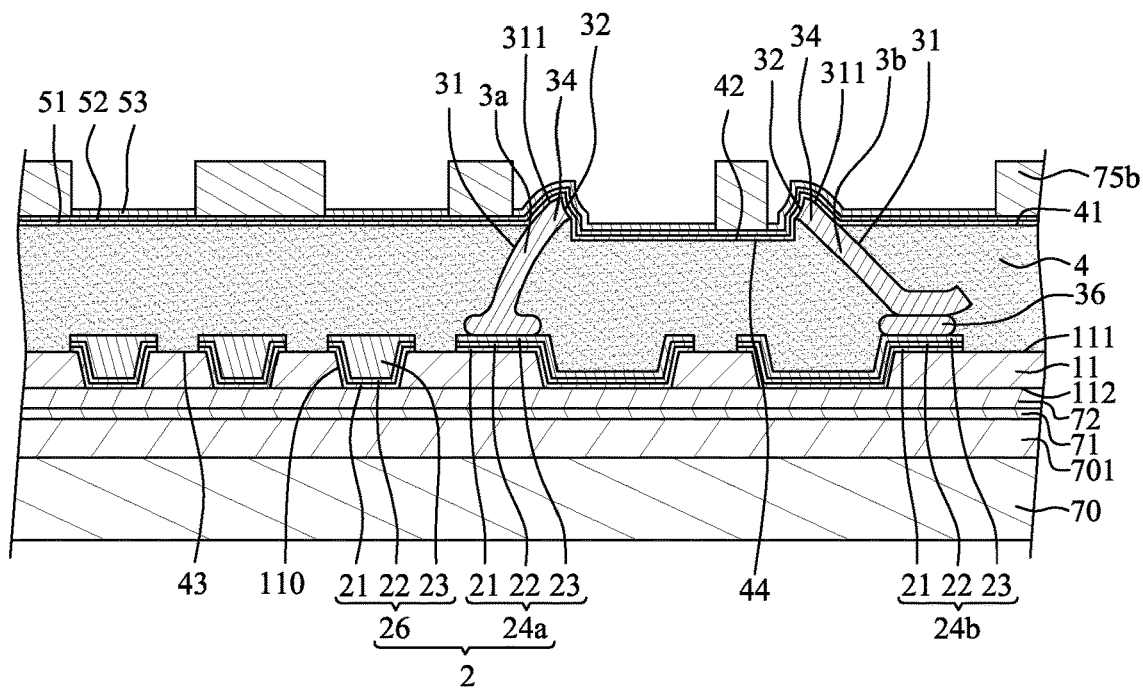
FIG. 41 illustrates one or more stages of an example of a method for manufacturing a package device according to some embodiments of the present disclosure.

Referring to FIG. 41, the second photoresist layer 75b is then developed by a developer. The second photoresist layer 75b is patterned to expose portions of the fifth metal layer 52. Then, a sixth metal layer 53 is formed in the second photoresist layer 75b and on the fifth metal layer 52. The sixth metal layer 53 may include copper, tin, gold, silver, nickel, and/or palladium, or an alloy thereof, and may be formed by electroplating, electroless plating or printing.

Figure 42:
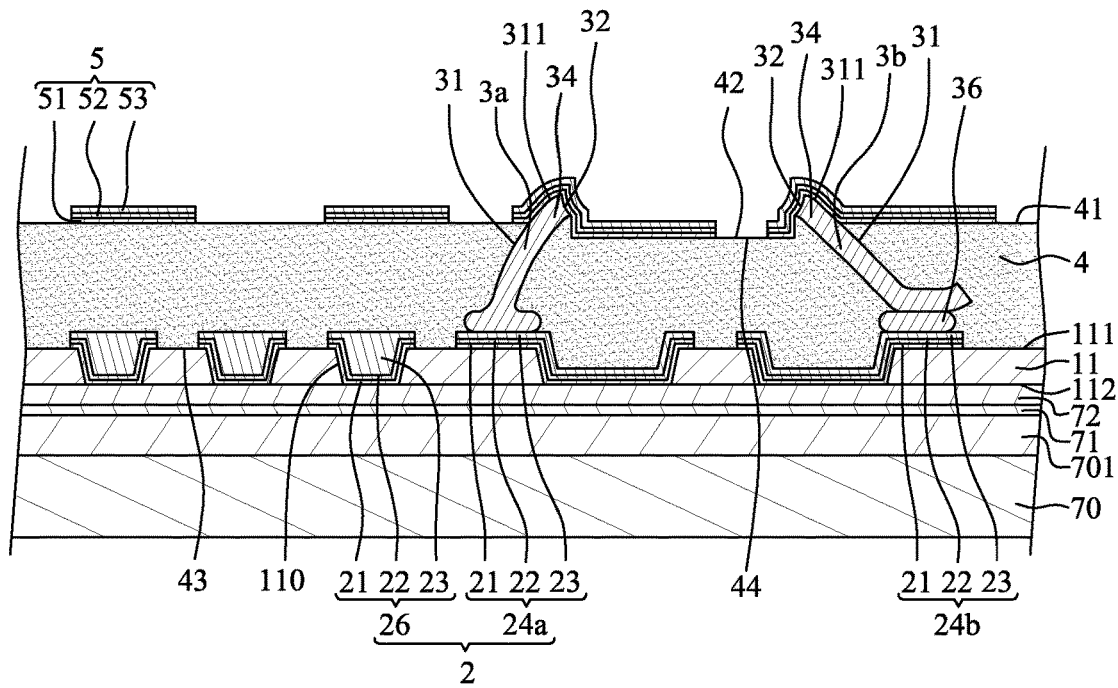
FIG. 42 illustrates one or more stages of an example of a method for manufacturing a package device according to some embodiments of the present disclosure.

Referring to FIG. 42, the second photoresist layer 75b is removed by, for example, stripping. Then, portions of the fourth metal layer 51 and the fifth metal layer 52 which are not covered by the sixth metal layer 53 are removed by, for example, etching. Hence, an RDL 5 is formed on the exposed portion 311 of the first surface 31 and the second surface 32 of each of the first conductive segment 3a and the second conductive segment 3b, and includes the fourth metal layer 51, the fifth metal layer 52 and the sixth metal layer 53. As shown in FIG. 42, the RDL 5 is disposed on both the first upper surface 41 and the second upper surface 42 of the encapsulant 4, and in the cavity 44 of the encapsulant 4. The RDL 5 covers the exposed portion 34 of the first conductive segment 3a and the exposed portion 34 of the second conductive segment 3b. The RDL 5 is disposed on and conformal to the first portion 311 of the first surface 31 of the first conductive segment 3a, and the second surface 32 of the first conductive segment 3a. Similarly, the RDL 5 may also be disposed on and conformal to the first portion 311 of the first surface 31 of the second conductive segment 3b, and the second surface 32 of the second conductive segment 3b. In some embodiments, both the first conductive segment 3a and the second conductive segment 3b connect the circuit layer 2 and the RDL 5.

Figure 43:
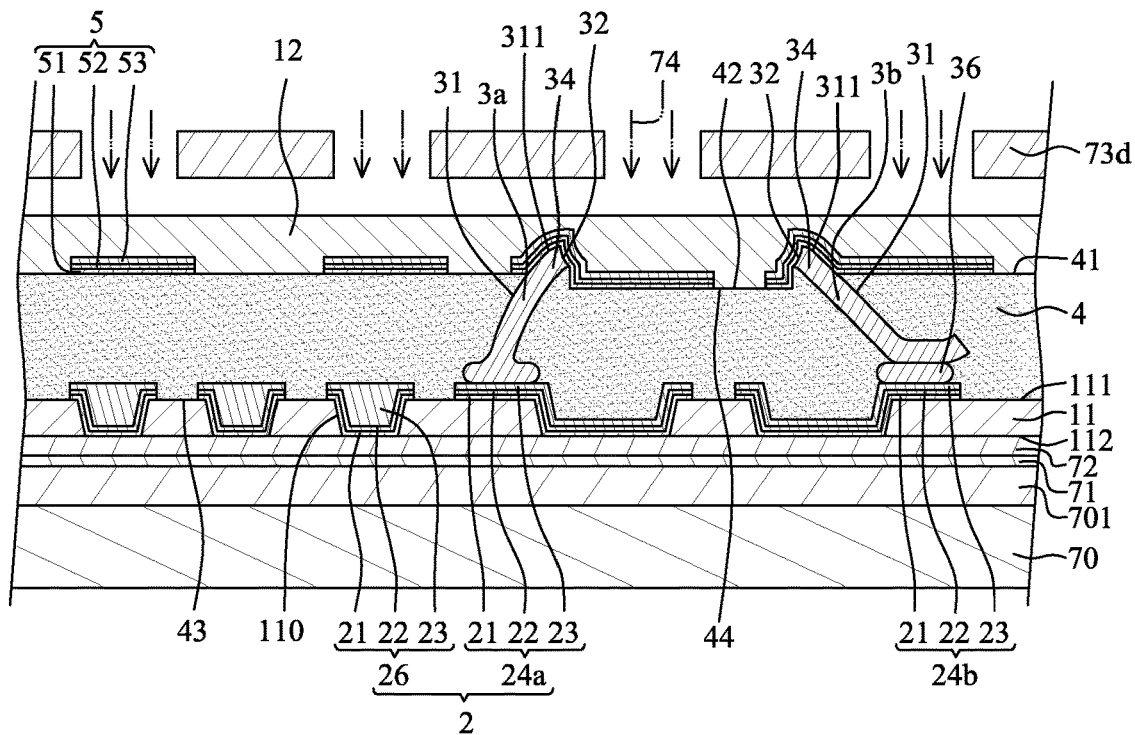
FIG. 43 illustrates one or more stages of an example of a method for manufacturing a package device according to some embodiments of the present disclosure.

Referring to FIG. 43, a passivation layer 12 is disposed on the encapsulant 4 and covers the RDL 5. Then, the passivation layer 12 is exposed to a pattern of intense light. For example, a second mask 73d is disposed adjacent to the passivation layer 12, so as to cover a portion of the passivation layer 12. Then, the passivation layer 12 is exposed to the radiation source 74 or another radiation source. A material of the passivation layer 12 may be the same as that of the dielectric layer 11.

Figure 44:
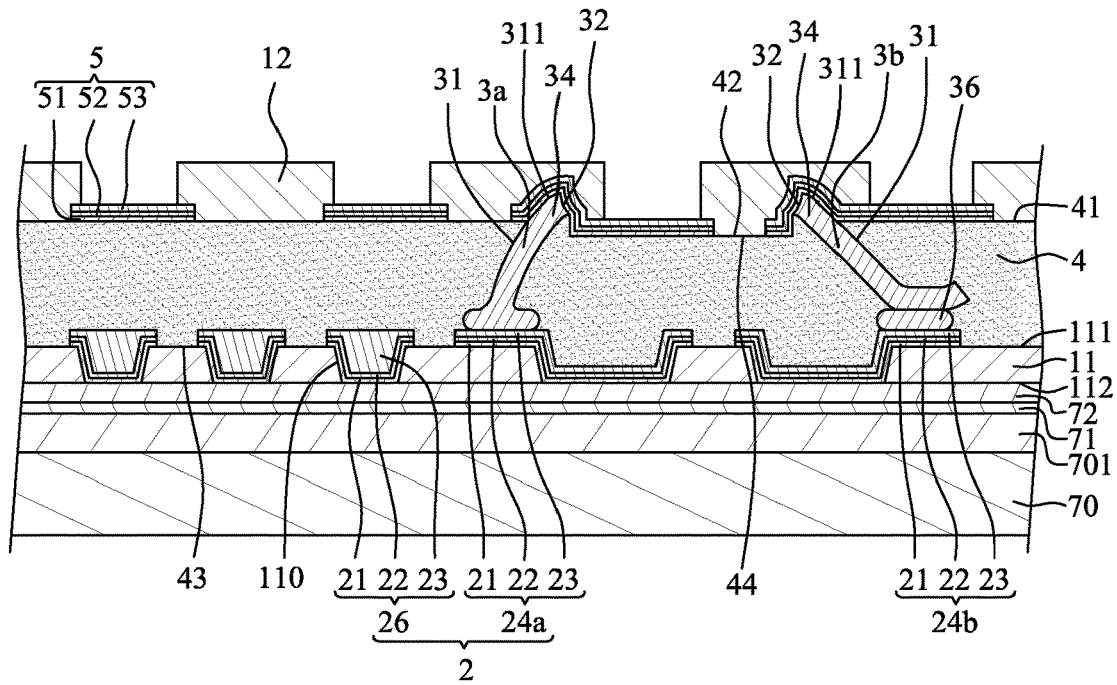
FIG. 44 illustrates one or more stages of an example of a method for manufacturing a package device according to some embodiments of the present disclosure.

Referring to FIG. 44, the passivation layer 12 is then developed by a developer, so as to expose at least a portion of the RDL 5 for external connection. The passivation layer 12 is disposed on the first upper surface 41 of the encapsulant 4, the RDL 5 and the second upper surface 42 of the encapsulant 4. The passivation extends into the cavity 44 of the encapsulant 4.

Figure 45:
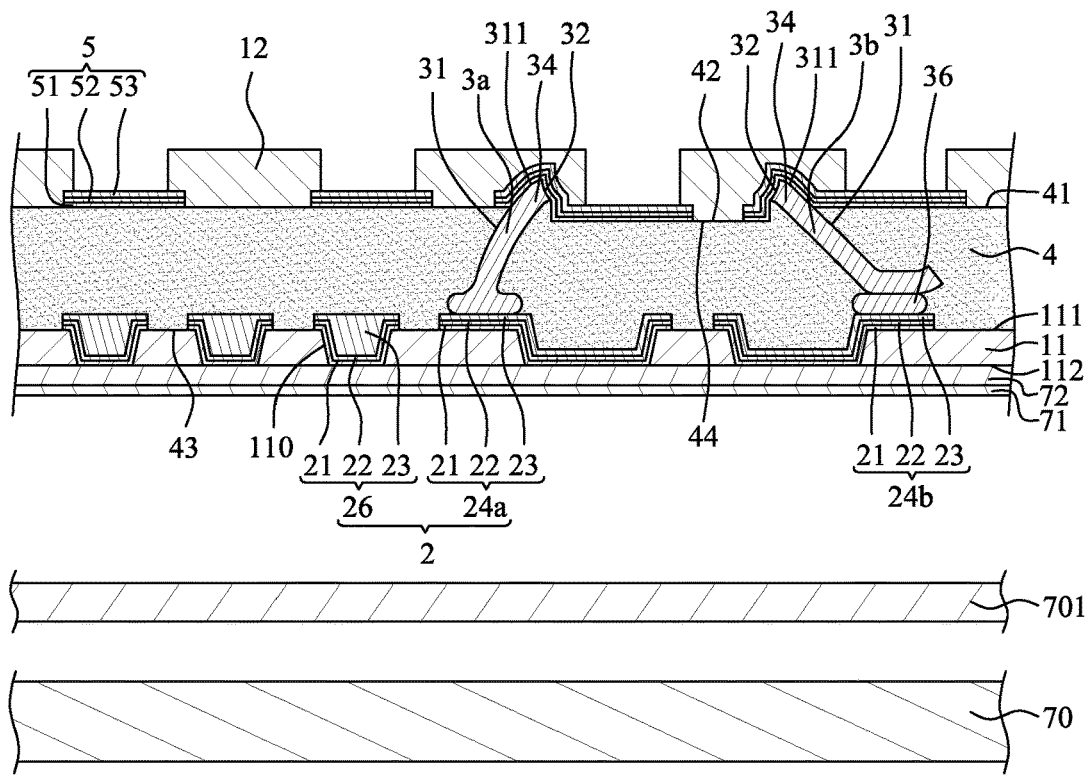
FIG. 45 illustrates one or more stages of an example of a method for manufacturing a package device according to some embodiments of the present disclosure.

Referring to FIG. 45, the carrier 70 and the thermal release material 701 are removed.

Figure 46:
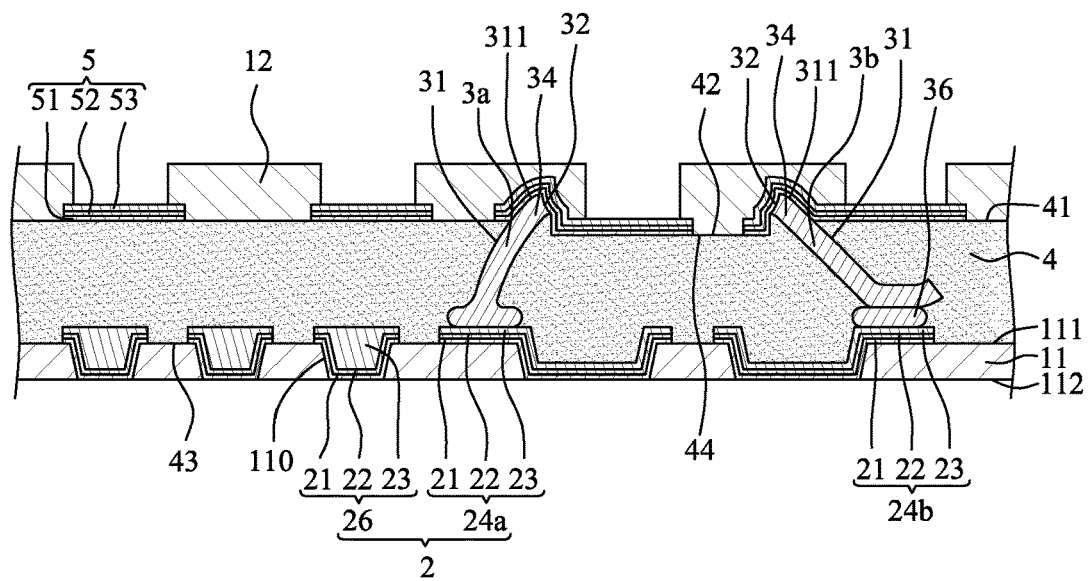
FIG. 46 illustrates one or more stages of an example of a method for manufacturing a package device according to some embodiments of the present disclosure.

Referring to FIG. 46, the first seed layer 71 and the second seed layer 72 are removed by, for example, etching.

Figure 47:
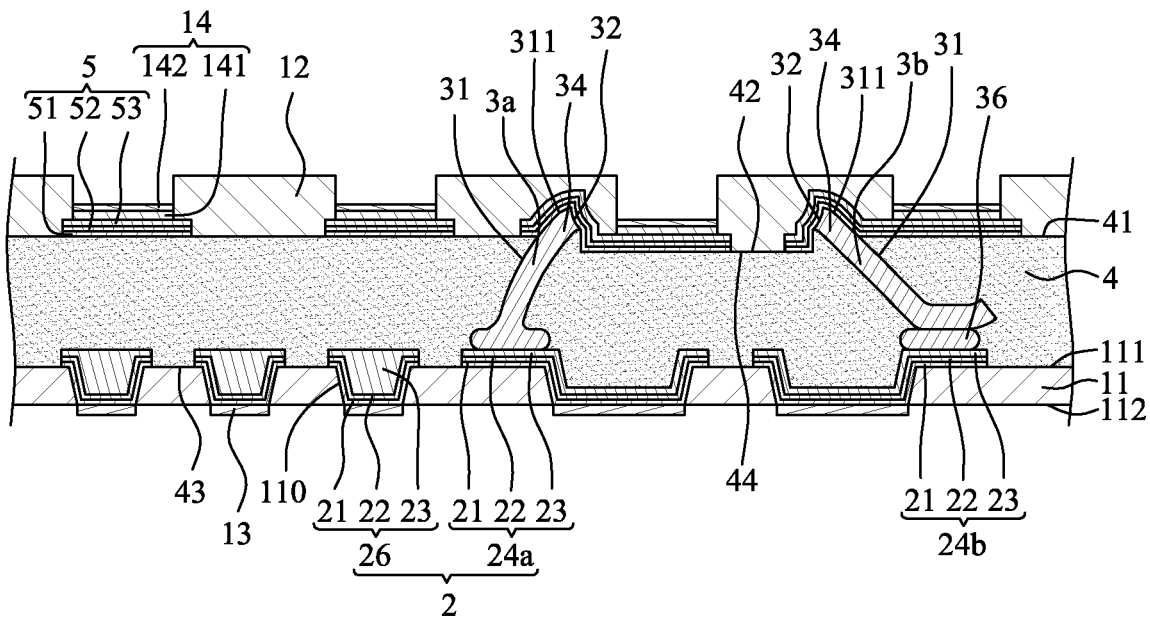
FIG. 47 illustrates one or more stages of an example of a method for manufacturing a package device according to some embodiments of the present disclosure.

Referring to FIG. 47, at least one first UBM 13 may be formed on a side of the conductive via 26 adjacent to the lower surface 112 of the dielectric layer 11. The first UBM 13 may include palladium and/or gold. At least one second UBM 14 may be formed on the exposed portion of the RDL 5. In some embodiments, the second UBM 14 includes a first layer 141 and a second layer 142. The first layer 141 includes nickel, and the second layer 142 includes palladium and/or gold. Then, a singulation process is conducted, thus forming the package device 1 as shown in FIGS. 1 to 3.

Figure 48:
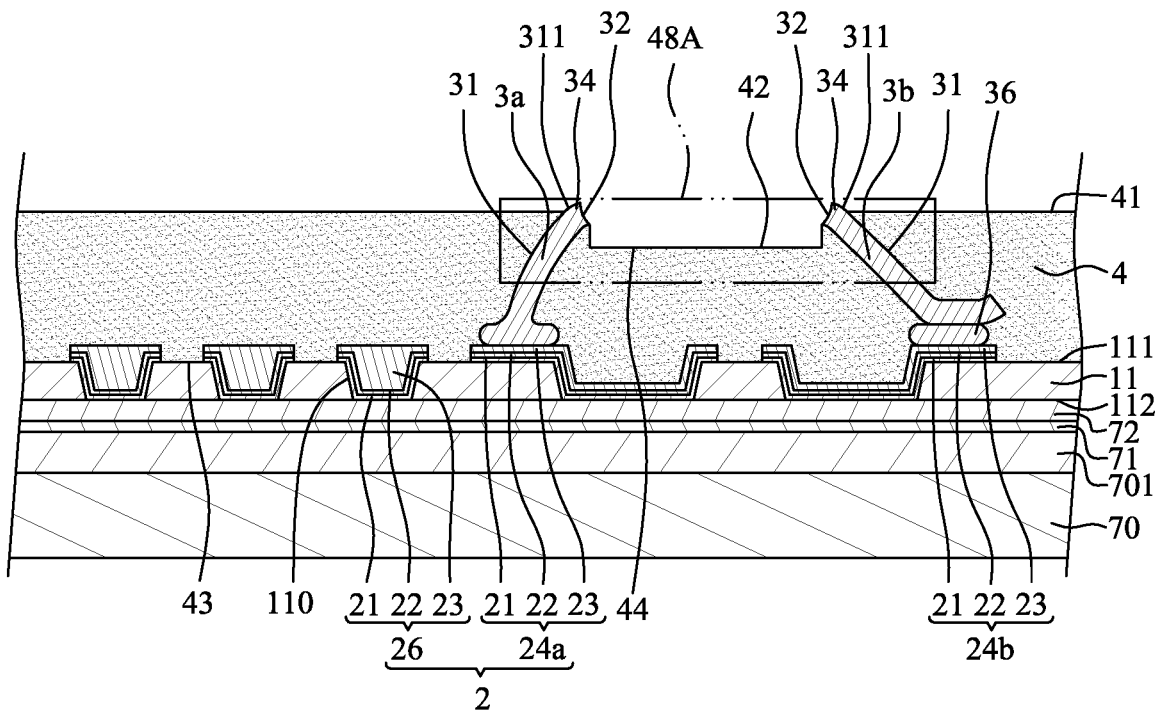
FIG. 48 illustrates one or more stages of an example of a method for manufacturing a package device according to some embodiments of the present disclosure.
Figure 49:
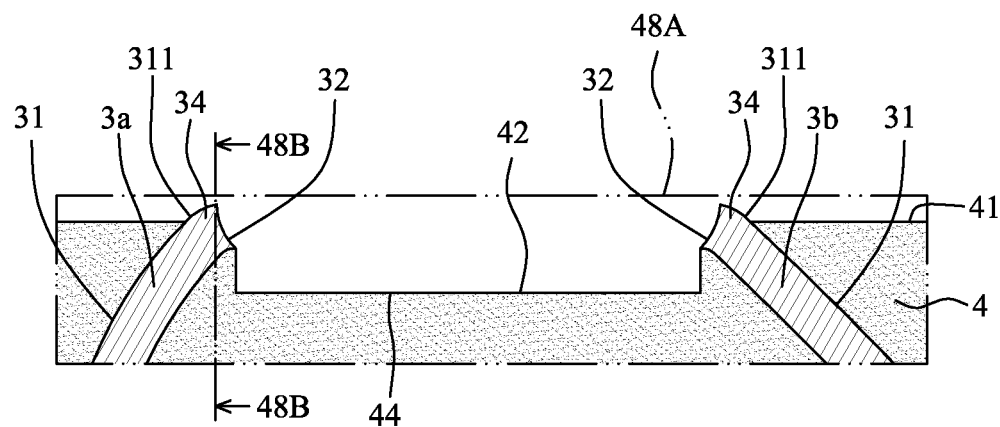
FIG. 49 illustrates an enlarged view of an area 48A shown in FIG. 48.
Figure 50:
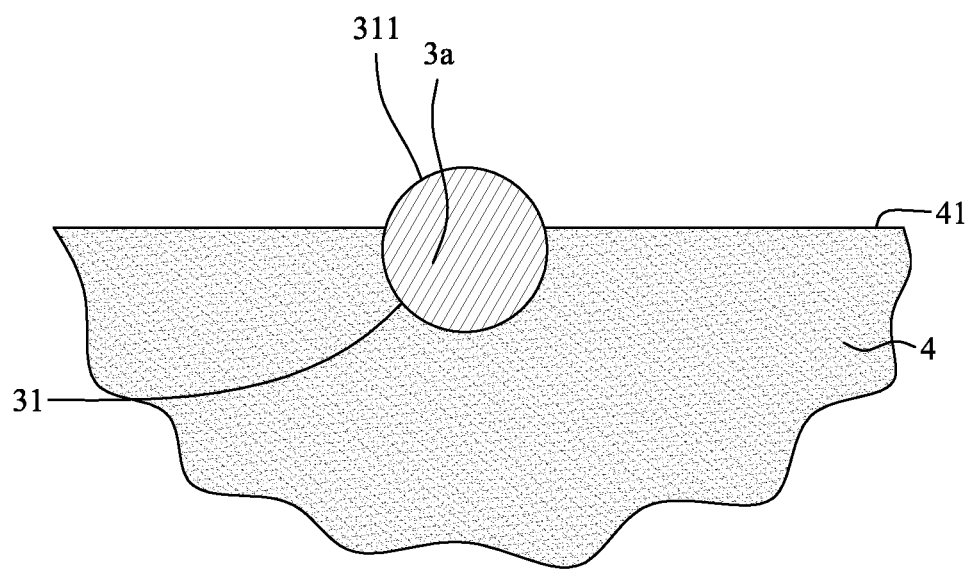
FIG. 50 illustrates a cross-sectional view taken along line 48B-48B shown in FIG. 49.

FIG. 48 through FIG. 50 illustrate a method for manufacturing a package device according to some embodiments of the present disclosure. In some embodiments, the method is for manufacturing a package device such as the package device 1a shown in FIGS. 4 to 6. The initial stages of the illustrated process are the same as, or similar to, the stages illustrated in FIG. 21 through FIG. 35. FIG. 48 depicts a stage subsequent to that depicted in FIG. 35. FIG. 49 illustrates an enlarged view of an area 48A shown in FIG. 48. FIG. 50 illustrates a cross-sectional view taken along line 48B-48B shown in FIG. 49.

Referring to FIGS. 48 to 50, after the portion of the encapsulant 4 is removed, a first upper surface 41 and a second upper surface 42 of the encapsulant 4 are formed, and a first portion 311 of the first surface 31 of the first conductive segment 3a and a first portion 311 of the first surface 31 of the second conductive segment 3b are exposed from the encapsulant 4. For example, the removed portion of the encapsulant 4 in the process illustrated in FIG. 48 is less than the removed portion of the encapsulant 4 in the process illustrated in FIG. 36, and thus a portion of the second surface 32 is disposed above the first upper surface 41 of the encapsulant 4. Another portion of the second surface 32 of the first conductive segment 3a is disposed below the first upper surface 41 of the encapsulant 4. Similarly, a portion of the second conductive segment 3b is disposed above the first upper surface 41 of the encapsulant 4, and another portion of the second conductive segment 3b is disposed below the first upper surface 41 of the encapsulant 4. The stages subsequent to that shown in FIGS. 48 to 50 of the illustrated process are similar to the stages illustrated in FIG. 39 through FIG. 47, thus forming the package device 1a shown in FIGS. 4 to 6.

Figure 51:
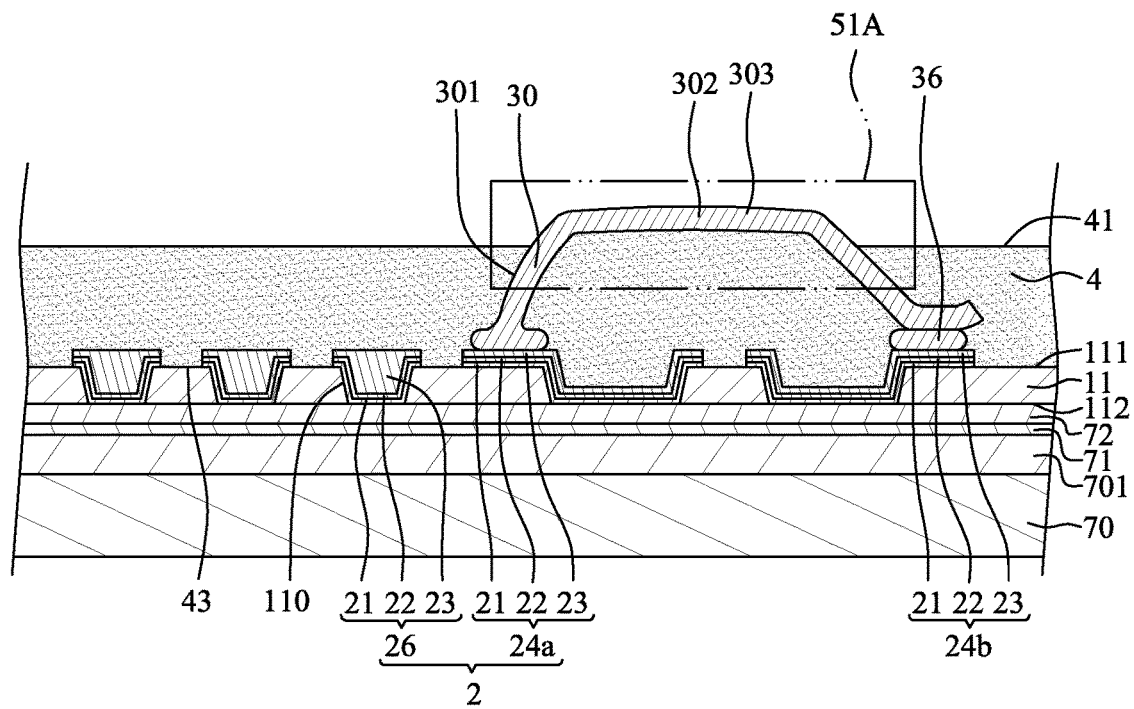
FIG. 51 illustrates one or more stages of an example of a method for manufacturing a package device according to some embodiments of the present disclosure.
Figure 52:
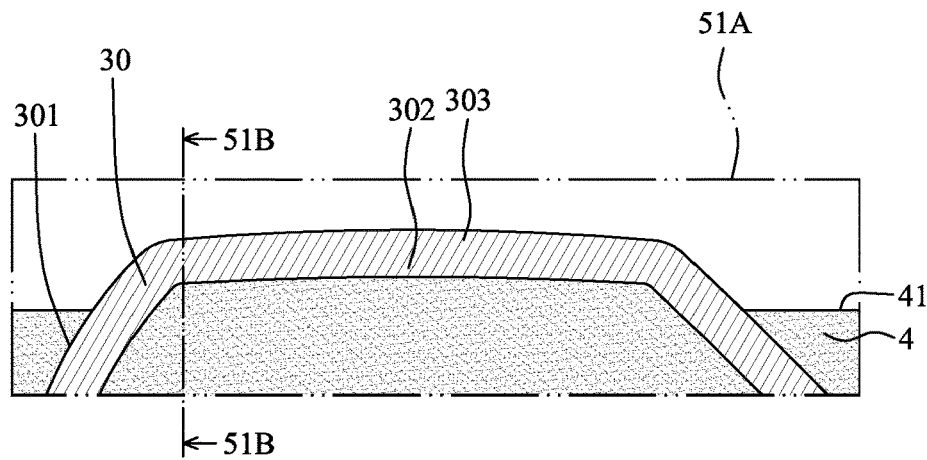
FIG. 52 illustrates an enlarged view of an area 51A shown in FIG. 51.
Figure 53:
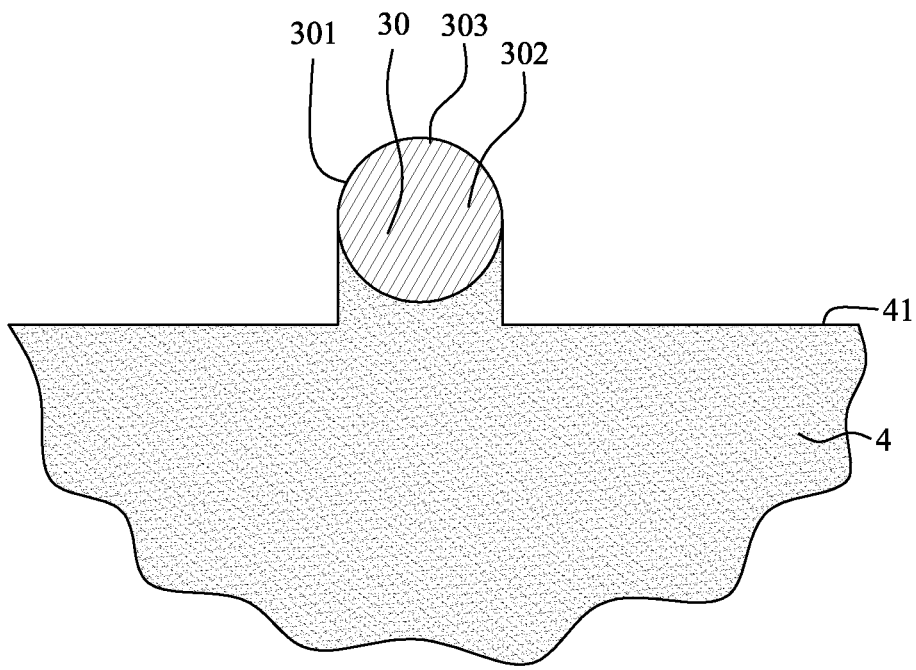
FIG. 53 illustrates a cross-sectional view taken along line 51B-15B shown in FIG. 52.

FIG. 51 through FIG. 56 illustrate a method for manufacturing a package device according to some embodiments of the present disclosure. In some embodiments, the method is for manufacturing a package device such as the package device 1b shown in FIGS. 7 to 9. The initial stages of the illustrated process are the same as, or similar to, the stages illustrated in FIG. 21 through FIG. 32. FIG. 51 depicts a stage subsequent to that depicted in FIGS. 30 to 32. FIG. 52 illustrates an enlarged view of an area 51A shown in FIG. 51. FIG. 53 illustrates a cross-sectional view taken along line 51B-51B shown in FIG. 52.

Referring to FIGS. 51 to 53, a portion of the encapsulant 4 is removed before the connecting segment 302 of the bonding wire 30 is removed, forming a first upper surface 41 of the encapsulant 4. The portion of the encapsulant 4 may be removed by, for example, plasma treatment. As shown in FIGS. 51 to 53, the first upper surface 41 of the encapsulant 4 is disposed below the connecting segment 302 of the bonding wire 30, and the connecting segment 302 is exposed from the encapsulant 4. The first upper surface 41 of the encapsulant 4 may be substantially flat.

Figure 54:
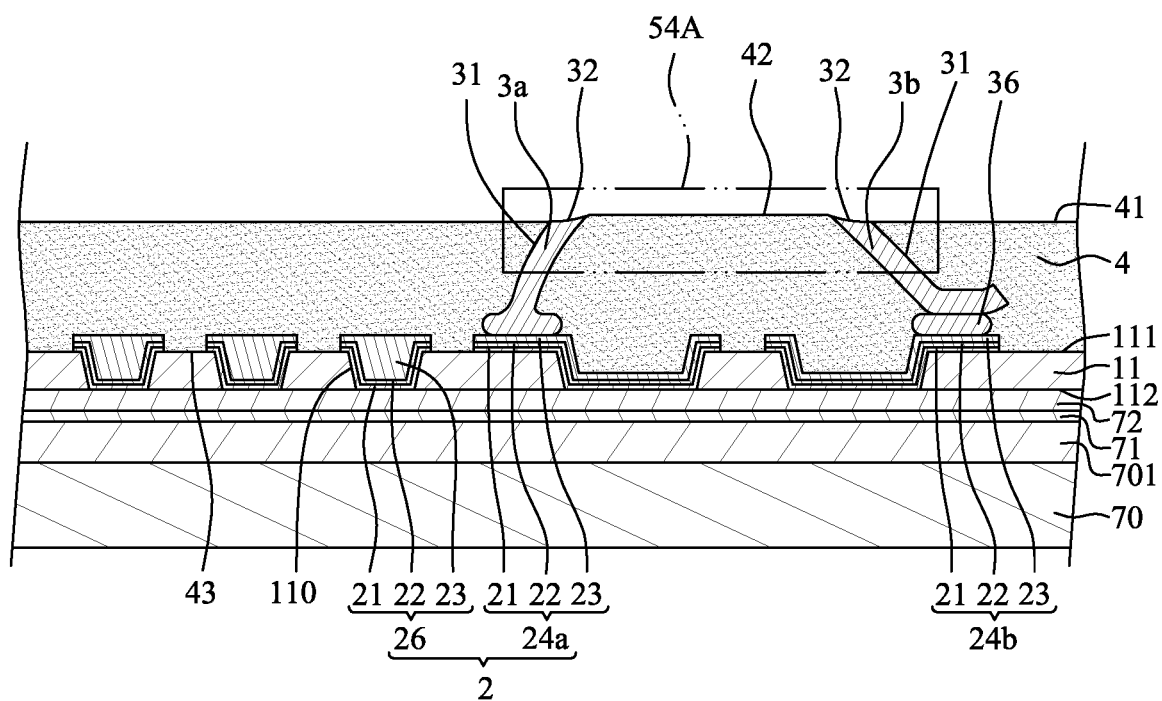
FIG. 54 illustrates one or more stages of an example of a method for manufacturing a package device according to some embodiments of the present disclosure.
Figure 55:
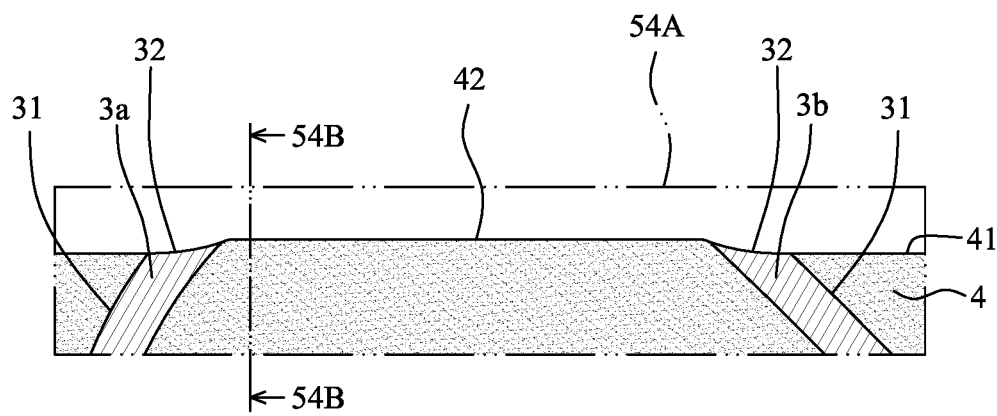
FIG. 55 illustrates an enlarged view of an area 54A shown in FIG. 54.
Figure 56:
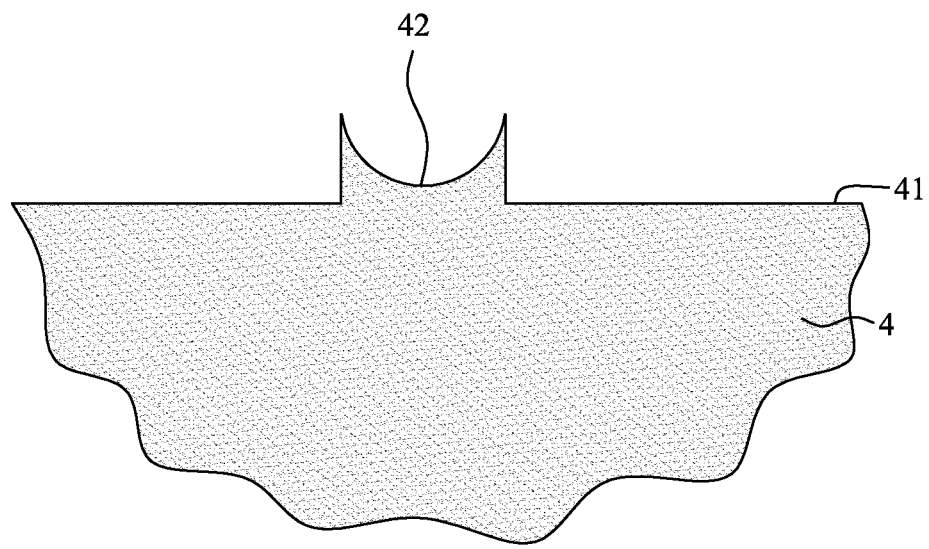
FIG. 56 illustrates a cross-sectional view taken along line 54B-54B shown in FIG. 55.

Referring to FIG. 54, the connecting segment 302 of the bonding wire 30 is then removed by, for example, etching. The bonding wire 30 is thus separated into two conductive segments, e.g., a first conductive segment 3a and a second conductive segment 3b. A second surface 32 of the first conductive segment 3a and a second surface 32 of the second conductive segment 3b are formed. Besides, a second upper surface 42 of the encapsulant 4 is formed between the first conductive segment 3a and the second conductive segment 3b. FIG. 55 illustrates an enlarged view of an area 54A shown in FIG. 54. FIG. 56 illustrates a cross-sectional view taken along line 54B-54B shown in FIG. 55. The second upper surface 42 is substantially in an annular or disk shape, and is disposed above the first upper surface 41 of the encapsulant 4. The second surfaces 32 of the first conductive segment 3a and the second conductive segment 3b connect the first upper surface 41 and the second upper surface 42 of the encapsulant 4. As shown in FIGS. 54 to 56, the first surfaces 31 of the first conductive segment 3a and the second conductive segment 3b may be completely covered by the encapsulant 4.

The stages subsequent to that shown in FIGS. 54 to 56 of the illustrated process are similar to the stages illustrated in FIG. 39 through FIG. 47, thus forming the package device 1b shown in FIGS. 7 to 9.

Figure 57:
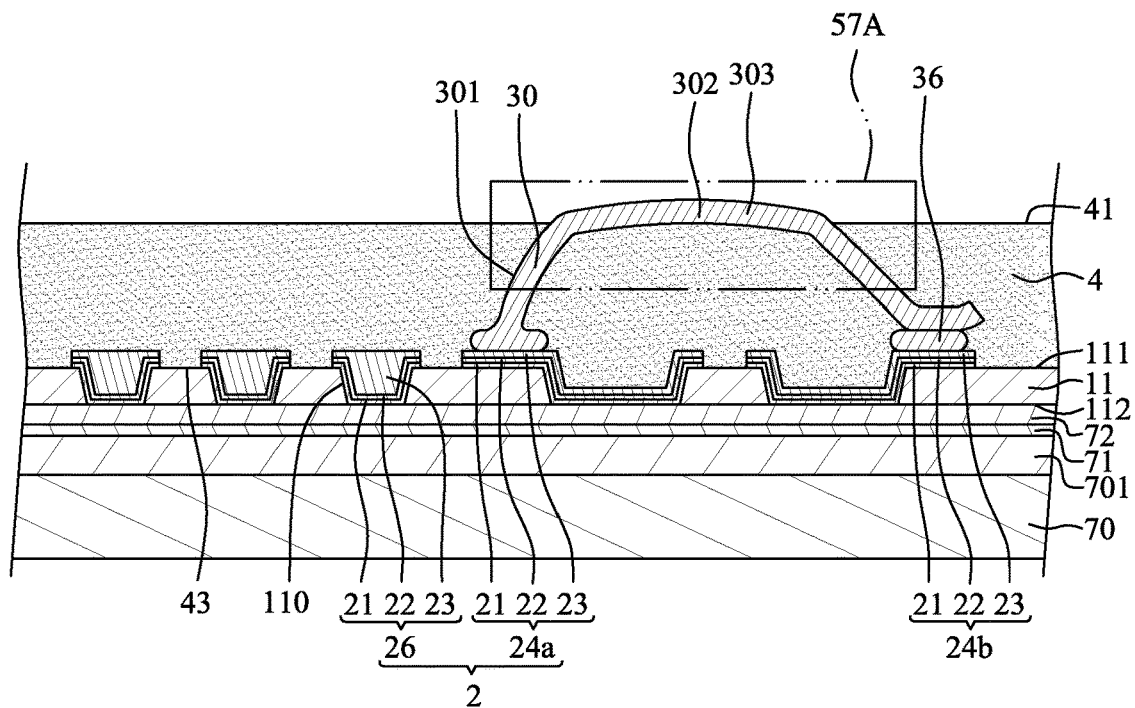
FIG. 57 illustrates one or more stages of an example of a method for manufacturing a package device according to some embodiments of the present disclosure.
Figure 58:
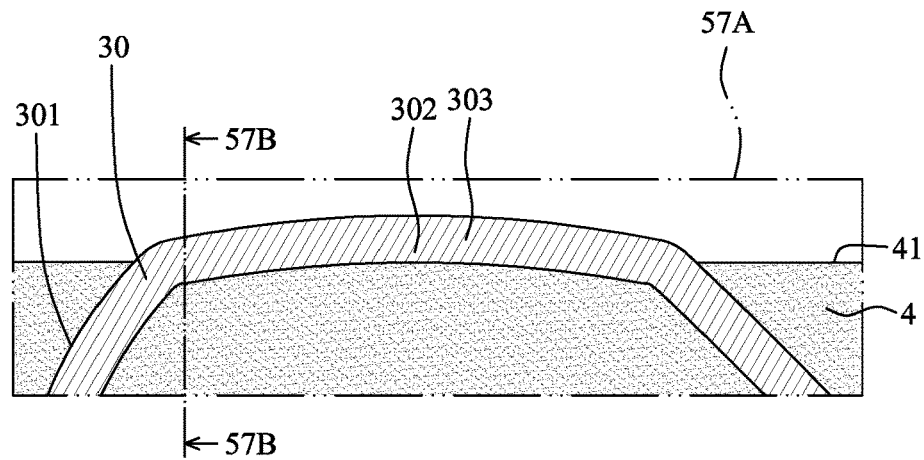
FIG. 58 illustrates an enlarged view of an area 57A shown in FIG. 57.
Figure 59:
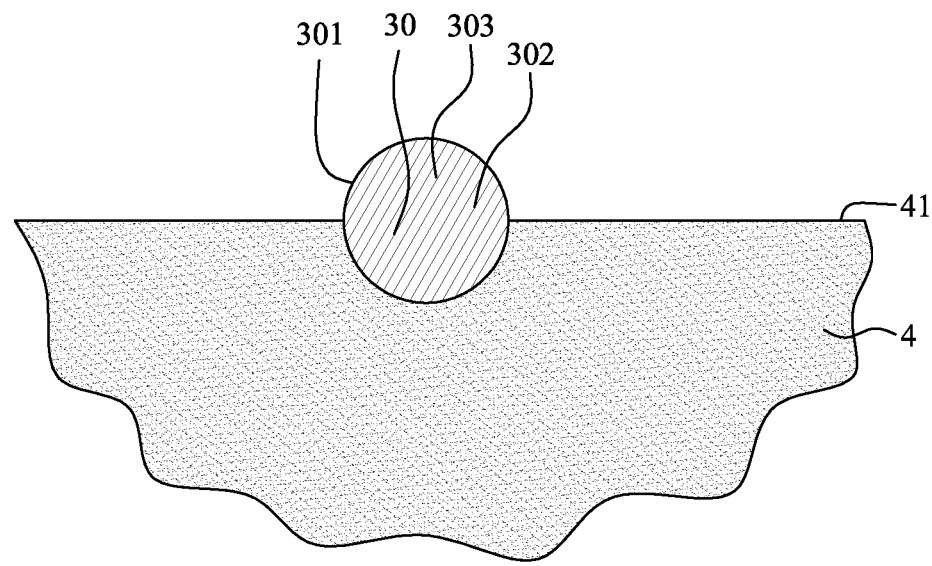
FIG. 59 illustrates a cross-sectional view taken along line 57B-57B shown in FIG. 58.

FIG. 57 through FIG. 62 illustrate a method for manufacturing a package device according to some embodiments of the present disclosure. In some embodiments, the method is for manufacturing a package device such as the package device 1c shown in FIGS. 10 to 12. The initial stages of the illustrated process are the same as, or similar to, the stages illustrated in FIG. 21 through FIG. 32. FIG. 57 depicts a stage subsequent to that depicted in FIGS. 30 to 32. FIG. 58 illustrates an enlarged view of an area 57A shown in FIG. 57. FIG. 59 illustrates a cross-sectional view taken along line 57B-57B shown in FIG. 58.

Referring to FIGS. 57 to 59, a portion of the encapsulant 4 is removed before the connecting segment 302 of the bonding wire 30 is removed, forming a first upper surface 41 of the encapsulant 4. The portion of the encapsulant 4 may be removed by, for example, plasma treatment. As shown in FIGS. 57 to 59, the encapsulant 4 still covers a portion of the connecting segment 302 of the bonding wire 30.

Figure 60:
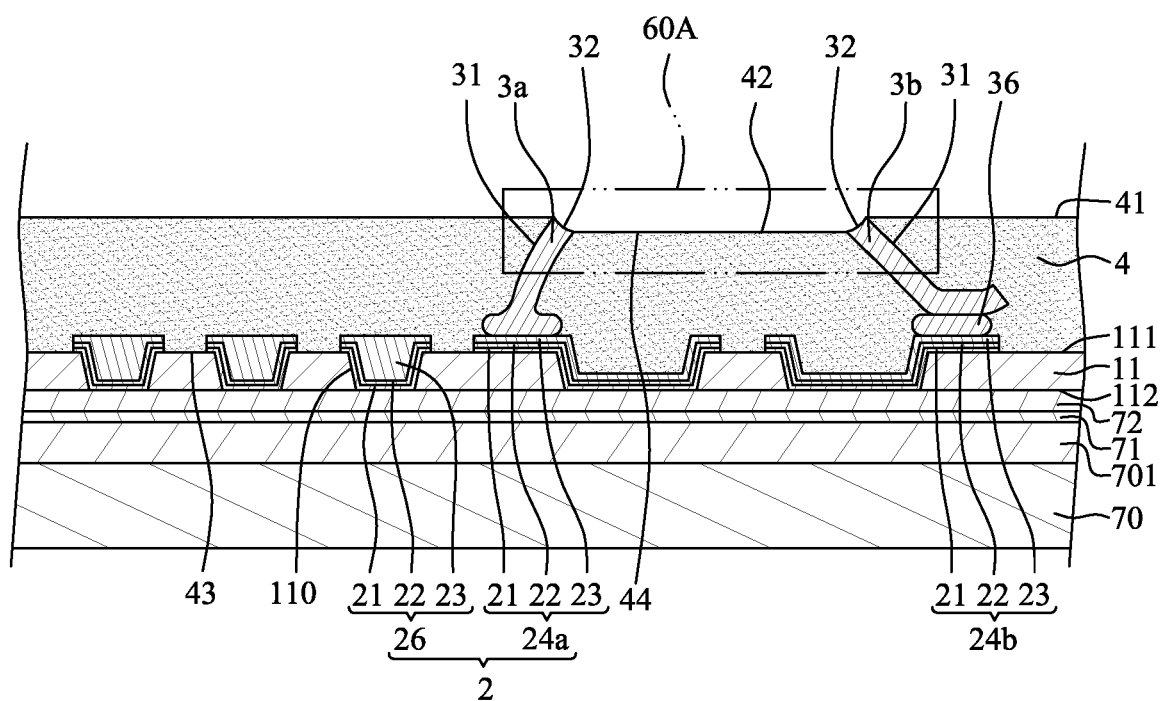
FIG. 60 illustrates one or more stages of an example of a method for manufacturing a package device according to some embodiments of the present disclosure.
Figure 61:
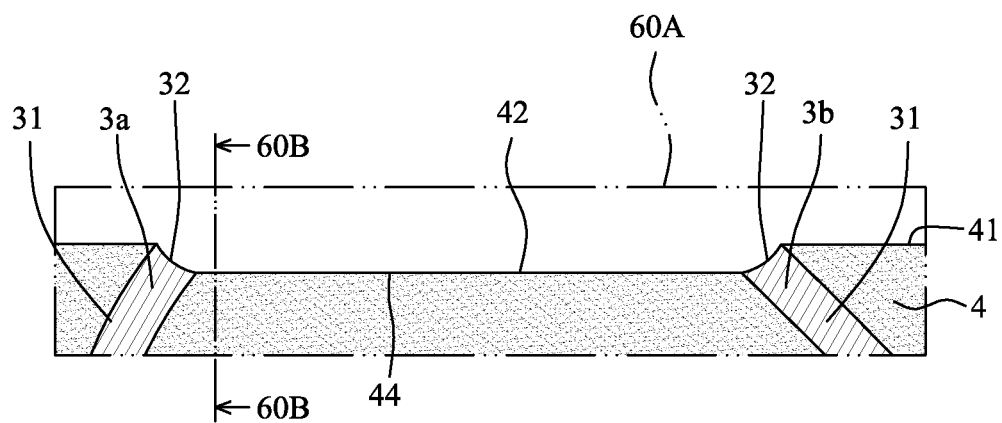
FIG. 61 illustrates an enlarged view of an area 60A shown in FIG. 60.
Figure 62:
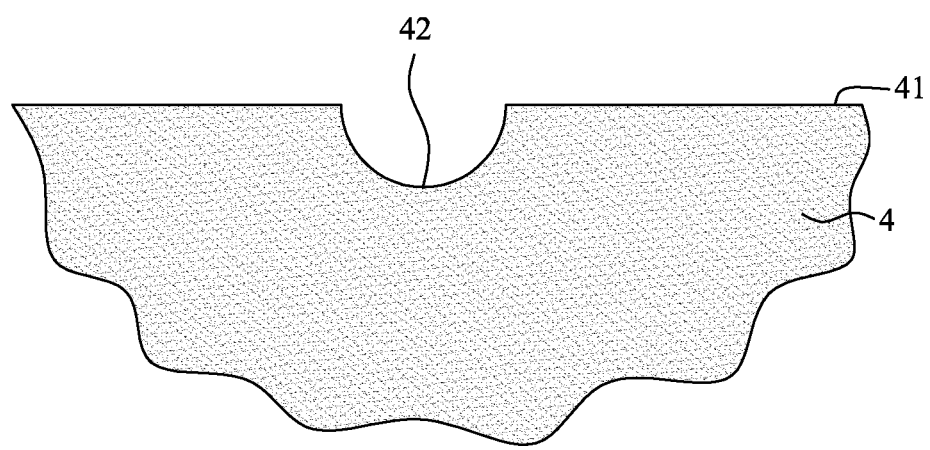
FIG. 62 illustrates a cross-sectional view taken along line 60B-60B shown in FIG. 61.

Referring to FIG. 60, the connecting segment 302 of the bonding wire 30 is then removed by, for example, etching. The bonding wire 30 is thus separated into two conductive segments, e.g., a first conductive segment 3a and a second conductive segment 3b. A second surface 32 of the first conductive segment 3a and a second surface 32 of the second conductive segment 3b are formed. Besides, a second upper surface 42 of the encapsulant 4 is formed between the first conductive segment 3a and the second conductive segment 3b. FIG. 61 illustrates an enlarged view of an area 60A shown in FIG. 60. FIG. 62 illustrates a cross-sectional view taken along line 60B-60B shown in FIG. 61. The second upper surface 42 is substantially in an annular or disk shape, and is recessed from the first upper surface 41 of the encapsulant 4. The second surfaces 32 of the first conductive segment 3a and the second conductive segment 3b connect the first upper surface 41 and the second upper surface 42 of the encapsulant 4. As shown in FIGS. 60 to 62, the first surfaces 31 of the first conductive segment 3a and the second conductive segment 3b may be completely covered by the encapsulant 4.

The stages subsequent to that shown in FIGS. 60 to 62 of the illustrated process are similar to the stages illustrated in FIG. 39 through FIG. 47, thus forming the package device 1c shown in FIGS. 10 to 12.

FIG. 63 through FIG. 80 illustrate a method for manufacturing a package device (semiconductor device) according to some embodiments of the present disclosure. In some embodiments, the method is for manufacturing a package device (semiconductor device) such as the package device (semiconductor device) if shown in FIG. 15.

Figure 63:
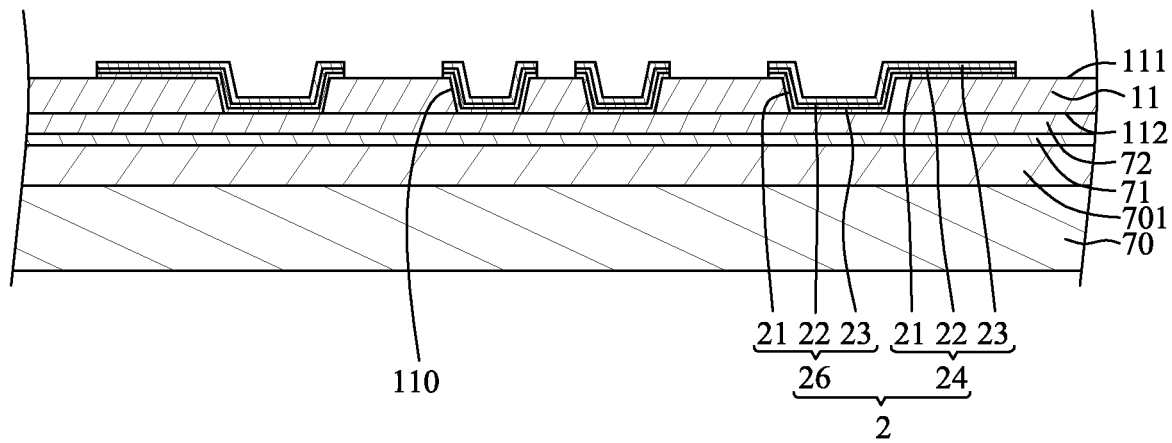
FIG. 63 illustrates one or more stages of an example of a method for manufacturing a semiconductor device according to some embodiments of the present disclosure.

Referring to FIG. 63, a carrier 70 including a thermal release material 701 is provided. A first seed layer 71 and a second seed layer 72 are sequentially disposed on the thermal release material 701 of the carrier 70. A dielectric layer 11 is provided on the second seed layer 72. The dielectric layer 11 has an upper surface 111 and a lower surface 112 opposite to the upper surface 111, and the lower surface 112 is disposed on the second seed layer 72. The dielectric layer 11 defines at least one through hole 110 extending through the dielectric layer 11 and between the upper surface 111 and the lower surface 112. A circuit layer 2, including a first metal layer 21, a second metal layer 22 and a third metal layer 23, is formed on the second surface 111 and in the through hole 110 of the dielectric layer 11. The formations of the carrier 70, the thermal release material 701, the first seed layer 71, the second seed layer 72, the dielectric layer 11 and the circuit layer 2 may be the same as, or similar to, the stages illustrated in FIG. 21 through FIG. 25.

Figure 64:
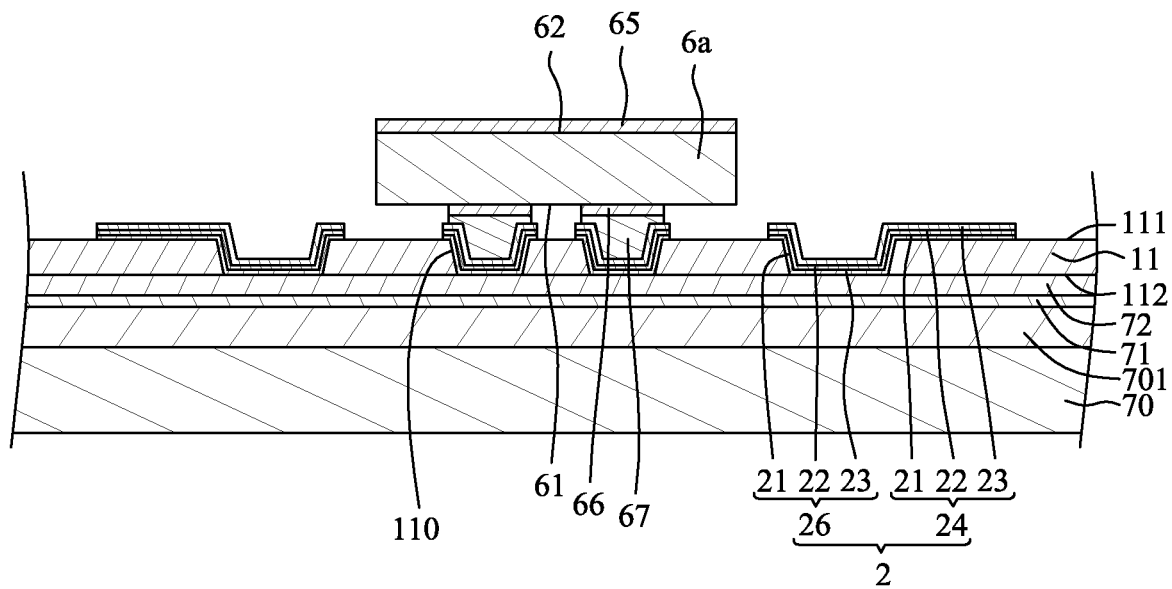
FIG. 64 illustrates one or more stages of an example of a method for manufacturing a package device (semiconductor device) according to some embodiments of the present disclosure.

Referring to FIG. 64, an electronic component 6a is connected to the circuit layer 2. The electronic component 6a has a first surface 61 and a passive surface 62 opposite to the first surface 61. The electronic component 6a includes at least one bump pad 66 disposed on the first surface 61, and a conductive layer 65 disposed on the passive layer 62. The electronic component 6a further includes at least one solder joint 67 disposed between the bump pad 66 of the electronic component 6a and a respective conductive via 26 of the circuit layer 2. Hence, the electronic component 6a can be electrically connected to the circuit layer 2 through the bump pad 66 and the solder joint 67.

Figure 65:
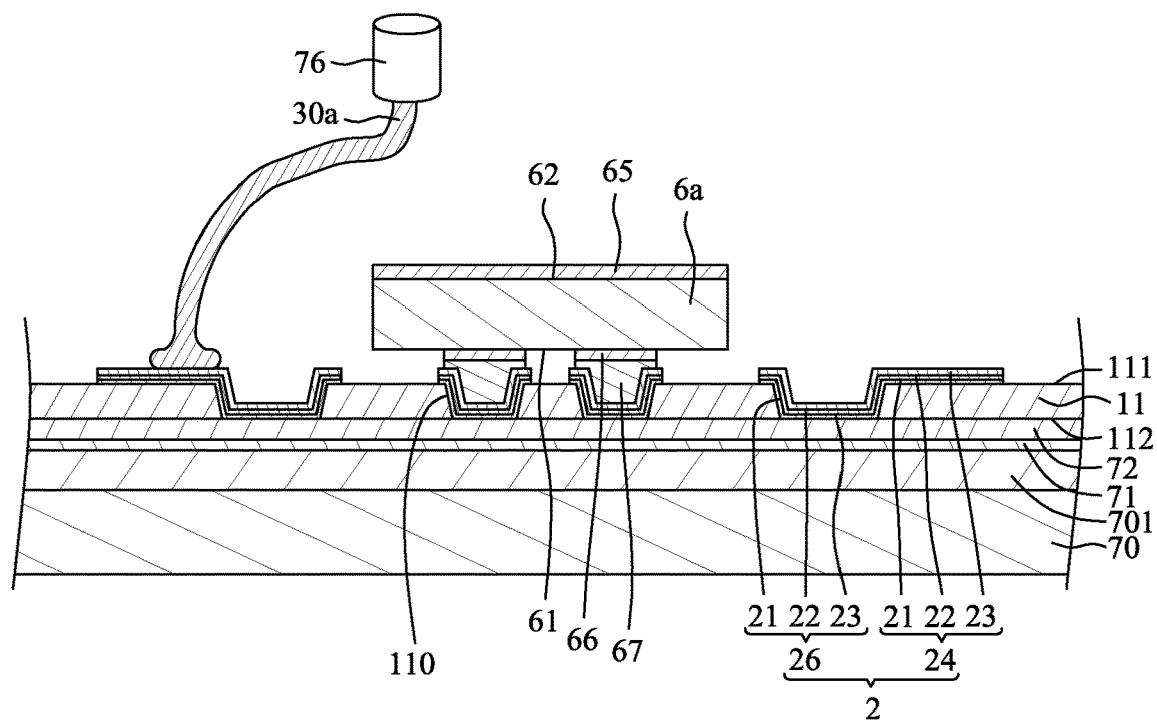
FIG. 65 illustrates one or more stages of an example of a method for manufacturing a package device (semiconductor device) according to some embodiments of the present disclosure.

Referring to FIG. 65, a first bond portion (e.g., a ball bond) of a bonding wire 30a is formed on and connected to the bump pad 24 of the circuit layer 2 by using a capillary 76.

Figure 66:
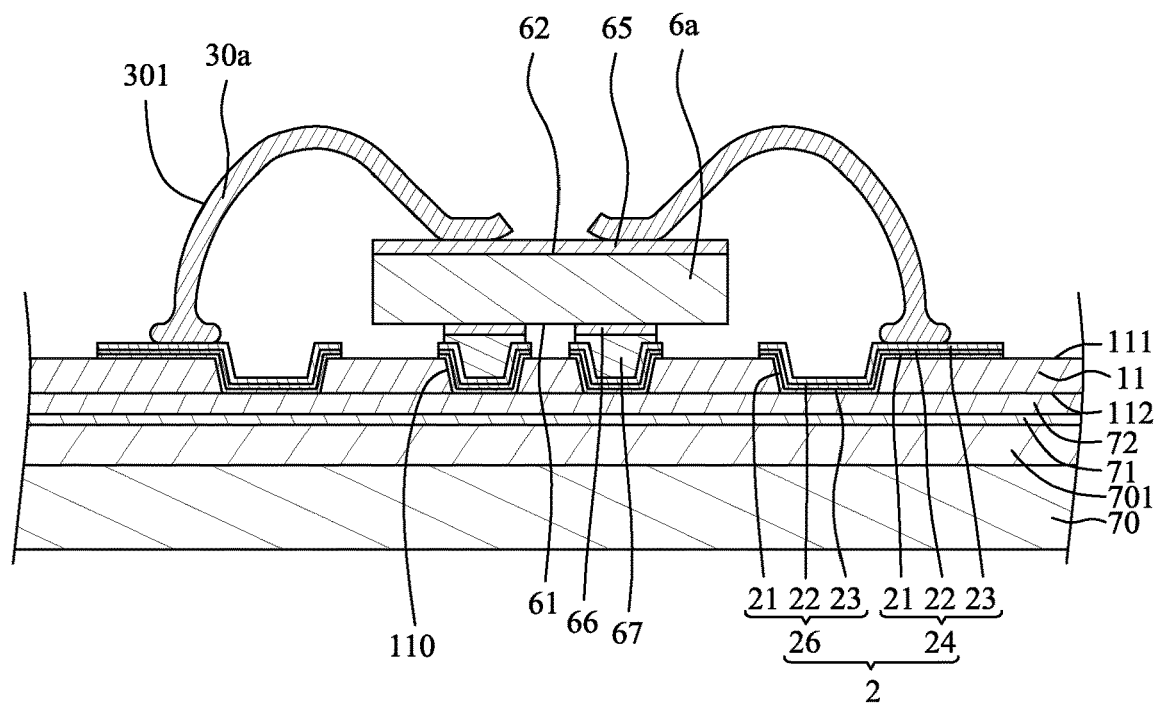
FIG. 66 illustrates one or more stages of an example of a method for manufacturing a package device (semiconductor device) according to some embodiments of the present disclosure.

Referring to FIG. 66, the capillary 76 moves to the conductive layer 65 on the passive surface 62 of the electronic component 6a, forming a second bond portion (e.g., a wedge portion or a tail portion) of the bonding wire 30a. The bonding wire 30a connects the bump pad 24 and the conductive layer 65 of the electronic component 6a, and is substantially in a loop shape. The bonding wire 30a may include conductive metals, such as tin, aluminum, gold, silver or copper, or an alloy thereof. In some other embodiments, a stud portion (such as the stud portion 36 shown in FIG. 1) can be disposed on the conductive layer 65 of the electronic component 6a, and the bonding wire 30a can be connected to the conductive layer 65 through the stud portion for enhanced engagement with the electronic component 6a. The bonding wire 30a has a first surface 301, which is substantially an annular surface as can be seen in FIG. 32. Then, a plasma pretreatment is conducted for surface cleaning and activation of the dielectric layer 11.

Figure 67:
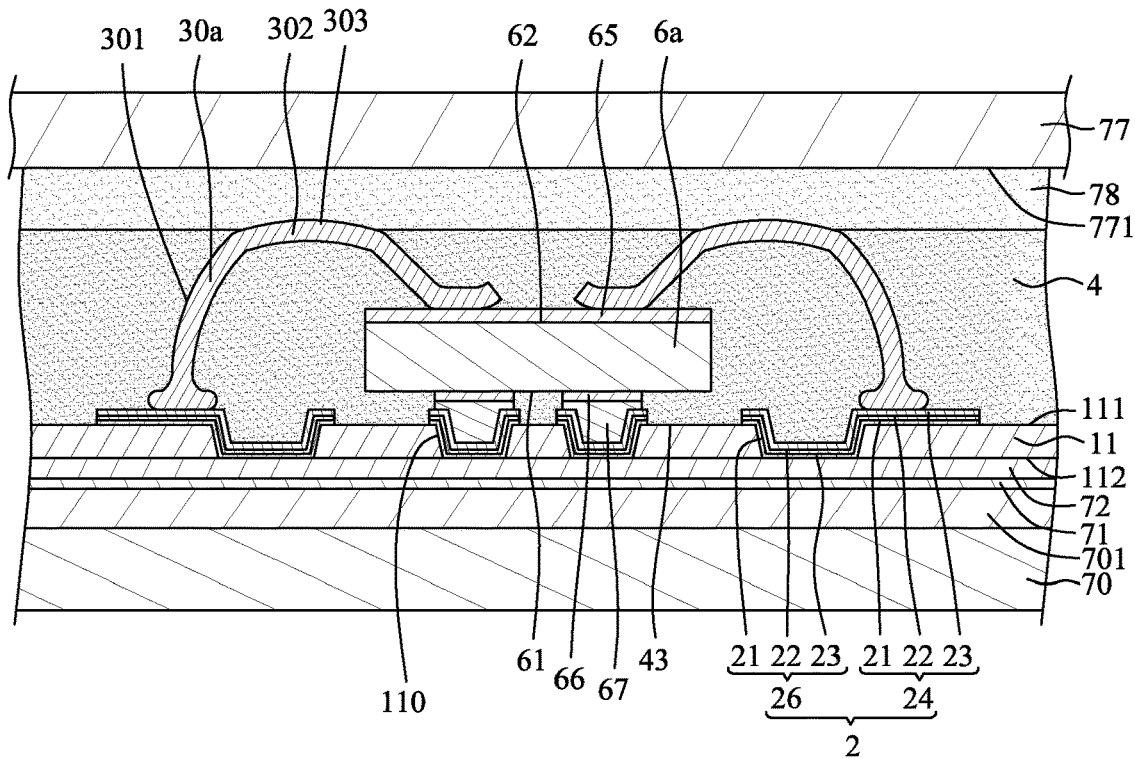
FIG. 67 illustrates one or more stages of an example of a method for manufacturing a package device (semiconductor device) according to some embodiments of the present disclosure.

Referring to FIG. 67, the carrier 70 and the elements disposed thereon are disposed in a cavity of a mold 77. The bonding wire 30a is pressed, such that a connecting segment 302 of the bonding wire 30 may be substantially straight and substantially parallel to a surface 771 of the mold 77. For example, a film 78 is disposed on the surface 771 of the mold 77. The film 78 may include an elastic polymer. The bonding wire 30a is pressed by the film 78 on the surface 771 of the mold, such that a portion 303 of the connecting segment 302 protrudes into the film 78. However, in other embodiments, the film 78 may be omitted, and the bonding wire 30a may be directly pressed by the mold 77. Then, an encapsulant material is provided in a cavity of the mold 77, and is then cured to form an encapsulant 4. The encapsulant 4 may be a molding compound, and is disposed on the upper surface 111 of the dielectric layer 11 and covers the circuit layer 2. In some embodiments, a material of the encapsulant 4 may be the same as or similar to that of the dielectric layer 11. The encapsulant 4 has a lower surface 43 disposed on the upper surface 111 of the dielectric layer 11. The encapsulant 4 encapsulates the bonding wire 30a.

Figure 68:
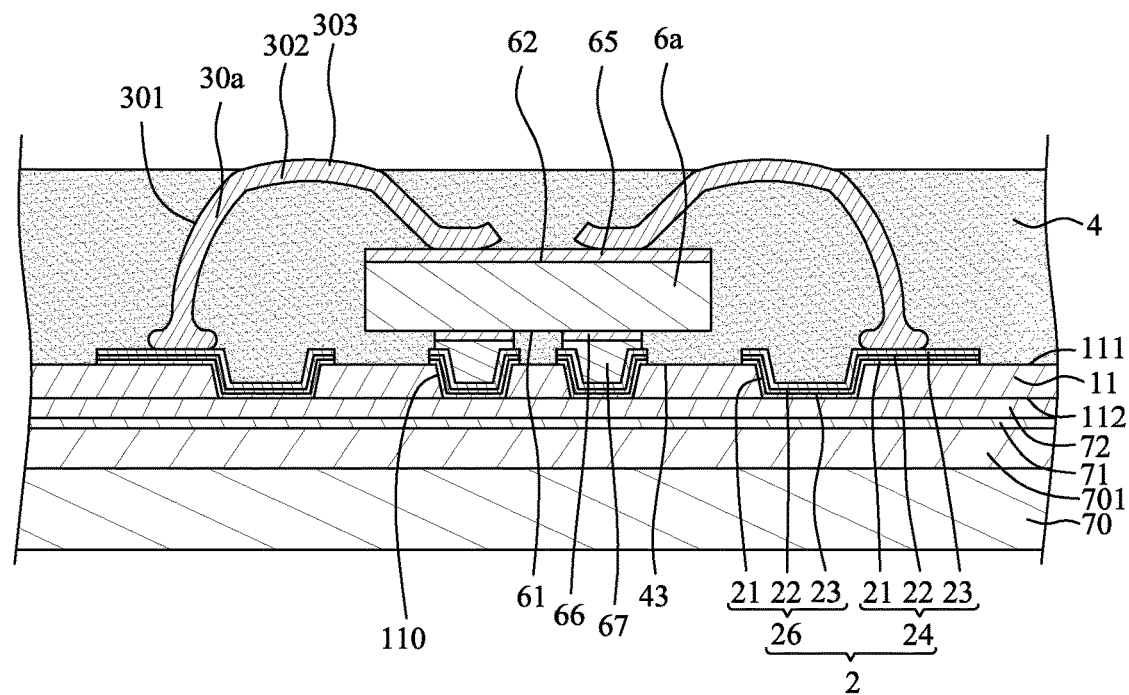
FIG. 68 illustrates one or more stages of an example of a method for manufacturing a package device (semiconductor device) according to some embodiments of the present disclosure.

Referring to FIG. 68, the mold 77 and the film 78 are then removed. Accordingly, the portion 303 of the connecting segment 302 of the bonding wire 30a is exposed from the encapsulant 4.

Figure 69:
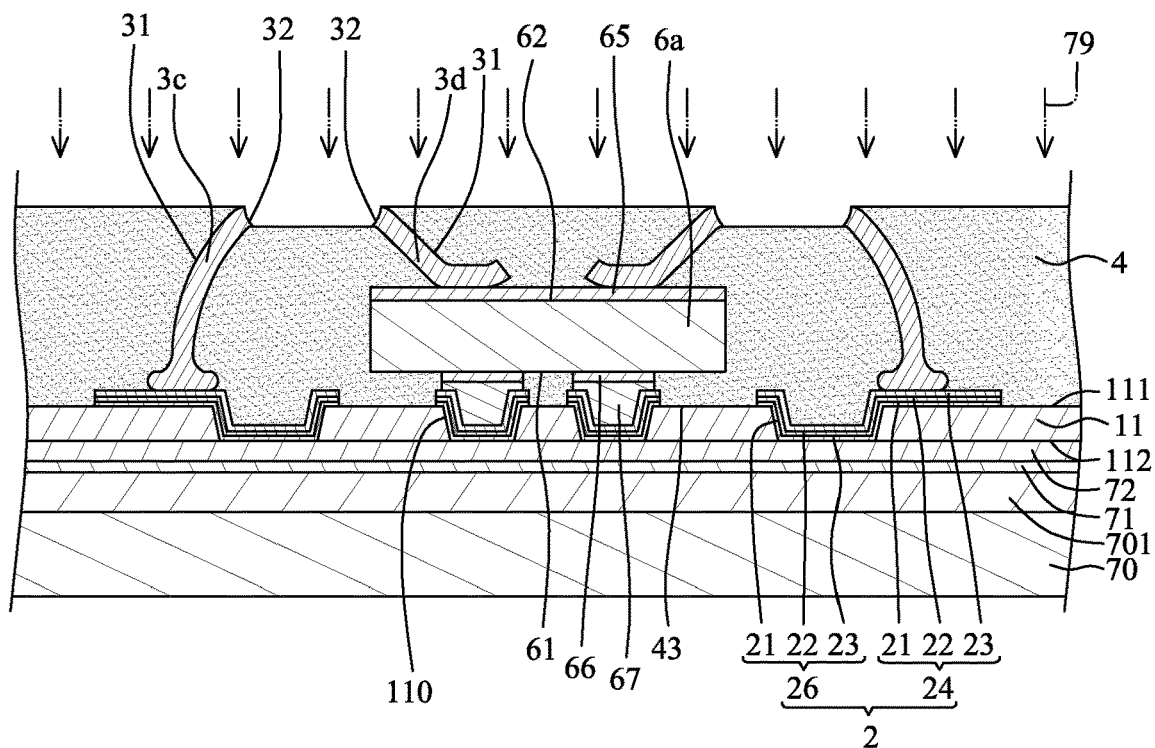
FIG. 69 illustrates one or more stages of an example of a method for manufacturing a package device (semiconductor device) according to some embodiments of the present disclosure.

Referring to FIG. 69, the connecting segment 302 of the bonding wire 30a is removed by, for example, etching. The bonding wire 30a is thus separated into two conductive segments, e.g., a first conductive segment 3c on the bump pad 24 and a second conductive segment 3d on the electronic component 6a. Accordingly, a second surface 32 of the first conductive segment 3c and a second surface 32 of the second conductive segment 3d are formed. The first conductive segment 3c (and the second conductive segment 3d, similarly) has a first surface 31 and the second surface 32. For example, a portion of the first surface 301 of the bonding wire 30a forms the first surface 31 of the first conductive segment 3c, and another portion of the first surface 301 of the bonding wire 30a forms the first surface 31 of the second conductive segment 3d. The first surface 31 and the second surface 32 intersect with each other. For example, the second surface 32 is a concave surface and is exposed from the encapsulant 4. The first surface 31 is substantially an annular surface and extends from a periphery of the second surface 32. Since the first surface 31 of the first conductive segment 3c is formed by, for example, plating, and the second surface 32 of the first conductive segment 3c is formed by, for example, etching, an average roughness of the first surface 31 is different from an average roughness of the second surface 32. In some embodiments, the average roughness of the first surface 31 is less than the average roughness of the second surface 32. For example the average roughness of the second surface 32 may be at least about 1.5 times, about 2 times, at least about 3 times, or at least about 5 times the average roughness of the first surface 31. For example, the average roughness of the first surface 31 may be smaller than about 20 nm, and the average roughness of the second surface 32 may be greater than about 40 nm. Then, a portion of the encapsulant 4 is removed by, for example, a plasma treatment using a plasma source 79.

Figure 70:
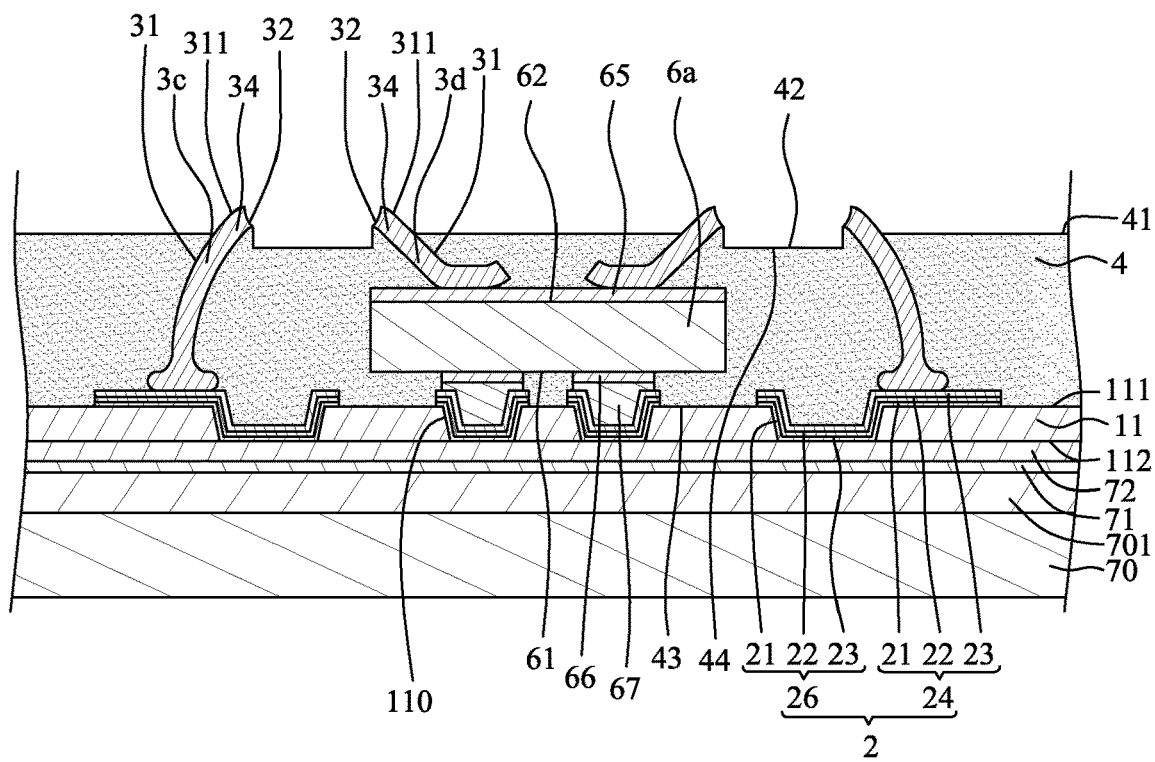
FIG. 70 illustrates one or more stages of an example of a method for manufacturing a package device (semiconductor device) according to some embodiments of the present disclosure.

Referring to FIG. 70, after the plasma treatment, a portion of the encapsulant 4 is removed. A first upper surface 41 and a second upper surface 42 of the encapsulant 4 are formed, and a first portion 311 of the first surface 31 of the first conductive segment 3c and a first portion 311 of the first surface 31 of the second conductive segment 3d are exposed from the encapsulant 4. The first upper surface 41 and the second upper surface 42 of the encapsulant 4 are not coplanar. For example, the first upper surface 41 is disposed above the second upper surface 42. In some embodiments, the first upper surface 41 is substantially flat, and the second upper surface 42 is substantially in an annular or disk shape. The second upper surface 42 intersects with the first upper surface 41 at two sides, and is recessed from the first surface 41 to define a cavity 44. The cavity 44 is located between the first conductive segment 3c and the second conductive segment 3d. The first portion 311 of the first surface 31 is exposed from the encapsulant 4 and is disposed above the first surface 41 of the encapsulant 4. The second surface 32 is exposed from the encapsulant 4, and at least a portion of the second surface 32 is disposed above the first upper surface 41 of the encapsulant 4. In some embodiments, as shown in FIG. 70, the second surface 32 (e.g. the entire second surface 32) is disposed above the first upper surface 41 of the encapsulant 4. The second upper surface 42 of the encapsulant 4 is disposed below the second surface 32 of the first conductive segment 3c. As shown in FIG. 70, a portion 34 of the first conductive segment 3c is exposed from the encapsulant 4. The first portion 311 of the first surface 31 and the second surface 32 are surfaces of the exposed portion 34 of the first conductive segment 3c. The second conductive segment 3d also has a first surface 31, and a second surface 32, and includes an exposed portion 34. The first surface 31, the second surface 32 and the exposed portion 34 of the first surface 31, the second surface 32 and the exposed portion 34 of the second conductive segment 3d are similar to those of the first conductive segment 3c, and thus are not described redundantly.

Figure 71:
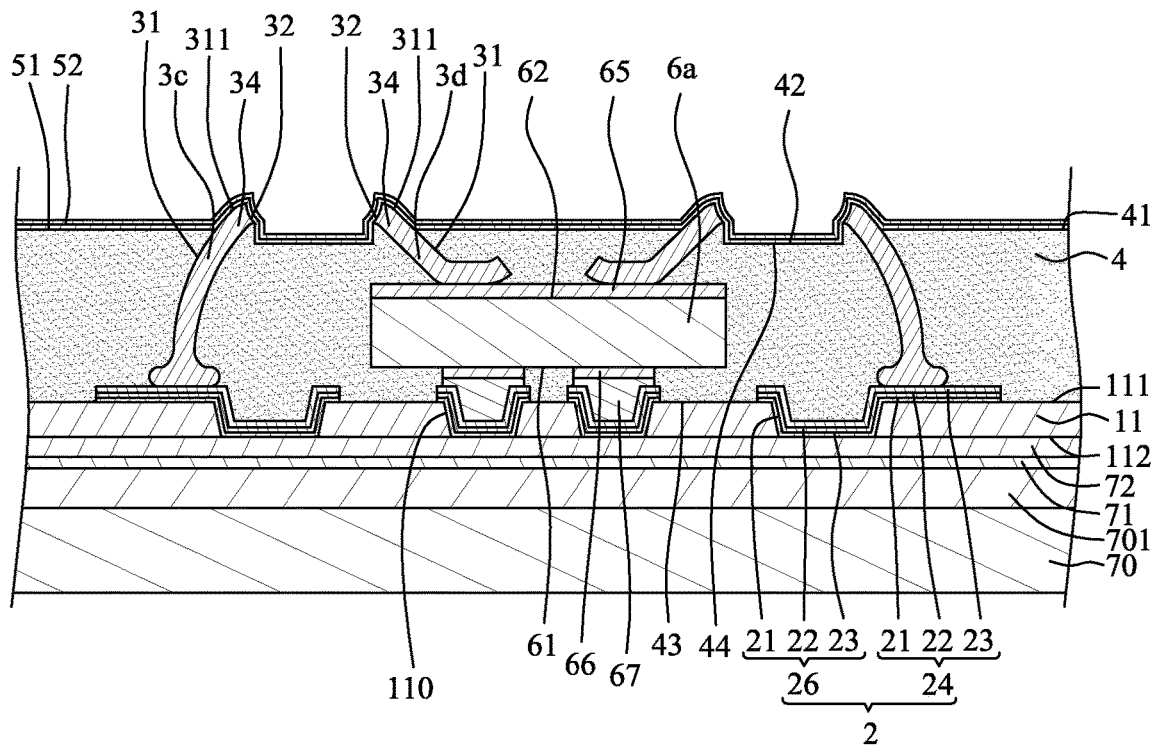
FIG. 71 illustrates one or more stages of an example of a method for manufacturing a package device (semiconductor device) according to some embodiments of the present disclosure.

Referring to FIG. 71, a fourth metal layer 51 and a fifth metal layer 52 are disposed on the encapsulant 4 and on the exposed portion 34 of each of the first conductive segment 3c and the second conductive segment 3d. The fourth metal layer 51 and the fifth metal layer 52 may be seed layers and include titanium, copper, nickel, tungsten, and/or platinum, or an alloy thereof, and may be formed by sputtering.

Figure 72:
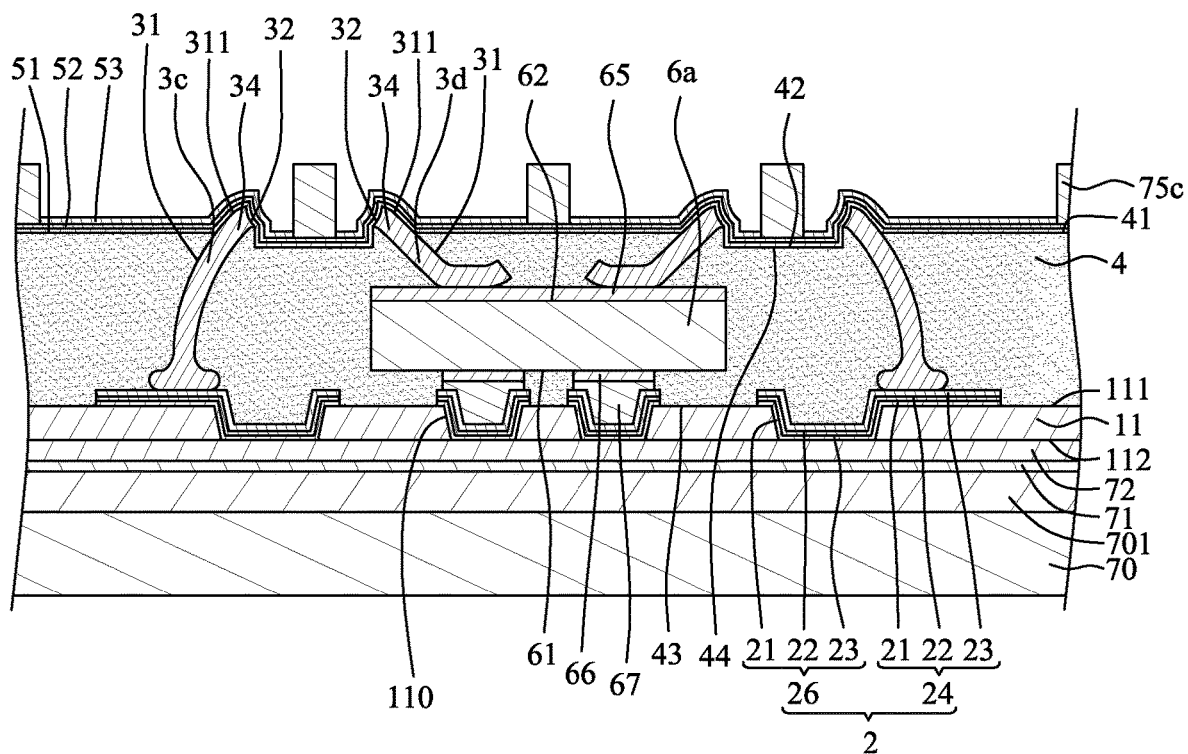
FIG. 72 illustrates one or more stages of an example of a method for manufacturing a package device (semiconductor device) according to some embodiments of the present disclosure.

Referring to FIG. 72, a third photoresist layer 75c is disposed on the fifth metal layer 52. The third photoresist layer 75c is then patterned to expose portions of the fifth metal layer 52. Then, a sixth metal layer 53 is formed in the third photoresist layer 75c and on the fifth metal layer 52. The sixth metal layer 53 may include copper, tin, gold, silver, nickel, and/or palladium, or an alloy thereof, and may be formed by electroplating, electroless plating or printing.

Figure 73:
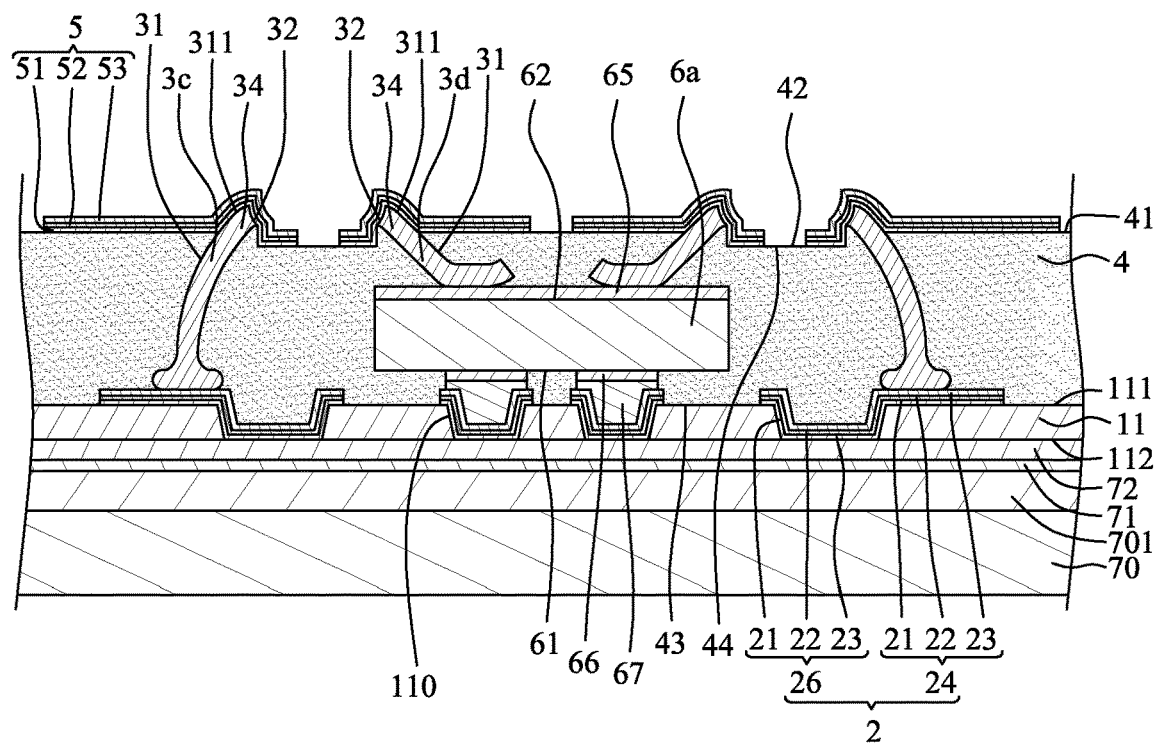
FIG. 73 illustrates one or more stages of an example of a method for manufacturing a package device (semiconductor device) according to some embodiments of the present disclosure.

Referring to FIG. 73, the third photoresist layer 75c is removed by, for example, stripping. Then, portions of the fourth metal layer 51 and the fifth metal layer 52 which are not covered by the sixth metal layer 53 are removed by, for example, etching. Hence, an RDL 5 is formed on the exposed portion 311 of the first surface 31 and the second surface 32 of each of the first conductive segment 3c and the second conductive segment 3d, and includes the fourth metal layer 51, the fifth metal layer 52 and the sixth metal layer 53. The formation of the RDL 5 may be the same as, or similar to, the stages illustrated in FIG. 39 through FIG. 41. As shown in FIG. 71, the RDL 5 is disposed on both the first upper surface 41 and the second upper surface 42 of the encapsulant 4, and in the cavity 44 of the encapsulant 4. The RDL 5 covers the exposed portion 34 of the first conductive segment 3c and the exposed portion 34 of the second conductive segment 3d. The RDL 5 is disposed on and conformal to the first portion 311 of the first surface 31 of the first conductive segment 3c, and the second surface 32 of the first conductive segment 3c. Similarly, the RDL 5 may also be disposed on and conformal to the first portion 311 of the first surface 31 of the second conductive segment 3d, and the second surface 32 of the second conductive segment 3d. In some embodiments, the first conductive segment 3c connects the circuit layer 2 and the RDL 5, and the second conductive segment 3d connects the conductive layer 65 of the electronic component 6a and the RDL 5.

Figure 74:
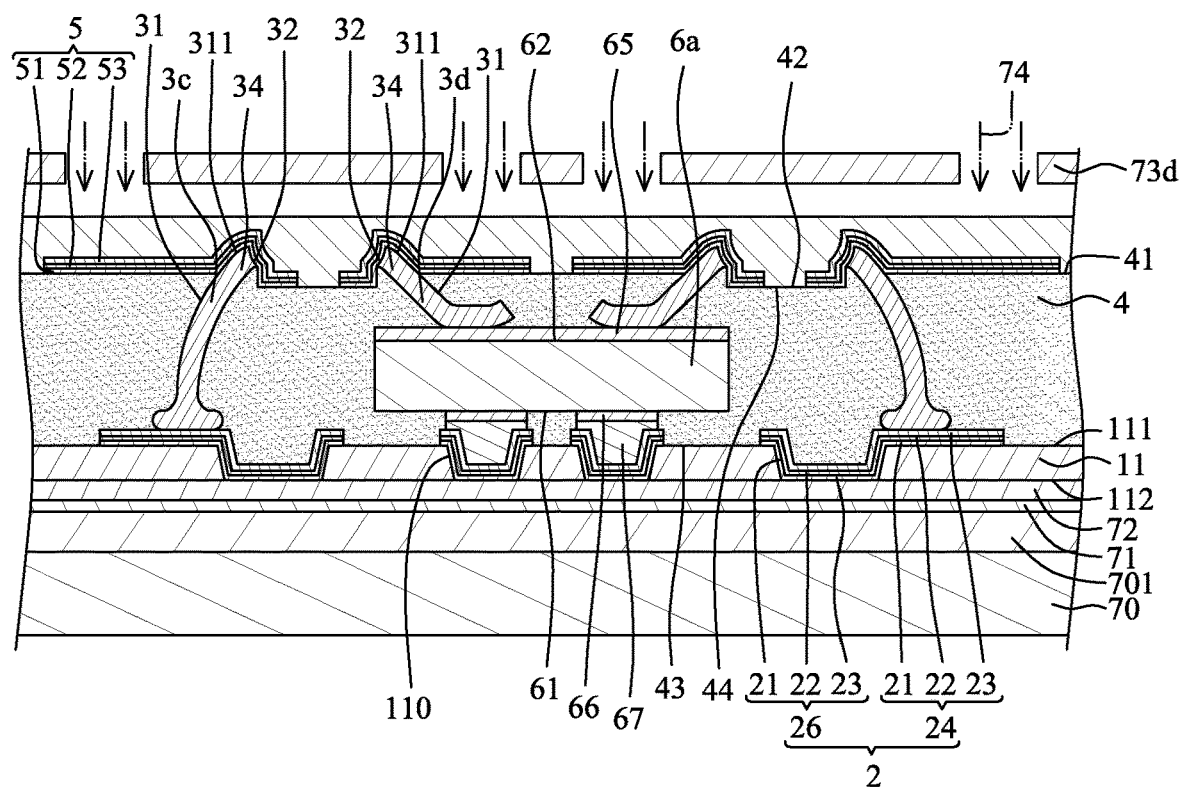
FIG. 74 illustrates one or more stages of an example of a method for manufacturing a package device (semiconductor device) according to some embodiments of the present disclosure.

Referring to FIG. 74, a passivation layer 12 is disposed on the encapsulant 4 and covers the RDL 5. Then, the passivation layer 12 is exposed to a pattern of intense light. For example, a mask 73e is disposed adjacent to the passivation layer 12, so as to cover a portion of the passivation layer 12. Then, the passivation layer 12 is exposed to a radiation source 74.

Figure 75:
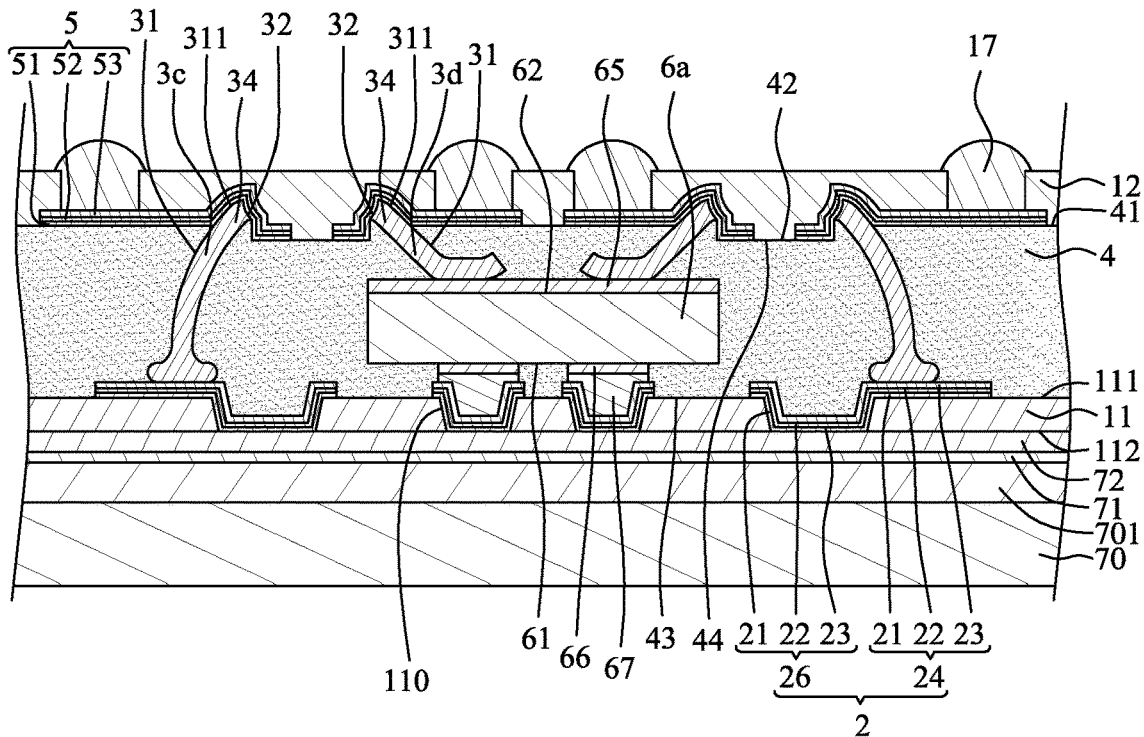
FIG. 75 illustrates one or more stages of an example of a method for manufacturing a package device (semiconductor device) according to some embodiments of the present disclosure.

Referring to FIG. 75, the passivation layer 12 is then developed by a developer, forming a passivation layer 12 which exposes portions of the RDL 5 for external connection. The passivation layer 12 is disposed on the first upper surface 41 of the encapsulant 4, the RDL 5 and the second upper surface 42 of the encapsulant 4. The passivation extends into the cavity 44 of the encapsulant 4. A material of the passivation layer 12 may be the same as that of the dielectric layer 11. Then, at least one upper solder connector is disposed in the passivation layer 12 and on the exposed portion of the RDL 5.

Figure 76:
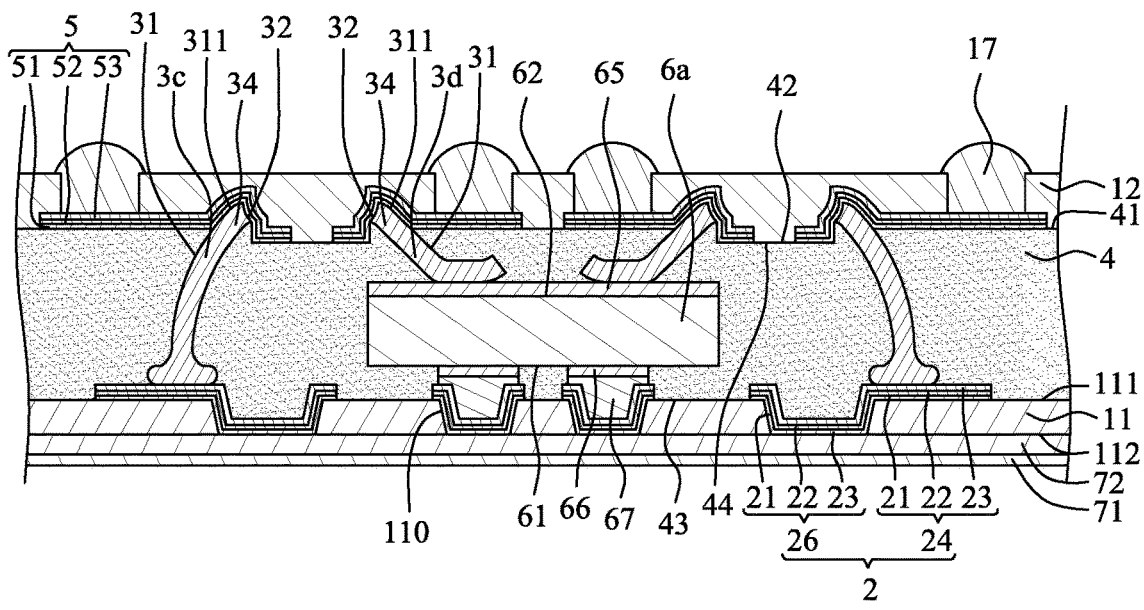
FIG. 76 illustrates one or more stages of an example of a method for manufacturing a package device (semiconductor device) according to some embodiments of the present disclosure.
Figure 76:
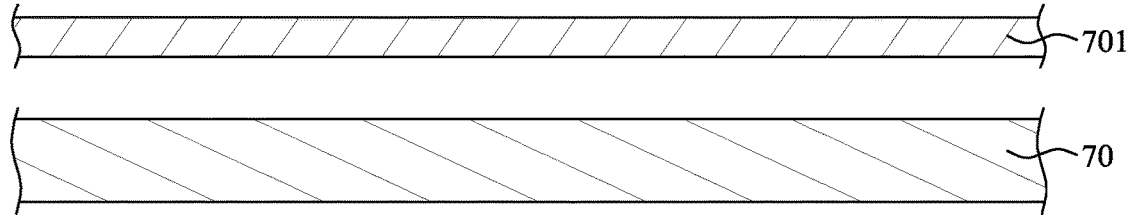

Referring to FIG. 76, the carrier 70 and the thermal release material 701 are removed.

Figure 77:
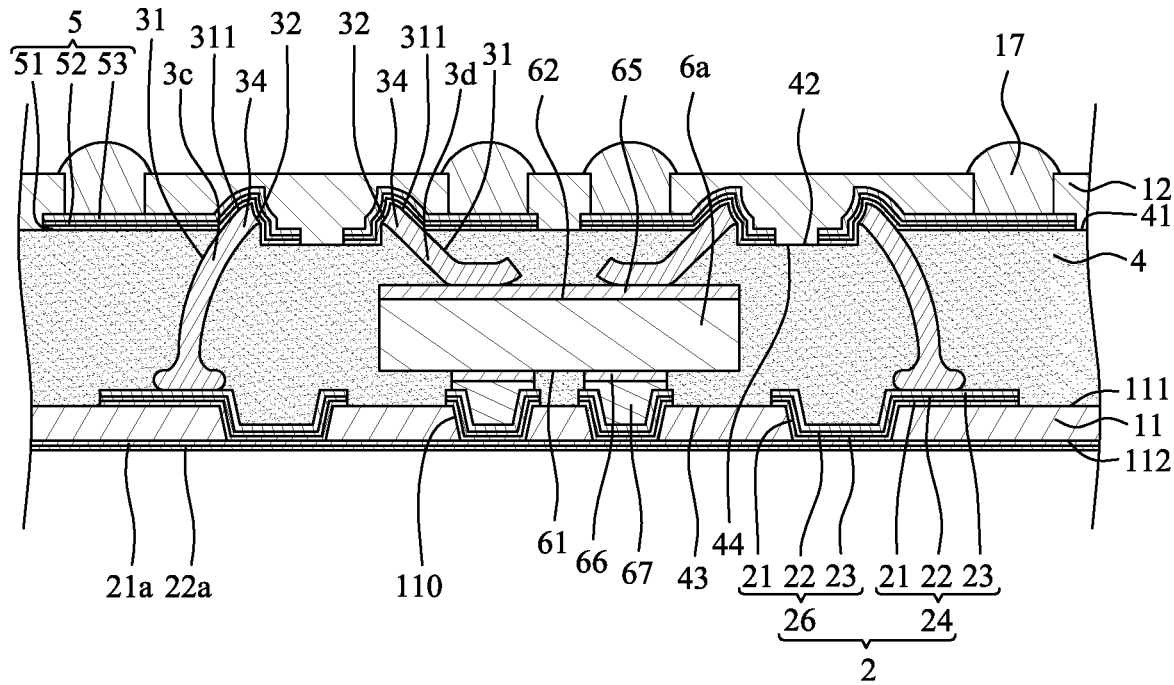
FIG. 77 illustrates one or more stages of an example of a method for manufacturing a package device (semiconductor device) according to some embodiments of the present disclosure.

Referring to FIG. 77, the first seed layer 71 and the second seed layer 72 are removed by, for example, etching. Then, an additional first metal layer 21a and an additional second metal layer 22a are disposed on the second surface 112 of the dielectric layer 11. The additional first metal layer 21a and the additional second metal layer 22a may be seed layers and include titanium, copper, nickel, tungsten, and/or platinum, or an alloy thereof, and may be formed by sputtering.

Figure 78:
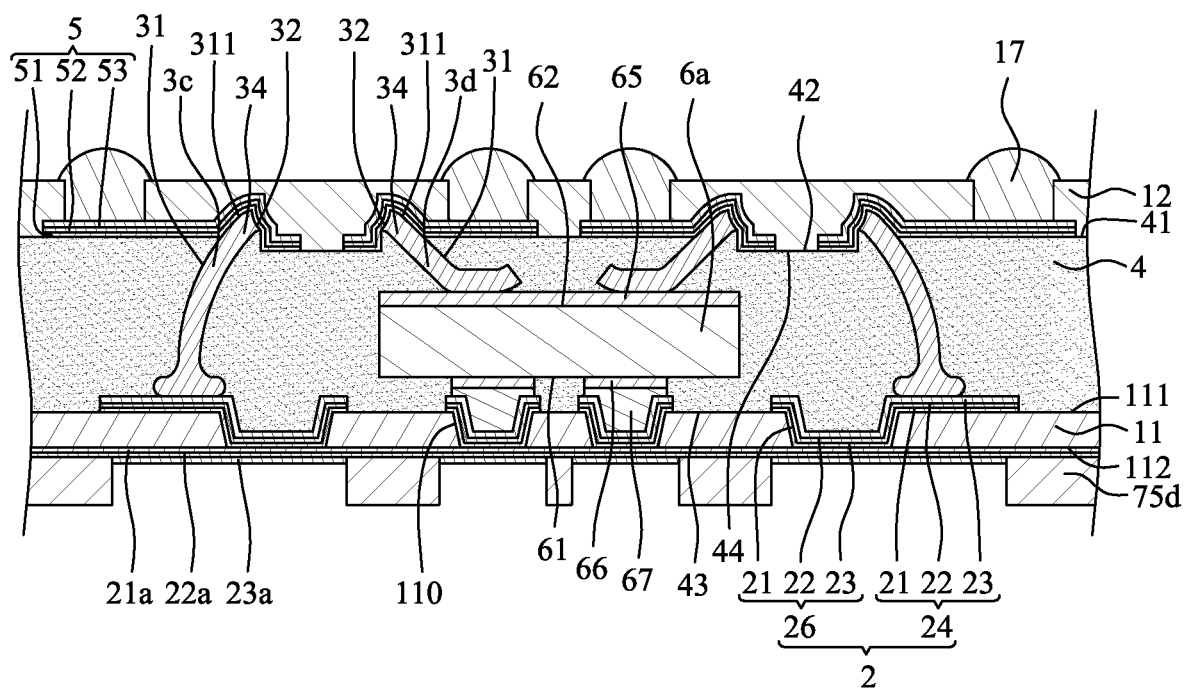
FIG. 78 illustrates one or more stages of an example of a method for manufacturing a package device (semiconductor device) according to some embodiments of the present disclosure.

Referring to FIG. 78, a fourth photoresist 75d is formed on the additional first metal layer 21a and the additional second metal layer 22a. The fourth photoresist layer 75d is patterned to expose portions of the additional second metal layer 22a. Then, an additional third metal layer 23a is formed in the fourth photoresist layer 75d and on the additional second metal layer 22a. The additional third metal layer 23a may include copper, tin, gold, silver, nickel, and/or palladium, or an alloy thereof, and may be formed by electroplating, electroless plating or printing.

Figure 79:
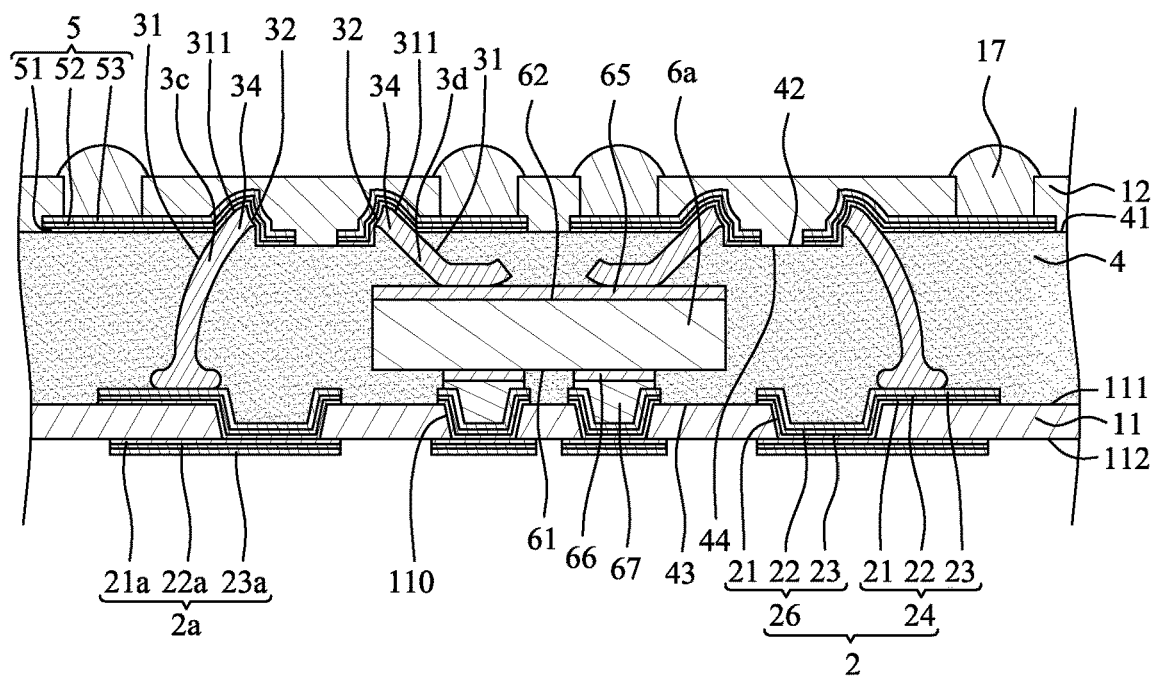
FIG. 79 illustrates one or more stages of an example of a method for manufacturing a package device (semiconductor device) according to some embodiments of the present disclosure.

Referring to FIG. 79, the fourth photoresist layer 75d is removed by, for example, stripping. Then, portions of the additional first metal layer 21a and the additional second metal layer 22a which are not covered by the additional third metal layer 23a are removed by, for example, etching. Hence, an additional circuit layer 2a is formed on the second surface 112 of the dielectric layer 11 and electrically connected to the circuit layer 2.

Figure 80:
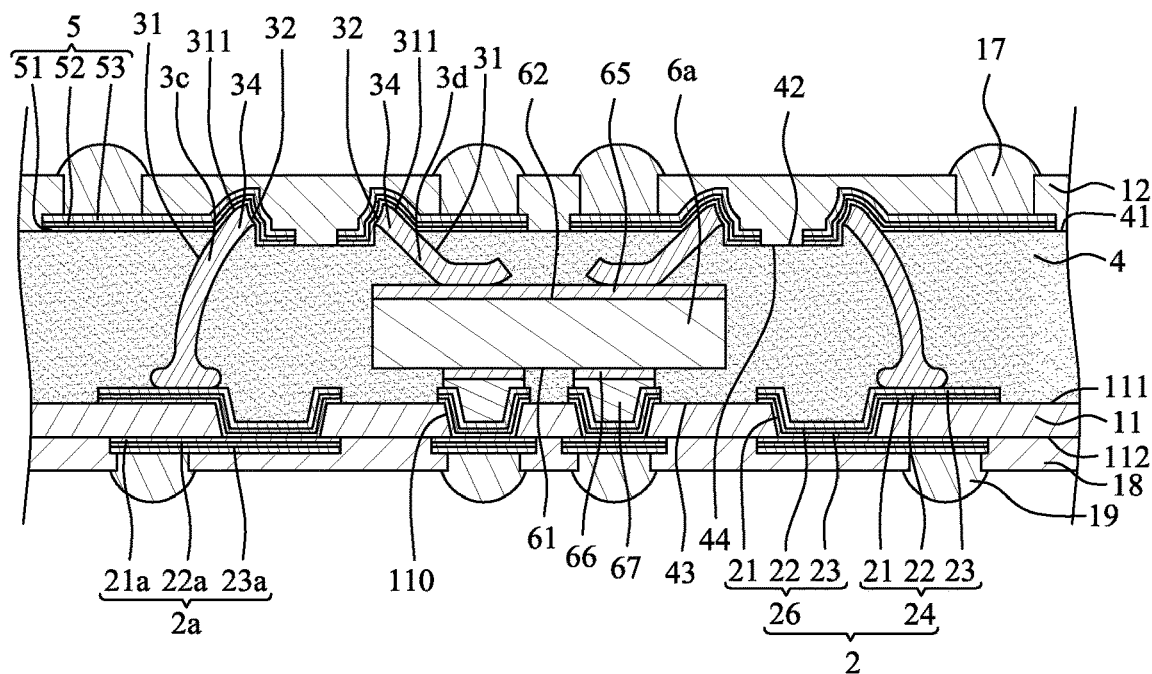
FIG. 80 illustrates one or more stages of an example of a method for manufacturing a package device (semiconductor device) according to some embodiments of the present disclosure.

Referring to FIG. 80, a protection layer 18 is formed on the dielectric layer 11 and covers the additional circuit layer 2a. At least a portion of the additional circuit layer 2a is exposed from the protection layer 18. At least one lower solder connector 19 is then disposed in the protective layer 18 and on the exposed portion of the additional circuit layer 2a. Then, a singulation process is conducted, thus forming the package device if as shown in FIG. 15.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package device, comprising:
 a circuit layer;
 at least one conductive segment disposed on the circuit layer and having a first surface and a second surface, wherein the conductive segment is a portion of a bonding wire;
 an encapsulant encapsulating at least a portion of the conductive segment and having a first upper surface, wherein a first portion of the first surface and at least a portion of the second surface of the conductive segment are disposed above the first upper surface of the encapsulant; and
 a redistribution layer disposed on the encapsulant, the first portion of the first surface of the conductive segment, and the second surface of the conductive segment.

2. The package device of claim 1, wherein the first surface and the second surface of the conductive segment intersect with each other.

3. The package device of claim 1, wherein an average roughness of the first surface of the conductive segment is different from an average roughness of the second surface of the conductive segment.

4. The package device of claim 3, wherein the average roughness of the first surface of the conductive segment is less than the average roughness of the second surface of the conductive segment.

5. The package device of claim 1, wherein the at least one conductive segment includes a first conductive segment and a second conductive segment separate from the first conductive segment, and both the first conductive segment and the second conductive segment connect the circuit layer and the redistribution layer.

6. The package device of claim 5, wherein the first conductive segment and the second conductive segment are formed from the bonding wire.

7. The package device of claim 1, wherein the encapsulant further has a second upper surface non-coplanar with the first upper surface, and the redistribution layer is disposed on the first upper surface and the second upper surface of the encapsulant.

8. The package device of claim 7, wherein the second upper surface of the encapsulant is disposed below the second surface of the conductive segment.

9. The package device of claim 7, further comprising a passivation layer disposed on the first upper surface of the encapsulant, the redistribution layer and the second upper surface of the encapsulant.

10. The package device of claim 1, further comprising an electronic component disposed on the circuit layer, wherein the at least one conductive segment includes a first conductive segment and a second conductive segment separate from the first conductive segment, the first conductive segment connects the circuit layer and the redistribution layer, and the second conductive segment connects the electronic component and the redistribution layer.

11. The package device of claim 10, wherein the electronic component comprises a conductive layer, and the second conductive segment connects to the conductive layer of the electronic component.

12. The package device of claim 1, wherein the conductive segment includes a ball bond or a tail bond of the bonding wire.

13. A semiconductor device, comprising:
a circuit layer;
a logic component disposed on the circuit layer;
an encapsulant encapsulating the logic component and having an upper surface;
a redistribution layer disposed on the encapsulant;
a first conductive segment connecting the circuit layer and the redistribution layer, wherein the first conductive segment is a portion of a bonding wire and has a first surface and a second surface, and a portion of the first surface and at least a portion of the second surface of the first conductive segment are disposed above the upper surface of the encapsulant; and
a second conductive segment connecting the logic component and the redistribution layer.

14. The semiconductor device of claim 13, wherein the logic component has a passive surface and comprises a conductive layer disposed on the passive surface, and the second conductive segment connects to the conductive layer of the logic component.

15. The semiconductor device of claim 13, wherein a portion of the first conductive segment and a portion of the second conductive segment are exposed from the encapsulant.

16. The semiconductor device of claim 15, wherein the redistribution layer covers the exposed portion of first conductive segment and the exposed portion of the second conductive segment.

17. The semiconductor device of claim 16, wherein the encapsulant defines a cavity located between the first conductive segment and second conductive segment, and the redistribution layer extends into the cavity of the encapsulant.

18. The semiconductor device of claim 17, further comprising a passivation layer disposed on the encapsulant and the redistribution layer, wherein the passivation layer extends into the cavity.

19. The semiconductor device of claim 13, wherein the first conductive segment and the second conductive segment are formed from the bonding wire.

20. The semiconductor device of claim 19, wherein the first conductive segment includes a ball bond of the bonding wire, and the second conductive segment includes a tail bond of the bonding wire.

* * * * *